US012795915B2

(12) United States Patent
Noguchi et al.

(10) Patent No.: US 12,795,915 B2
(45) Date of Patent: Nov. 10, 2026

(54) SEMICONDUCTOR DEVICE

(71) Applicant: Kioxia Corporation, Tokyo (JP)

(72) Inventors: Mitsuhiro Noguchi, Yokohama Kanagawa (JP); Masayuki Akou, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 317 days.

(21) Appl. No.: 18/744,886

(22) Filed: Jun. 17, 2024

(65) Prior Publication Data

US 2024/0431101 A1 Dec. 26, 2024

(30) Foreign Application Priority Data

Jun. 21, 2023 (JP) ................................ 2023-101412

(51) Int. Cl.
*H10B 41/41* (2023.01)
*G11C 16/08* (2006.01)
*H10B 43/40* (2023.01)

(52) U.S. Cl.
CPC ............. *H10B 41/41* (2023.02); *G11C 16/08* (2013.01); *H10B 43/40* (2023.02)

(58) Field of Classification Search
CPC ......... H10B 41/41; H10B 43/40; G11C 16/08
See application file for complete search history.

(56) References Cited

U.S. PATENT DOCUMENTS

| | | | | |
|---|---|---|---|---|
| 6,841,444 B2 * | 1/2005 | Shimizu | H10B 41/40 | 438/257 |
| 2002/0000617 A1 * | 1/2002 | Mori | H10D 84/0133 | 257/E21.507 |
| 2004/0188753 A1 * | 9/2004 | Kawashima | H10D 30/0411 | 257/E21.21 |
| 2005/0023600 A1 * | 2/2005 | Shin | H10B 41/30 | 257/315 |
| 2006/0003508 A1 * | 1/2006 | Sakai | H10B 43/30 | 257/E21.639 |
| 2006/0118855 A1 * | 6/2006 | Lee | H10B 41/40 | 257/E21.687 |
| 2007/0029676 A1 * | 2/2007 | Takaura | G11C 13/0069 | 257/E45.002 |
| 2007/0063257 A1 | 3/2007 | Hur et al. | | |
| 2008/0073705 A1 * | 3/2008 | Hisamoto | G11C 16/0425 | 257/326 |
| 2009/0161427 A1 | 6/2009 | Nakamura et al. | | |
| 2011/0095348 A1 * | 4/2011 | Chakihara | H10B 41/30 | 257/E29.345 |

(Continued)

*Primary Examiner* — Victor A Mandala
(74) *Attorney, Agent, or Firm* — Foley & Lardner LLP

(57) ABSTRACT

A switch element configured to apply a voltage to and block a voltage from a gate electrode of a memory cell is provided. The E-type transistor includes a gate insulating film with a thickness in a range of 13 nm to 50 nm, a first current terminal, and a second current terminal. The E-type transistor includes a first source diffusion layer and a first drain diffusion layer having a first n-type impurity density and formed in a vicinity of the gate electrode; and a second source diffusion layer and a second drain diffusion layer having a second n-type impurity density higher than the first n-type impurity density. The second current terminal of the E-type transistor is electrically connected to a voltage source configured to provide a voltage equal to or larger than 15 V.

13 Claims, 40 Drawing Sheets

(56) References Cited

U.S. PATENT DOCUMENTS

| | | | | |
|---|---|---|---|---|
| 2016/0035422 | A1 | 2/2016 | Chang et al. | |
| 2018/0182767 | A1* | 6/2018 | Kawashima | G11C 16/0483 |
| 2022/0068878 | A1* | 3/2022 | Ma | H10B 41/40 |
| 2023/0080436 | A1* | 3/2023 | Yu | H10B 41/27<br>257/314 |
| 2023/0247835 | A1* | 8/2023 | Sim | H10B 41/10<br>257/314 |
| 2024/0127864 | A1* | 4/2024 | Higashitani | G11C 16/0483 |

* cited by examiner

SEMICONDUCTOR DEVICE

CROSS-REFERENCE TO RELATED APPLICATION

This application is based upon and claims the benefit of priority from Japanese Patent Application No. 2023-101412, filed Jun. 21, 2023, the entire contents of which are incorporated herein by reference.

FIELD

Embodiments described herein relate generally to a semiconductor device.

BACKGROUND

For example, a positive voltage of 15 V or more is applied to a semiconductor channel or a gate electrode in which a memory cell is formed in writing to or erasing from a NAND-type non-volatile memory. A transfer switch circuit for transferring a high voltage between a voltage source and the memory cell is provided in order to apply a voltage required for writing, reading, and erasing with respect to the semiconductor channel and the gate electrode.

DETAILED DESCRIPTION

Embodiments provide a semiconductor device that has a transfer switch circuit capable of transferring a high voltage, and has high reliability while preventing an increase in area.

In general, according to one embodiment, a semiconductor device includes a memory cell transistor; a select transistor connected to the memory cell transistor in series; and a switch element configured to apply a voltage to and block a voltage from a gate electrode of the memory cell transistor so as to control a threshold value of the memory cell transistor. The switch element includes a first n-type MOSFET having a gate insulating film with a thickness in a range of 13 nm to 50 nm, a first current terminal, and a second current terminal. The first n-type MOSFET includes a first source diffusion layer and a first drain diffusion layer having a first n-type impurity density and formed in a vicinity of the gate electrode; and a second source diffusion layer and a second drain diffusion layer having a second n-type impurity density higher than the first n-type impurity density. The second current terminal of the first n-type MOSFET is electrically connected to a voltage source configured to provide a voltage equal to or larger than 15 V. A first wiring layer is formed on an upper side of a semiconductor substrate in which the first n-type MOSFET is formed. A second wiring layer is formed above the first wiring layer. A first wiring connected to the gate electrode of the first n-type MOSFET is formed in the first wiring layer, and the first wiring is formed on an upper portion of the gate electrode in an active region range of the first n-type MOSFET and continuously extends on the first source diffusion layer or the first drain diffusion layer with a length equal to or longer than 0.1 μm.

Hereinafter, embodiments will be described with reference to the accompanying drawings.

First Embodiment

Figure 1:
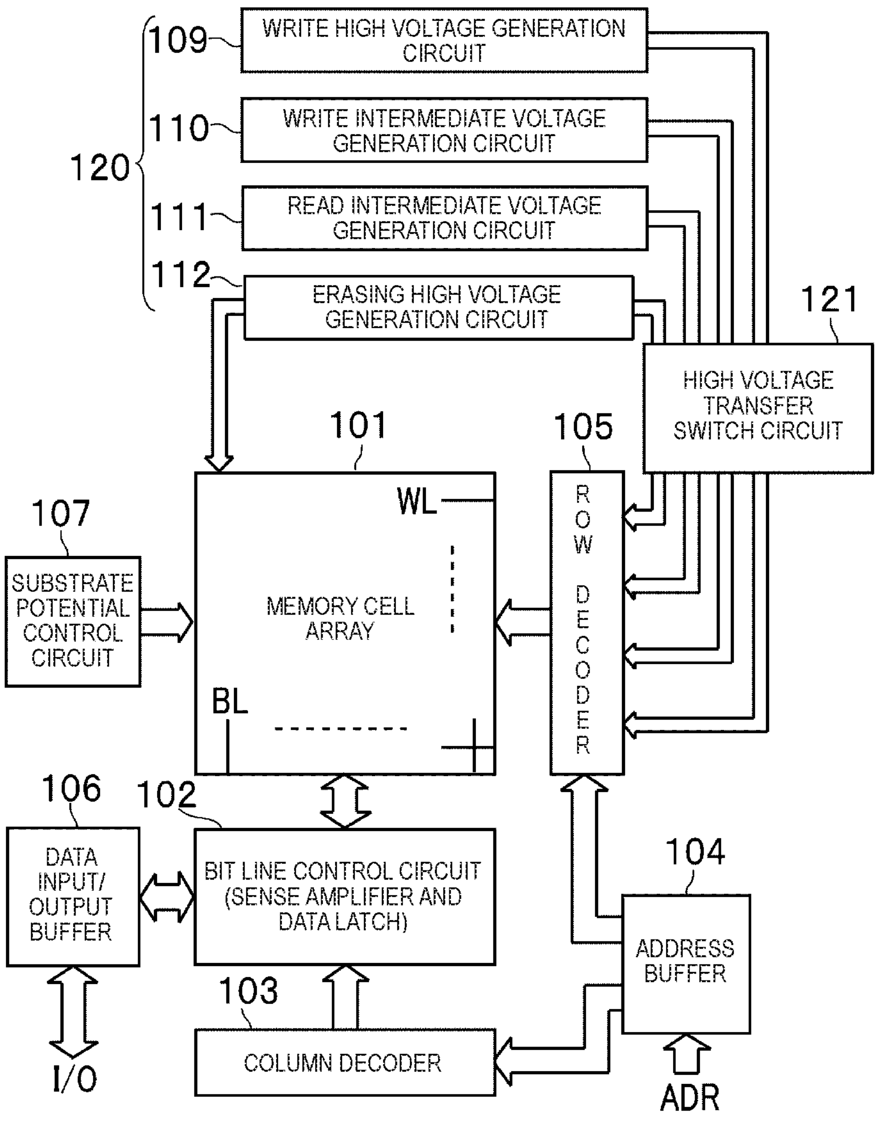
FIG. 1 is a block diagram schematically showing an example of a configuration of a NAND-type non-volatile memory to which a first embodiment is applied.

FIG. 1 is a block diagram schematically showing an example of a configuration of a NAND-type non-volatile memory to which a first embodiment is applied. As shown in FIG. 1, the NAND-type non-volatile memory of the embodiment includes a memory cell array 101 and a peripheral circuit unit. The peripheral circuit unit is a unit that drives a circuit in accordance with a signal from the outside and performs an operation of writing or erasing a program. The peripheral circuit unit includes a bit line control circuit (sense amplifier and also data latch) 102, a column decoder 103, an address buffer 104, a row decoder 105, a data input/output buffer 106, and a substrate voltage control circuit 107. The peripheral circuit unit also includes a voltage source circuit group 120 and a high voltage transfer switch circuit 121. The voltage source circuit group 120 also includes a write high voltage generation circuit 109, a write intermediate voltage generation circuit 110, a read intermediate voltage generation circuit 111, and an erasing high voltage generation circuit 112.

The memory cell array 101 includes a plurality of memory cells of an electrically erasable programmable read-only memory (EEPROM). A memory cell of an EEPROM usually has a metal-oxide-semiconductor field effect transistor (MOSFET) structure in which a charge storage layer and a control gate are stacked on a semiconductor channel. In the memory cell, data is stored in a non-volatile manner based on a difference in a threshold value between a state in which charges are injected into a charge storage layer and a state in which the charges are released. The charge is injected and discharged by a tunnel current through a tunnel insulating film between the charge storage layer and a substrate channel.

In the EEPROM, a so-called NAND-type EEPROM in which a plurality of memory cells are connected in series to configure a NAND cell unit can be made higher in density than a NOR-type EEPROM because the number of select transistors can be reduced as compared with the NOR-type EEPROM. In addition, in the NOR-type flash memory, in order to reduce the influence of the short channel effect at the time of erasing, erasing is performed by passing a tunnel current through a tunnel insulating film between the charge storage layer and the substrate channel. The erasing is, for example, performed at the same time in the plurality of memory cells in order to increase the number of memory cells erased in a unit time. Therefore, a positive voltage of 15 V or more is applied to the gate electrode of semiconductor channel in which the memory cell is formed to extract electrons from the charge storage layer to the substrate, or holes are injected to recombine with the electrons. On the other hand, at the time of writing, the semiconductor channel voltage is maintained at 0 V, and the memory cell write is performed by injecting electrons from the channel into the charge storage layer by applying a voltage of 15 V or more to the word line connected to the gate electrode of the selected memory cell. In this way, in the NAND-type EEPROM, a voltage of 15 V or more is applied to the semiconductor channel and the gate electrode.

Figure 2:
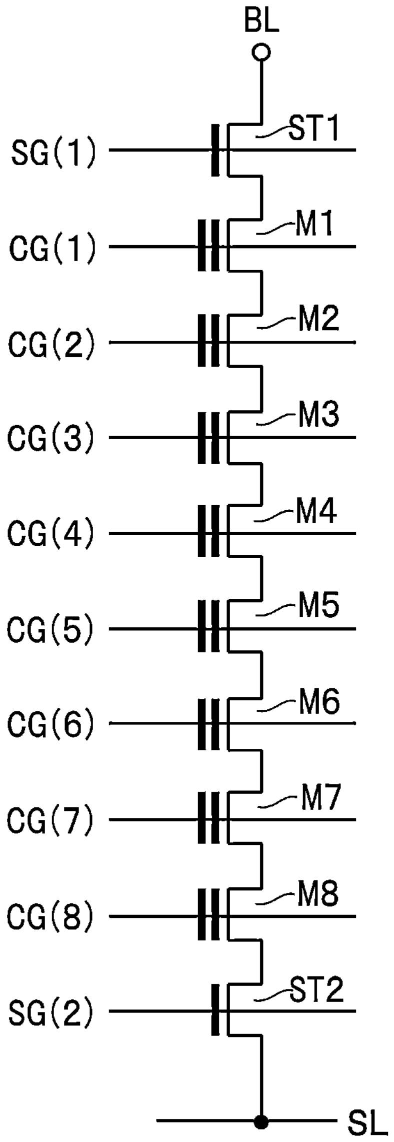
FIG. 2 is an equivalent circuit diagram of one NAND cell in a memory cell array.

FIG. 2 is an equivalent circuit diagram of one NAND cell in a memory cell array 101. The memory cell of the NAND-type non-volatile memory has a MOSFET structure in which the charge storage layer and the control gate electrode are stacked on the semiconductor channel via an insulating film. One NAND cell is configured by connecting source/drain electrodes (current terminals) of a plurality of adjacent memory cells M1 to M8 in series. Further, the select gate transistor ST1 that performs switching of selection and non-selection of the memory cell block is formed between the end memory cell M1 and the bit line BL, which is a data transfer line. On the other hand, the select gate transistor ST2 that performs switching of the selection and non-selection of the memory cell block is formed between the memory cell M8, which is the end on the reverse side, and the source line SL. In FIG. 2, the number of memory cells that constitutes one NAND cell is set to 8, but of course, the number may be 8 or more, and may be constituted by more memory cells, for example, 96, 112, 128, 256, and the like. In addition, one NAND cell may be configured with 7 or lower memory cells.

Figure 3:
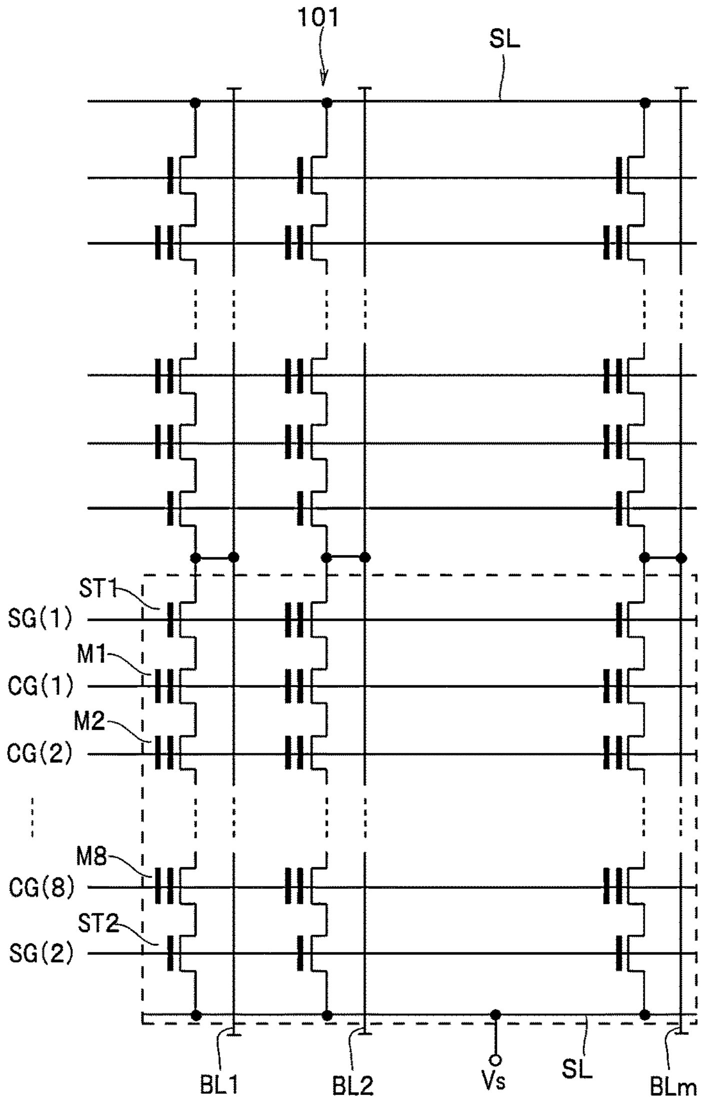
FIG. 3 is a diagram showing an equivalent circuit of the memory cell array in which NAND cells are matrix-arranged.

FIG. 3 is a diagram showing an equivalent circuit of the memory cell array 101 in which NAND cells are matrix-arranged. FIG. 3 shows an example of a configuration of a memory cell array 101 in which the NAND cell array set structure shown in FIG. 2 is highly integrated. The control gate electrodes of a plurality of memory cells M1 adjacent to each other are connected in parallel. The parallel-connected control gate electrodes are shared by the plurality of memory cells M1 connected in parallel as the select gate line CG (1). The same applies to the memory cells M2 to M8. That is, the control gate electrodes of the memory cells M2, M3, . . . , and M8 adjacent to each other are connected in parallel. The parallel-connected control gate electrodes are shared by the plurality of memory cells M2, M3, . . . , and M8 connected in parallel as the select gate lines CG(2), CG(3), . . . , and CG(8). The select gate lines CG (1) to CG(8) that form the control gate lines of the memory cells M1 to M8 are also referred to as word lines WL.

In addition, the control gate electrodes of the plurality of select gate transistors ST1 adjacent to each other are also connected in parallel. The parallel-connected control gate electrodes are shared by the plurality of parallel-connected select gate transistors ST1 as the select gate line SG(1). The same applies to the select gate transistor ST2.

Furthermore, the bit lines BL, which are data transfer lines, are formed in a direction orthogonal to each of the select gate lines CG(1), CG(2), . . . , CG(8), SG(1), and SG(2). The bit line BL is connected to one end of the source/drain electrode of the select gate transistor ST1 arranged in a direction orthogonal to the bit line BL. On the other hand, the source line SL is formed in a direction parallel to the select gate lines CG(1), CG(2), . . . , and CG(8), SG(1) and SG(2). The source line SL is connected to one end of the source/drain electrode of the select gate transistor ST2. As a result, a plurality of memory cells are disposed at high density in a matrix shape, and a circuit corresponding to the memory cell array 101 is formed. In FIG. 3, a set of a plurality of NAND cells surrounded by a dashed line rectangle is referred to as a block.

Referring back to FIG. 1, the peripheral circuit unit in the NAND-type non-volatile memory of the embodiment will be described. The bit line control circuit 102 is a circuit for writing data to or reading data from the memory cell array 101. The bit line control circuit 102 is mainly configured of a CMOS flip-flop, and performs a data latch for writing, a sense operation for reading by detecting the voltage of the bit line BL, and the like. The bit line control circuit 102 is connected to the data input/output buffer 106. The bit line control circuit 102 communicates write data and read data with an external device via the data input/output buffer 106.

The address buffer 104 receives an address ADR, which is a target of writing and reading data, from an external device. The address buffer 104 outputs the row address to the row decoder 105 and the column address to the column decoder 103, respectively, based on the received address ADR. The column decoder 103 decodes a column address input from the address buffer 104 and outputs the column address to the bit line control circuit 102. The bit line control circuit 102 selects any one of the bit lines based on the decoded column address. At the time of reading data, the data read from the memory cell to the bit line is detected and amplified. In addition, at the time of writing data, the write data is transferred to the bit line.

The row decoder 105 decodes a row address input from the address buffer 104, and selects a block which is a data read and write target based on the decoded row address. The row decoder 105 transfers a plurality of voltages required for a write operation, a read operation, and an erasing operation to the select gate lines CG(1), CG(2), . . . , CG(8), SG(1) and SG(2) of the selected block. In the NAND-type non-volatile memory, a voltage higher than a power supply voltage (for example, 5 V or less) needs to be transferred to the control gate electrode of the memory cell in the selected block. Therefore, the row decoder 105 includes a voltage conversion circuit (so-called, level shifter) that converts a power supply voltage supplied from the outside into a high voltage.

The substrate voltage control circuit 107 controls the voltage of a silicon substrate (or a well region in which the memory cells are formed) on which the memory cell array 101 is formed. The voltage source circuit group 120 generates a voltage required for the memory cell or the like at the time of writing or reading. The voltage source circuit group 120 includes various types of voltage generation circuits according to a level and an application of a generated voltage. For example, as shown in FIG. 1, the voltage source circuit group 120 includes four voltage generation circuits, that is, a write high voltage generation circuit 109, a write intermediate voltage generation circuit 110, a read intermediate voltage generation circuit 111, and an erasing high voltage generation circuit 112. In the memory cell array 101, in order to selectively apply the voltage required for writing, reading, and erasing to the control gate electrode of the memory cell in the selected block, a high voltage transfer switch circuit 121 is formed between the row decoder 105 and the voltage source circuit group 120.

Figure 4:
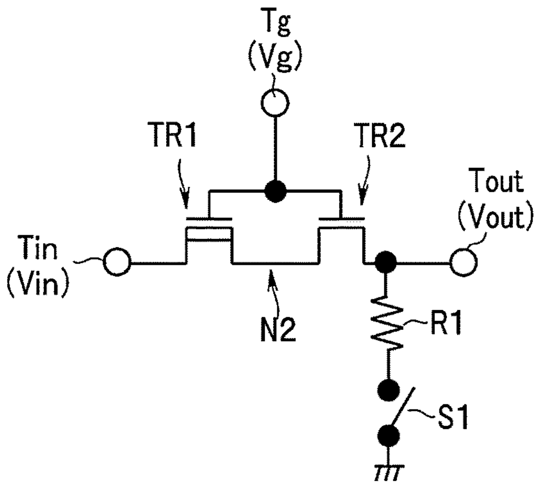
FIG. 4 is a circuit diagram showing an example of a high voltage switch.

FIG. 4 is a circuit diagram showing an example of a high voltage switch that transfers a voltage generated by the write high voltage generation circuit 109 to the row decoder 105 in the high voltage transfer switch circuit 121. The high voltage switch shown in FIG. 4 is formed of a high breakdown voltage transistor and is a switch that controls the conduction and the block of a high voltage. The high voltage switch is mainly used for the high voltage transfer switch circuit 121, but may be used for other peripheral circuits. A high voltage switch shown in FIG. 4 is provided in the high voltage transfer switch circuit 121 in correspondence to each of the plurality of paths for transferring a voltage from the voltage source circuit group 120 to the row decoder 105. For example, the voltage generated from the write intermediate voltage generation circuit 110, the read intermediate voltage generation circuit 111, and the erasing high voltage generation circuit 112 is transferred by a separate high voltage transfer switch circuit. The high voltage transfer switch circuit 121 shown in FIG. 4 may be used in these high voltage transfer switch circuits.

As shown in FIG. 4, the high voltage switch of the embodiment includes a high breakdown voltage depletion type MOS transistor (hereinafter, referred to as a D-type transistor) TR1 and a high breakdown voltage enhancement type MOS transistor (hereinafter, referred to as an E-type transistor) TR2, which are inserted in series between an input terminal Tin and an output terminal Tout. That is, the D-type transistor TR1 and the E-type transistor TR2 are connected to each other through the node N2. In addition, the gate electrode of the D-type transistor TR1 and the gate electrode of the E-type transistor TR2 are commonly connected to the terminal Tg. The E-type transistor TR2 (first n-type MOSFET) is a so-called switch element, and the D-type transistor TR1 functions as a resistance element for the switch element.

A discharge circuit is provided between the E-type transistor TR2 and the output terminal Tout. In FIG. 4, the output side of the E-type transistor TR2 is grounded via a resistor R1 and a switch S1. The high voltage switch is usually used in a state in which the switch S1 is opened (non-conductive state), and when the voltage (hereinafter, referred to as an output voltage) Vout of the output terminal Tout is discharged, the switch S1 is closed. As described above, the high voltage switch shown in FIG. 4 is a switch circuit for outputting or blocking a voltage (hereinafter, referred to as an input voltage) Vin applied to the input terminal Tin to or from the output terminal Tout. The switch operation is controlled for a voltage (hereinafter, referred to as a gate voltage) Vg applied to the gate electrode of the D-type transistor TR1 and the gate electrode of the E-type transistor TR2 from the terminal Tg and for a discharging by the switch S1. The discharge method is not limited to the above-described circuit or the above-described method. For example, the high voltage transfer switch circuit 121 may be connected to a power supply having a voltage lower than the input voltage Vin via another high voltage switch formed in the high voltage transfer switch circuit 121.

Figure 5:
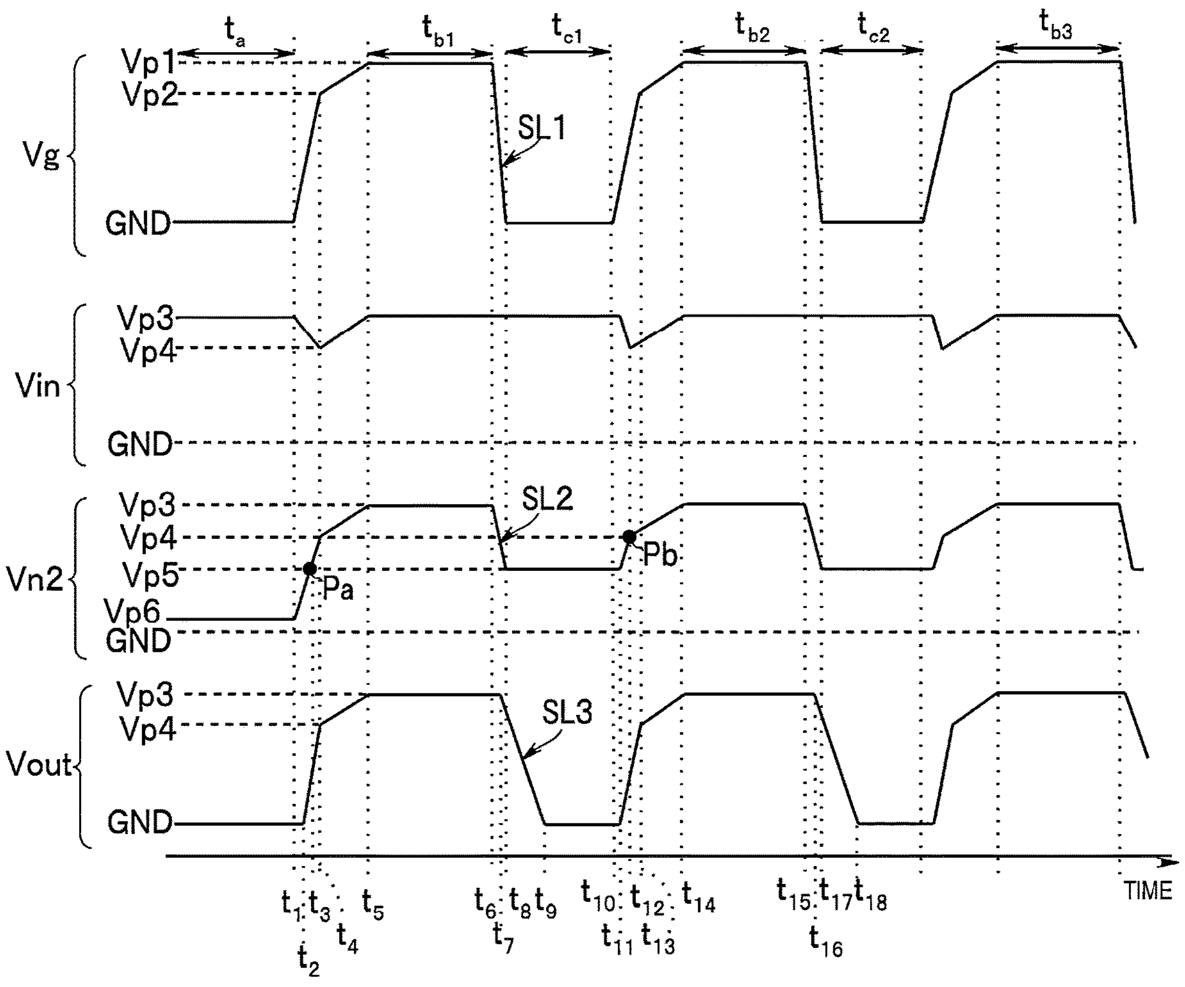
FIG. 5 is a diagram schematically showing an example of a voltage waveform when a switch operates in a comparative example.

Prior to the description of the high voltage switch of the embodiment, the operation and structure of the high voltage switch of the comparative example will be described. FIG. 5 is a diagram schematically showing an example of a voltage waveform when a switch operates in a comparative example. FIG. 5 shows waveforms of the gate voltage Vg, the input voltage Vin, a voltage of the node N2 (hereinafter, referred to as a node N2 voltage Vn2), and the output voltage Vout in order on a paper surface. In addition, each of the waveforms has a vertical axis of voltage and a horizontal axis of time. FIG. 5 shows a voltage waveform in a sequence in which a voltage Vp3 applied to the input terminal Tin is transferred to the output terminal Tout three times and is discharged twice between each transfer. For example, after the write voltage of the voltage Vp3 is applied to the gate electrode of the memory cell, a so-called verify operation is performed to check whether the threshold value of the memory cell is sufficiently written. In FIG. 5, the periods $t_{c1}$ and $t_{c2}$ become a time range of the verify operation, and the periods $t_{b1}$, $t_{b2}$, and $t_{b3}$ become a time range of the write operation to the memory cell. After the write operation, the output terminal Tout needs to be discharged in order to input a voltage lower than the voltage Vp3 (for example, a voltage of 10 V or less required for reading) to the row decoder 105, and in FIG. 5, the output terminal Tout is discharged twice at the timings of the periods $t_{c1}$ and $t_{c2}$.

In the sequence of FIG. 5, the voltage Vp3 is set to a voltage of 15 V or more and 30 V or less. For example, the voltage Vp1 applied to the terminal Tg is a voltage of 17 V or more and 35 V or less. In addition, in the above sequence, the output voltage Vout and the gate voltage Vg are each set to the GND voltage as the initial reset voltage, so that the difference between the comparative example and the embodiment is clear. In addition, in the three periods $t_{b1}$, $t_{b2}$, and $t_{b3}$, the voltage Vp3 applied as the input voltage Vin is transferred to the output voltage Vout, so that the change in the voltage waveform by transferring the repeated voltage is easily understood. As the above sequence, repeating the voltage transfer is performed as a well-known method, for example, to perform a verification of whether the memory cell is sufficiently written and to achieve a narrower threshold value distribution of the memory cell.

In particular, since the node N2 does not have a terminal to which a voltage is applied from the outside, the current from the other terminal or the voltage is determined by the capacitive coupling, but the voltage in the initial state in the period $t_a$ and the voltage in the periods $t_{c1}$ and $t_{c2}$ are different from each other due to the charges accumulated before the determination. The details of the operation will be described below.

First, a GND voltage of 0 V is applied as the gate voltage Vg during an initial state period (period $t_a$). During this period, the output voltage Vout is also the GND voltage. Further, a voltage of 15 V or more and 30 V or less, which is a voltage Vp3, is applied to the input voltage Vin. In addition, the threshold value voltage Vth1 of the D-type transistor TR1 is, for example, a value equal to or lower than 0 V and equal to or higher than −4 V, and is a depletion type MOSFET. On the other hand, the threshold value voltage Vth2 of the E-type transistor TR2 is, for example, a value higher than 0 V and equal to or less than 3 V, and is an enhancement type MOSFET. Therefore, from the relationship between the gate voltage Vg, the input voltage Vin, the node N2 voltage Vn2, and the output voltage Vout, the D-type transistor TR1 and the E-type transistor TR2 are in a blocked state in the initial state period. The node N2 is at a voltage of −Vth1 (=voltage Vp6) in the initial state. The voltage Vp6 is sufficiently lower than the voltage Vp3, lowers the drain voltage of the E-type transistor TR2, and prevents the reliability of the E-type transistor TR2 from deteriorating due to the application of the drain voltage.

Then, the gate voltage Vg is raised from a timing of time $t_1$ to bring the D-type transistor TR1 into a conductive state. Although FIG. 5 shows a case where the ramp voltage is applied from time $t_1$ to time $t_4$, as the gate voltage Vg rises, the node N2 voltage Vn2 rises to a voltage of Vg-Vth1. Then, when the gate voltage Vg is higher than the threshold value voltage Vth2 at a timing of time $t_2$, the E-type transistor TR2 enters a conductive state, and the output voltage Vout rises above the GND voltage. During a period from time $t_2$ to time $t_4$, a current flows between the drain electrode and the source electrode of the E-type transistor TR2, and the output voltage Vout is charged. At this time, since the supply capacity of each voltage generation circuit of the voltage source circuit group 120 is finite, the voltage (input voltage Vin) on the input terminal Tin side decreases from the voltage Vp3 to the voltage Vp4 in order to charge the wiring capacitance on the output terminal Tout side. Here, the voltage Vp4 is a voltage lower than the voltage Vp3, for example, in a range of 0.2 V to 3 V.

At this time, since the gate voltage is raised in a state in which the drain voltage is applied, hot carriers are generated in the E-type transistor TR2, and the threshold value voltage Vth2 is varied in the rising direction. Then, in a period from time $t_4$ to time $t_5$, the D-type transistor TR1 and the E-type transistor TR2 are in a conductive state in a voltage range from the voltage Vp4 to the voltage Vp3, so that the input voltage Vin is transferred to the output voltage Vout. At this time, the voltage difference between the input voltage Vin and the node N2 voltage Vn2, and the voltage difference between the node N2 voltage Vn2 and the output voltage Vout are smaller than those from time $t_1$ to time $t_4$, and the generation of hot carriers is less than that from time $t_1$ to time $t_4$. From the time $t_4$ to the time $t_5$, the output voltage Vout rises from the voltage Vp4 to the voltage Vp3. However, by making the inclination (rising degree) of the transfer voltage smaller than the inclination of the transfer voltage from the time $t_1$ to the time $t_4$, it is possible to prevent the waveform from overshooting. In order to ensure the write voltage and the pulse width (periods $t_{b1}$, $t_{b2}$, and $t_{b3}$) with high accuracy and to reduce the threshold value width of the memory cell, such an operation is performed.

Next, a timing for blocking the D-type transistor TR1 and the E-type transistor TR2 is indicated. At a timing from time $t_6$ to time $t_8$, the gate voltage Vg decreases from the voltage Vp1 to the GND voltage. A degree of decrease in voltage with respect to time at this moment is set as a slope SL1. At this time, the node N2 voltage Vn2 also decreases from time $t_6$ to time $t_8$ due to the capacitive coupling between the gate electrode connected to the terminal Tg and the node N2. A degree of decrease in the voltage with respect to time at this moment is set as a slope SL2. Although the details will be described later, the node N2 has a capacitance between the gate electrode and the substrate electrode (semiconductor substrate 14) on which the D-type transistor TR1 and the E-type transistor TR2 are formed. Therefore, the slope SL2 has a voltage inclination gentler than the slope SL1. Therefore, at a timing from time $t_6$ to time $t_7$, it is changed that the gate voltage Vg<the node N2 voltage Vn2−the threshold value voltage Vth1 in the D-type transistor TR1, and the D-type transistor TR1 is changed to the blocked state from the conductive state. At this time, since the output voltage Vout is maintained at the voltage Vp3, the gate voltage Vg<the node N2 voltage Vn2+the threshold value voltage Vth2 is satisfied, and it is changed that the gate voltage Vg<the output voltage Vout, the E-type transistor TR2 is also changed to blocked state.

Subsequently, at a timing from time $t_7$ to time $t_8$ after the D-type transistor TR1 and the E-type transistor TR2 are in the blocked state, the gate voltage Vg decreases. Therefore, the node N2 voltage Vn2 decreases to the voltage Vp5 due to the capacitive coupling between the gate electrode connected to the terminal Tg and the node N2. Here, in a period from time $t_7$ and time $t_9$, the switch S1 is in a conductive state, and the output voltage Vout is discharged to GND. When the inclination of the voltage drop of the discharge is set to the slope SL3, the slope SL3 is set to have a voltage inclination gentler than the slope SL2 at least in a range from time $t_7$ to time $t_8$. Therefore, in a period from time $t_7$ to time $t_9$, both the D-type transistor TR1 and the E-type transistor TR2 are maintained in the blocked state, so that the charge accumulated in the node N2 is maintained, and the node N2 voltage Vn2 is maintained when the voltage is dropped to the voltage Vp5. The voltage Vp5 is higher than the voltage Vp6 by 1 V or more, and is, for example, a voltage lower than the voltage Vp3 by 5 V or more. During the period $t_{c1}$, the verify operation is performed by changing the switch S1 from the conductive state to the blocked state. In the verify operation, the other high voltage transfer circuits transfer the voltage generated by the read intermediate voltage generation circuit 111 to the row decoder 105. Therefore, Vout of the high voltage switch that transfers the voltage generated by the write high voltage generation circuit 109 to the row decoder 105 is GND in the period $t_{c1}$.

Here, when the initial state period (period $t_a$) is compared with a period $t_{c1}$ after the switch S1 is in a conductive state, the node N2 voltage Vn2 is greatly raised at a voltage Vp5 at the time of the repeated pulse application compared with the voltage Vp6 in the initial state. That is, in the period $t_{c1}$, a drain voltage stress higher than the initial state is applied to the drain of the E-type transistor TR2. Therefore, since the electrons are trapped in the silicon nitride film 401 on the n-type diffusion layer 8 connected to the drain electrode of the E-type transistor TR2, the problems such as increasing of the resistance, increasing of the threshold value, and decreasing of the current driving capability occur. (The structure of the E-type transistor TR2 will be described in detail later.)

Further, as a sequence for transferring the second voltage Vp3, the gate voltage Vg is raised from the timing of time $t_{10}$, whereby the D-type transistor TR1 is brought into a conductive state. The timings at time $t_{10}$ to time $t_{18}$ are the same time intervals as the timings at time $t_1$ to time to, respectively, and the gate voltage Vg and the output voltage Vout have the same waveform.

In a period from time $t_{10}$ to time $t_{11}$, unlike the initial state (in a period from time $t_1$ to time $t_2$), even when the gate voltage Vg rises, since the D-type transistor TR1 is also in a blocked state in a range where the node N2 voltage Vn2 is sufficiently high with respect to the gate voltage Vg, the value of the voltage Vp5 is maintained. Then, at a timing of time $t_{11}$, when the gate voltage Vg−threshold value voltage Vth1 is higher than the voltage Vp5, the D-type transistor TR1 is in a conductive state, and the node N2 voltage Vn2 rises higher than the voltage Vp5. When the gate voltage Vg is higher than the threshold value voltage Vth2 at a timing after time $t_{11}$, the E-type transistor TR2 enters a conductive state, and the output voltage Vout rises above the GND voltage. During a period from time $t_{11}$ to time $t_{13}$ a current flows between the drain electrode and the source electrode of the E-type transistor TR2, and the output voltage Vout is charged. At this time, since the supply capacity of each voltage generation circuit of the voltage source circuit group 120 is finite, the voltage (input voltage Vin) on the input terminal Tin side decreases from the voltage Vp3 to the voltage Vp4 in order to charge the wiring capacitance on the output terminal Tout side. Here, the voltage Vp4 is a voltage lower than the voltage Vp3, for example, in a range of 0.2 V to 3 V.

At this time, since the gate voltage is raised in a state where the drain voltage is applied, hot carriers are generated in the E-type transistor TR2, and the threshold value voltage Vth2 of the E-type transistor TR2 is varied in the rising direction. When the node N2 voltage Vn2 at the first pulse timing (=time $t_3$) and the node N2 voltage Vn2 at the second pulse timing (=time $t_{12}$) at which the gate voltage Vg is equal are compared, the voltage at the second pulse timing is higher than the voltage at the first pulse timing (refer to points Pa and Pb indicated by black circles in FIG. 5). At this time, since the gate voltage Vg and the output voltage Vout are the same, the hot carrier is more generated and the amount of deterioration is larger from the time $t_{10}$ to the time $t_{13}$ which is the second pulse timing than from the time $t_1$ to the time $t_4$ which is the first pulse timing.

The operation in the period from time $t_{12}$ to time $t_{18}$ is the same as the operation in the period from the time $t_3$ to the time $t_9$, and thus the description thereof is omitted. However, there is a problem in that reliability deteriorates due to a hot carrier from the second to third pulse timings, compared with the first pulse timing of the rise in the initial state by repeating the transfer operation and the block operation of the voltage Vp3.

In order to improve the deterioration of the reliability due to such a hot carrier, for example, measures such as increasing the gate length of the E-type transistor TR2 are conceivable. However, since the current driving capability per unit channel width is reduced as the gate length is increased, it is necessary to increase the channel width in order to ensure the current driving capability of the entire circuit, and there is a problem that the circuit area is increased.

Figure 6:
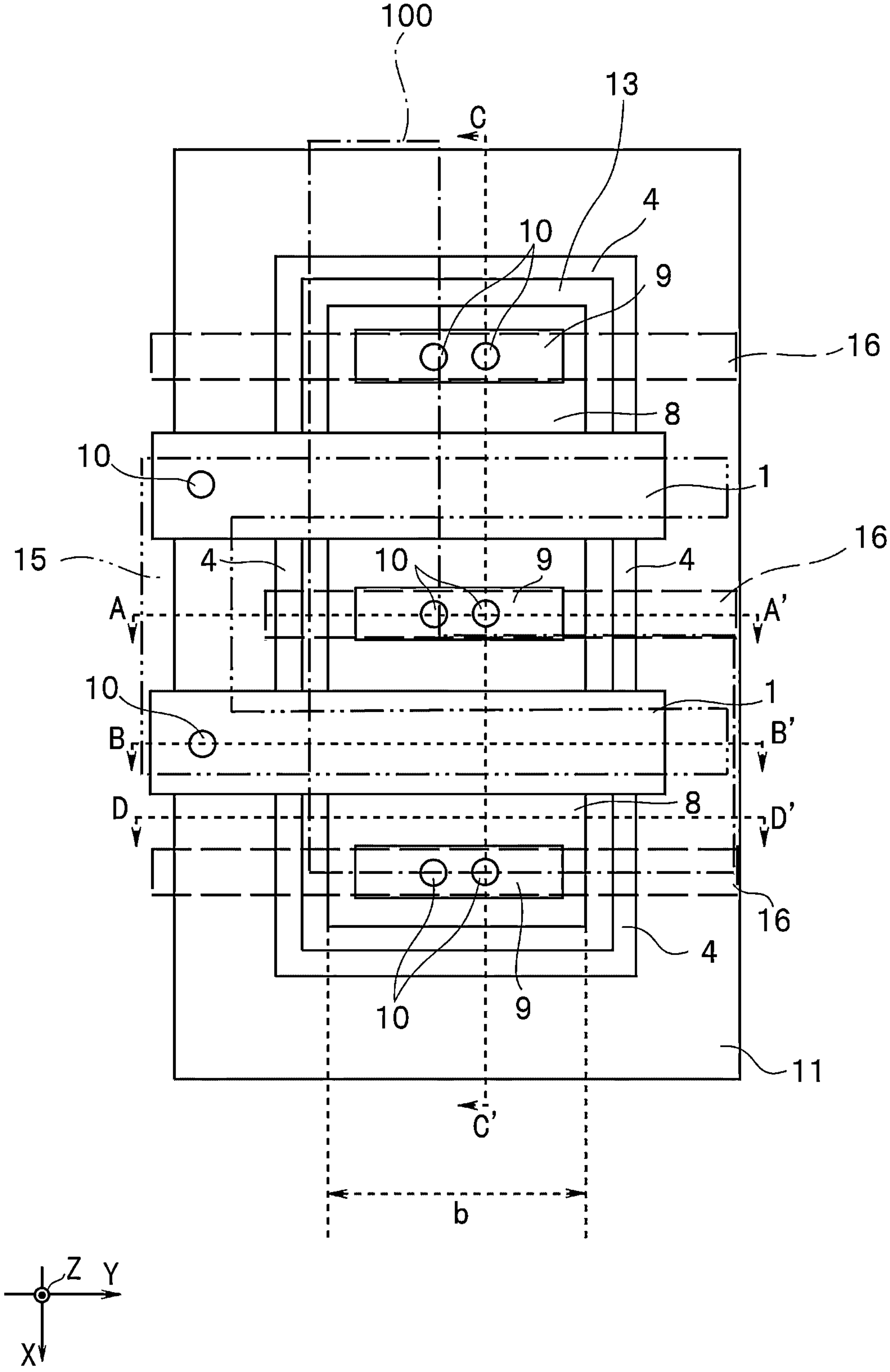
FIG. 6 is a plan view showing an example of a structure of the E-type transistor TR2 in the comparative example.
Figure 8:
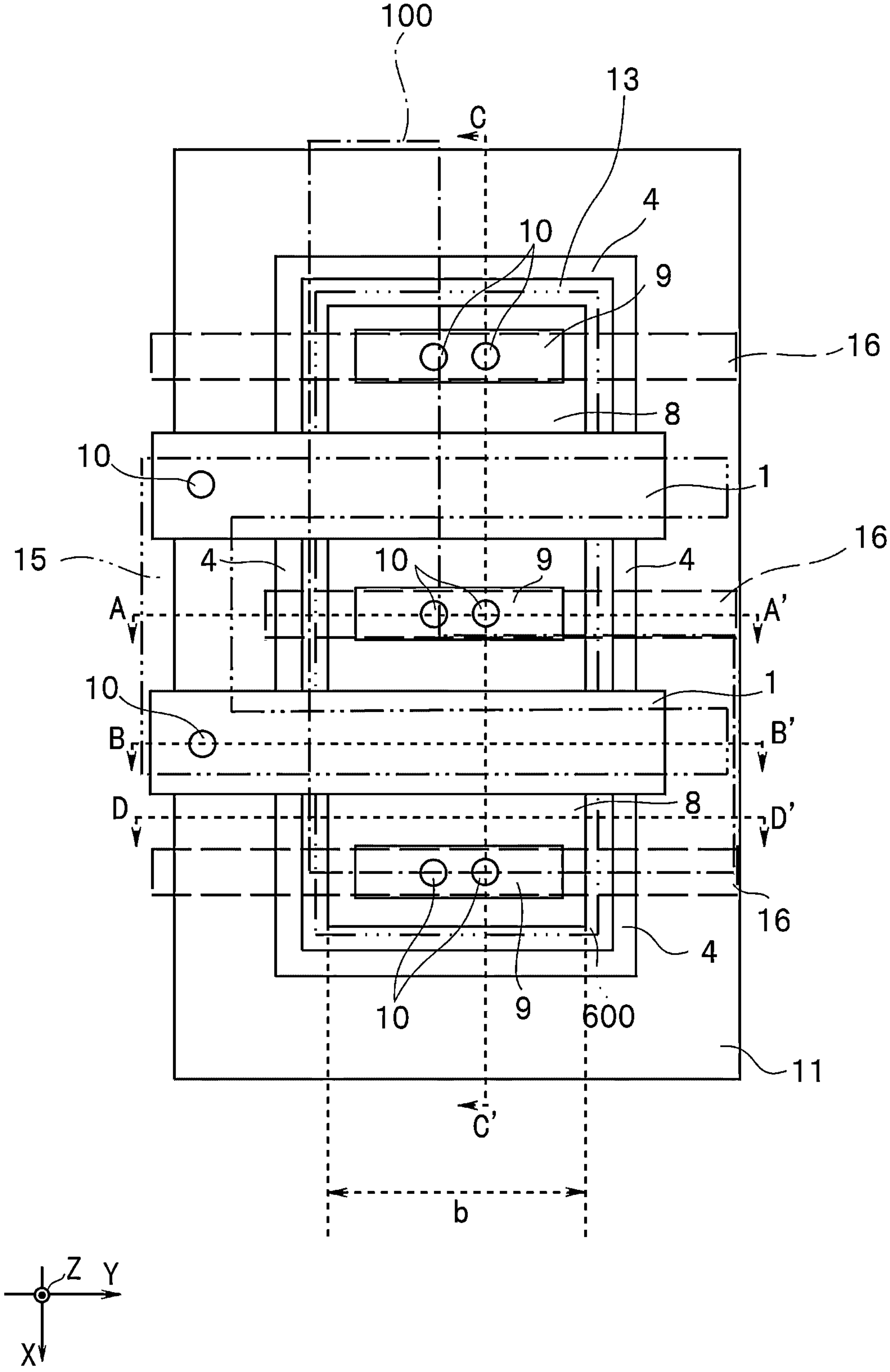
FIG. 8 is a plan view showing an example of a structure of the D-type transistor TR1 in the comparative example.

Next, a structure of the D-type transistor TR1 and the E-type transistor TR2 in the high voltage switch of the comparative example will be described. FIG. 6 is a plan view showing an example of a structure of the E-type transistor TR2 in a comparative example. FIG. 8 is a plan view describing an example of a structure of the D-type transistor TR1 in the comparative example. In the plan view and the cross-sectional view shown below, a direction parallel to a surface of the semiconductor substrate 14 and the direction in which the control gate 1 extends is referred to as an X direction. In addition, a direction parallel to the surface of the semiconductor substrate 14 and orthogonal to the X direction is referred to as a Y direction. Further, a direction orthogonal to the surface of the semiconductor substrate 14 is referred to as a Z direction.

FIGS. 6 and 8 show the planar structure on the lower side of the contact plug 10 and the first wiring layer and the second wiring layer in order to facilitate understanding, and the other wiring layers are omitted. A wiring 15 indicated by a double-dotted line and a wiring 16 indicated by a broken line are disposed in the first wiring layer. A wiring 100 indicated by a one-dotted line is disposed in the second wiring layer. The first wiring layer is formed between the second wiring layer and the semiconductor substrate 14. In the comparative examples shown in FIGS. 6 and 8, the wiring 100 is formed such that at least a part of the wiring 100 overlaps an upper side of the diffusion layer 8 of the transistor to be described below. There is a region in which the wirings 15 and 16 are not formed between the diffusion layer 8 and the wiring 100. In addition, as shown in FIGS. 6 and 8, in the comparative example, the wiring 15 is formed only on the control gate 1 within the range of the active region width b of the transistor defined by the length of the diffusion layer 8 in the Y direction.

Figure 7A:
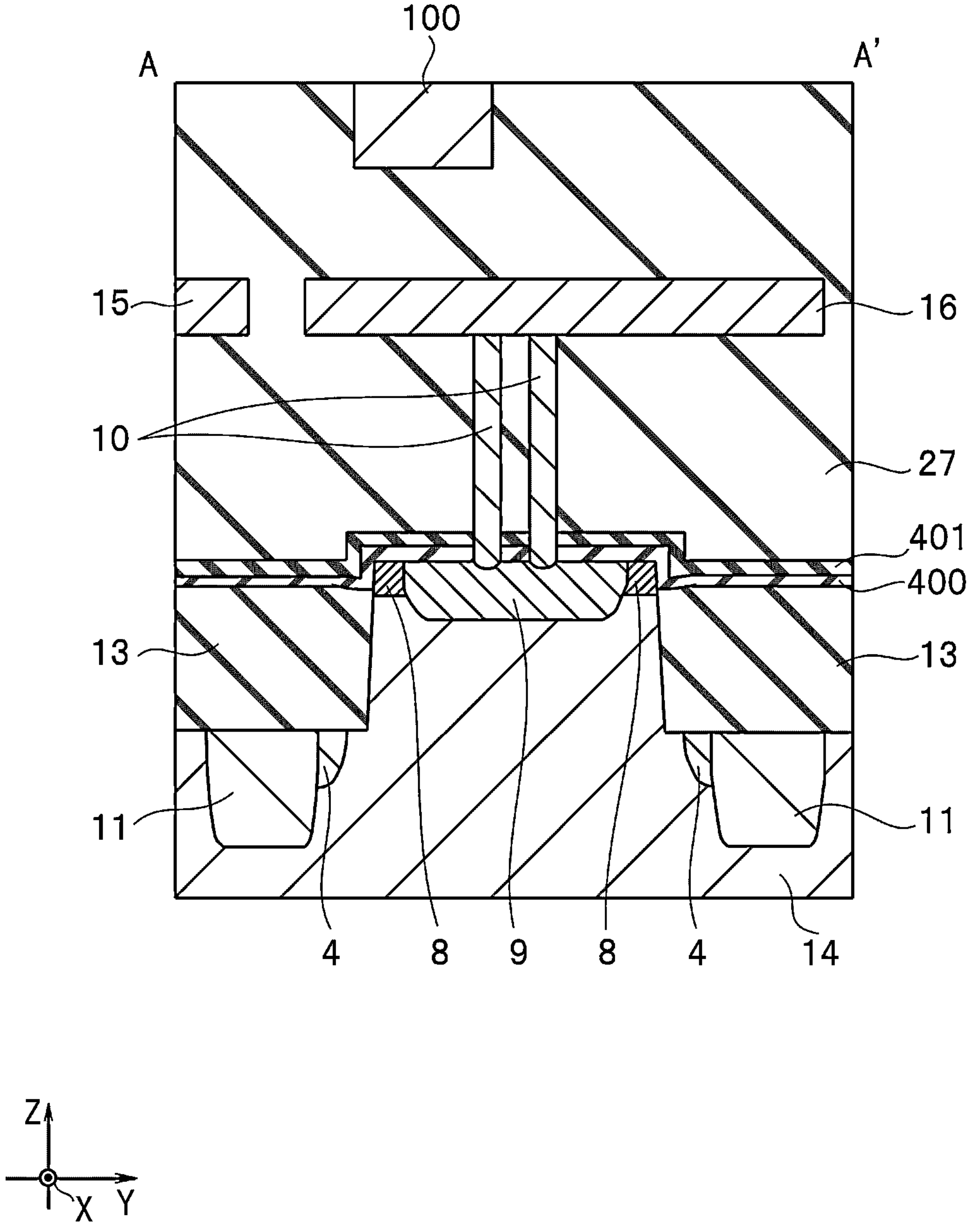
FIG. 7A shows a cross-sectional view taken along line A-A' shown in FIG. 6.
Figure 7B:
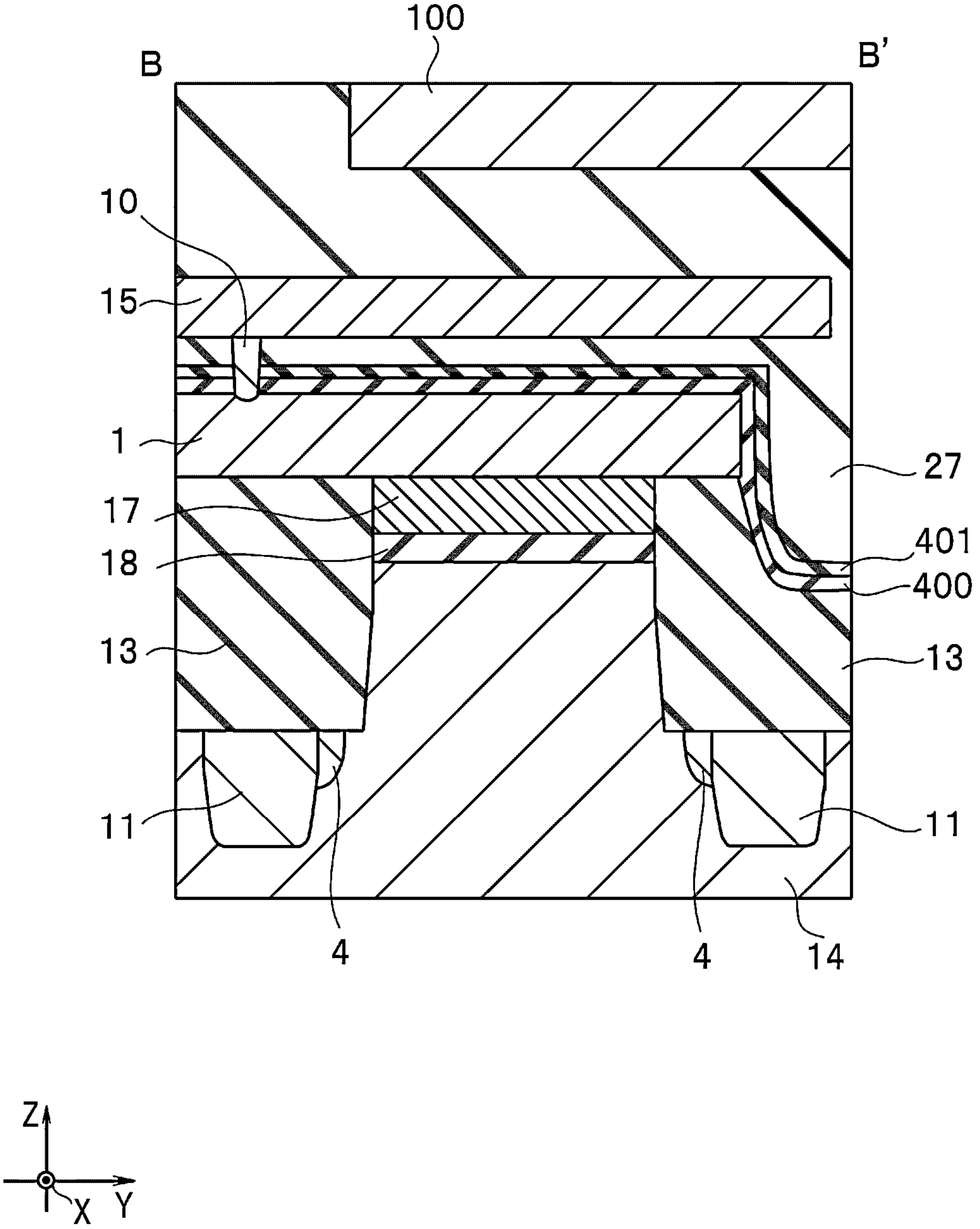
FIG. 7B shows a cross-sectional view taken along line B-B' shown in FIG. 6.
Figure 7C:
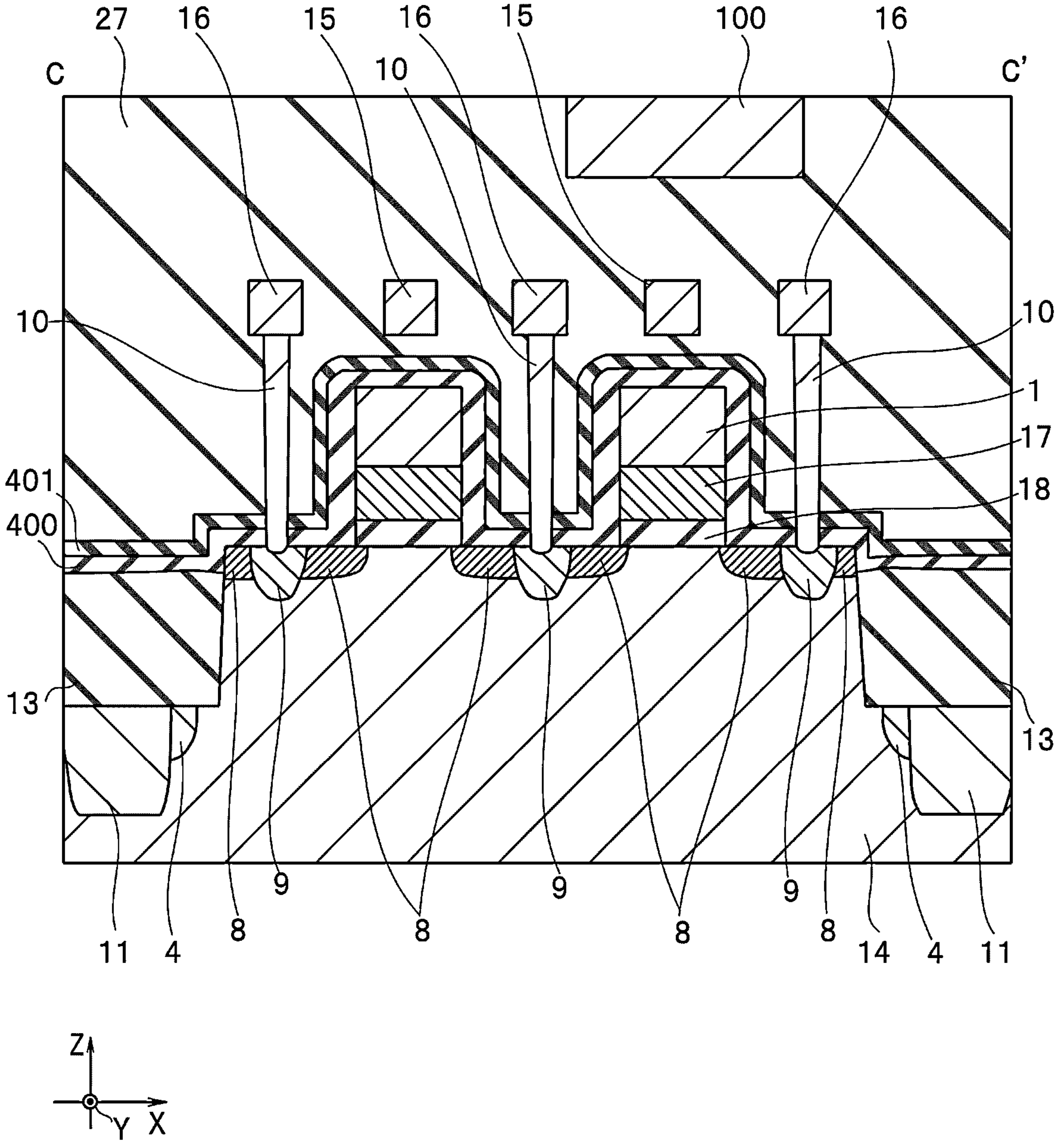
FIG. 7C shows a cross-sectional view taken along line C-C' shown in FIG. 6.
Figure 7D:
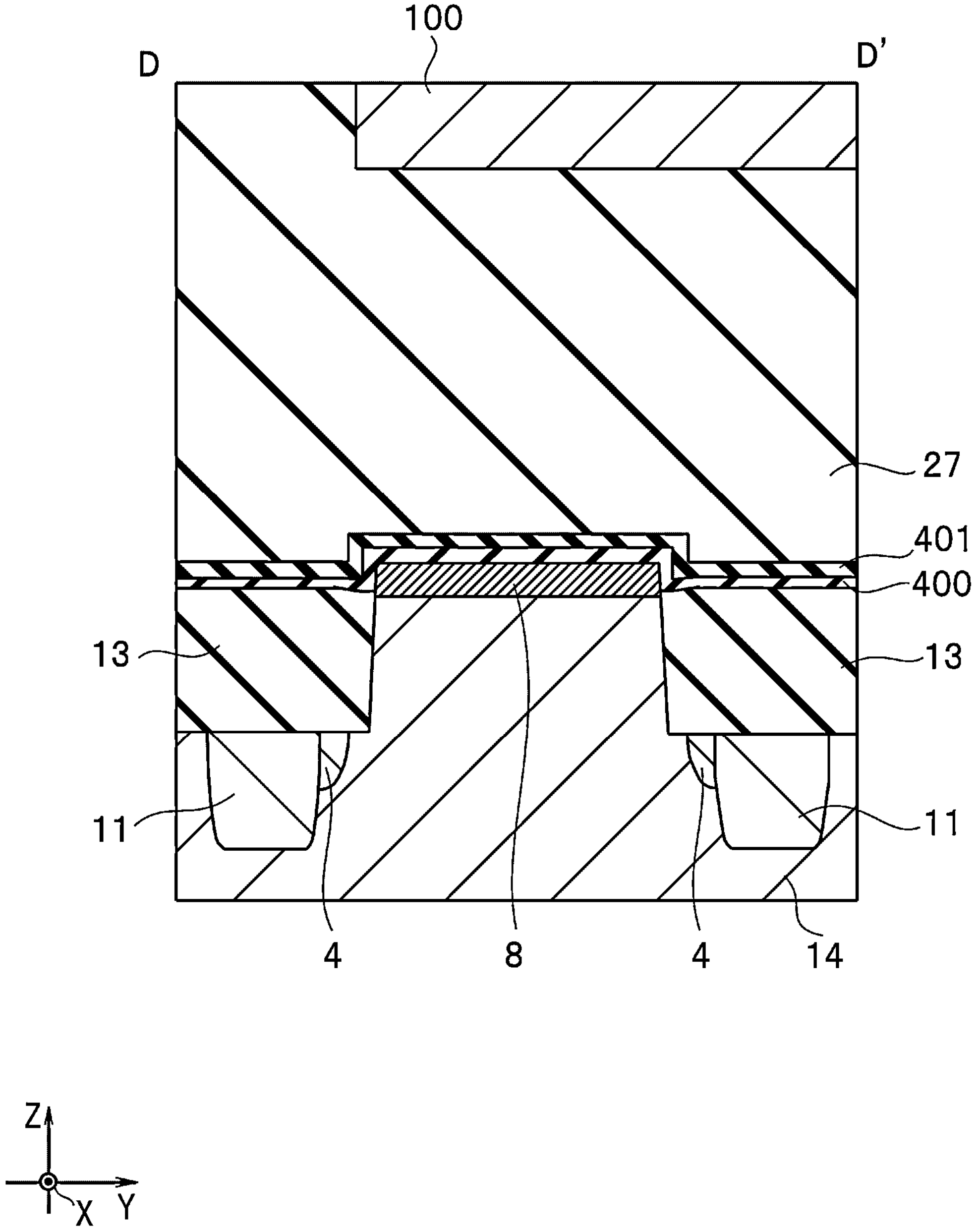
FIG. 7D shows a cross-sectional view taken along line D-D' shown in FIG. 6.
Figure 9A:
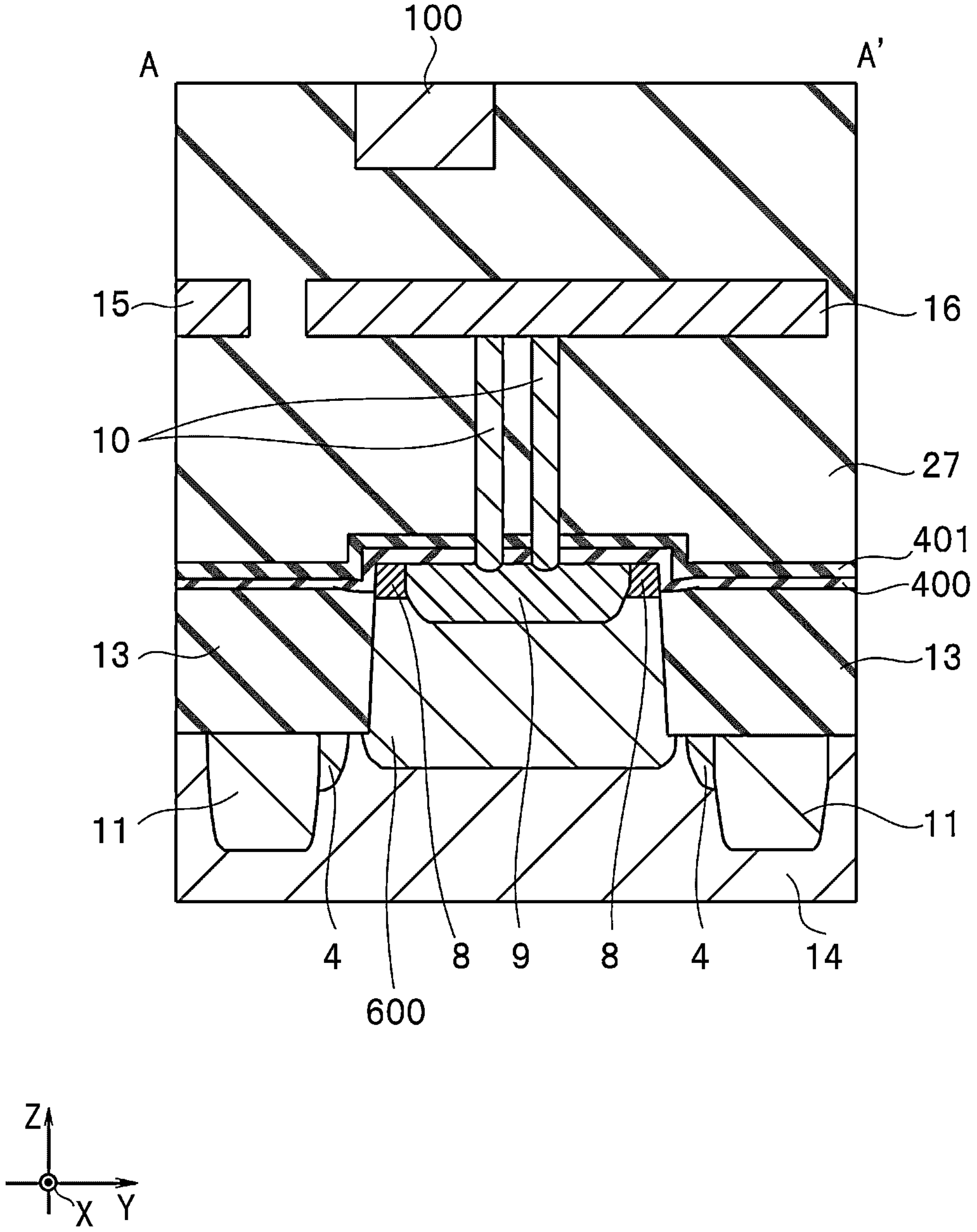
FIG. 9A shows a cross-sectional view taken along line A-A' shown in FIG. 8.
Figure 9B:
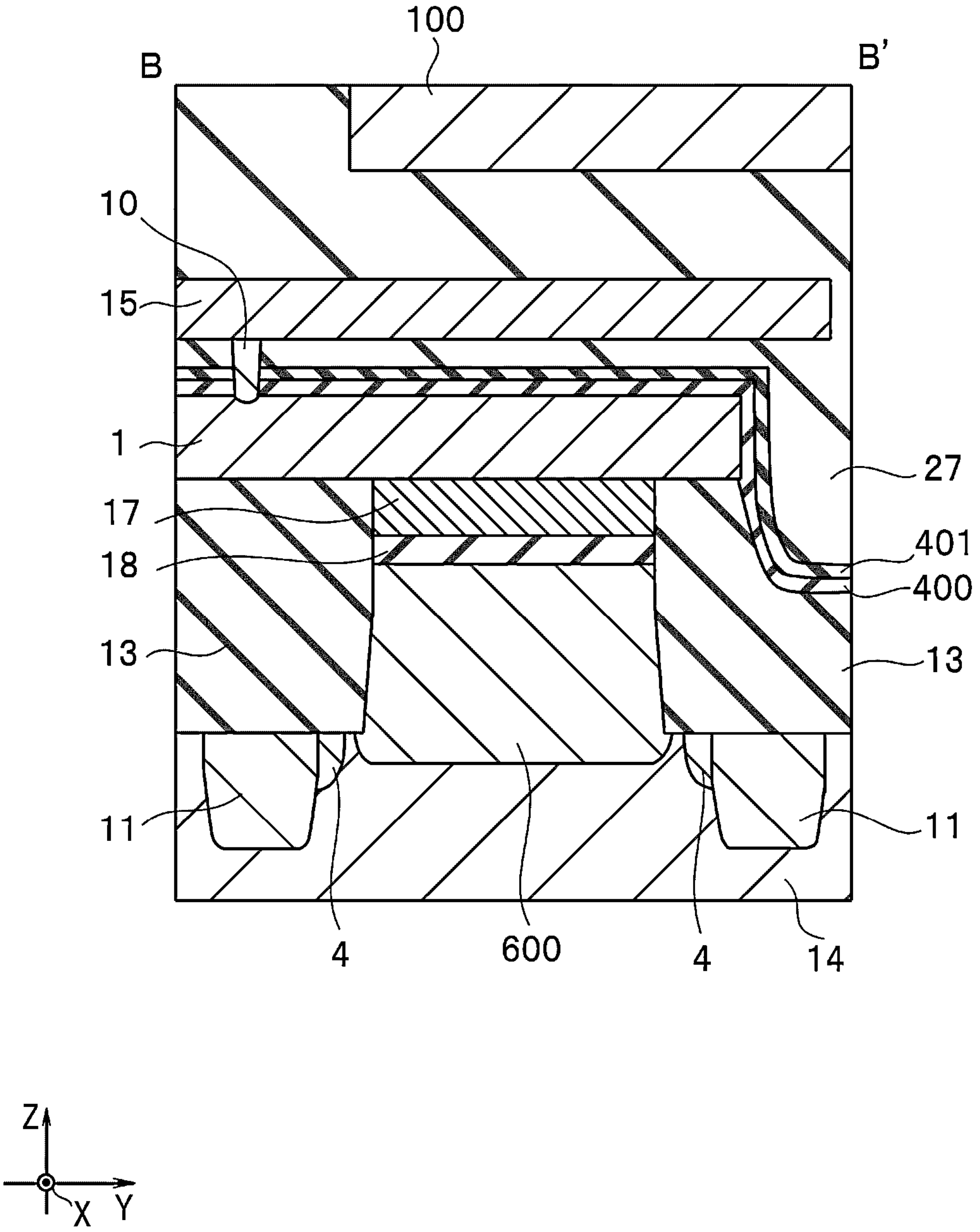
FIG. 9B shows a cross-sectional view taken along line B-B' shown in FIG. 8.
Figure 9C:
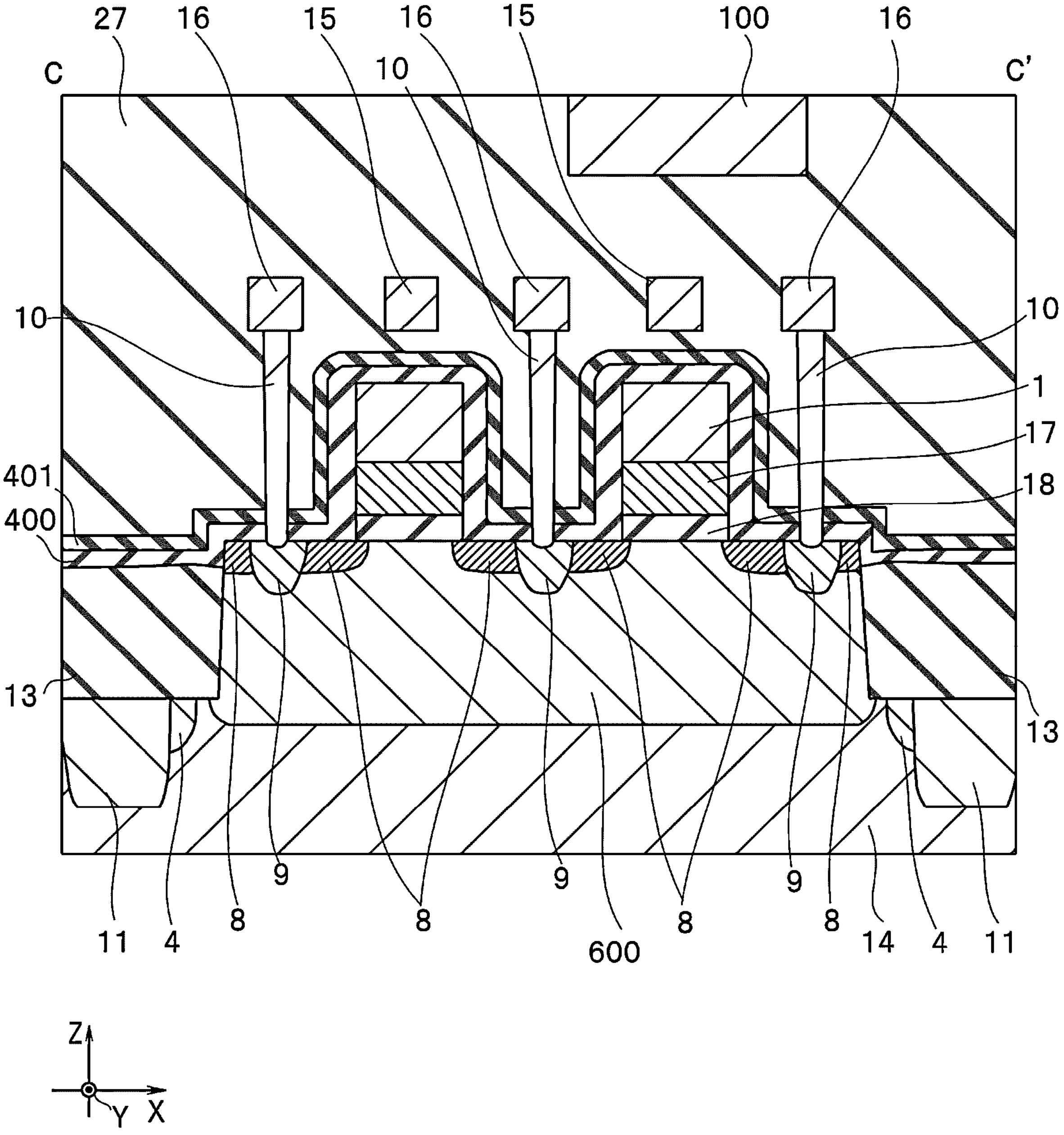
FIG. 9C shows a cross-sectional view taken along line C-C' shown in FIG. 8.
Figure 9D:
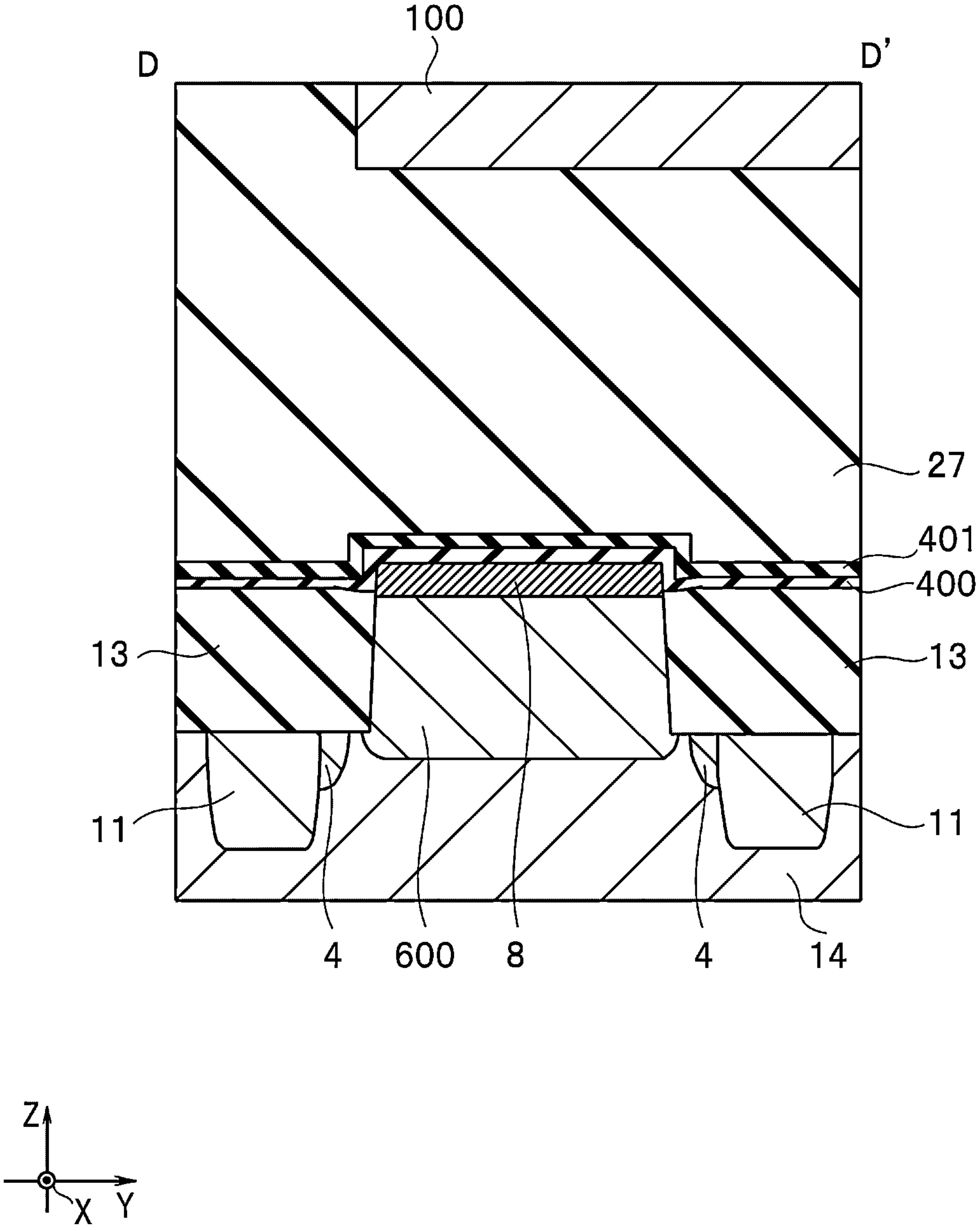
FIG. 9D shows a cross-sectional view taken along line D-D' shown in FIG. 8.

FIG. 7A shows a cross-sectional view taken along line A-A' shown in FIG. 6. FIG. 7B shows a cross-sectional view taken along line B-B' shown in FIG. 6. FIG. 7C shows a cross-sectional view taken along line C-C' shown in FIG. 6. FIG. 7D shows a cross-sectional view taken along line D-D' shown in FIG. 6. FIG. 9A shows a cross-sectional view taken along line A-A' shown in FIG. 8. FIG. 9B shows a cross-sectional view taken along line B-B' shown in FIG. 8. FIG. 9C shows a cross-sectional view taken along line C-C' shown in FIG. 8. FIG. 9D shows a cross-sectional view taken along line D-D' shown in FIG. 8. In each drawing, the same parts are denoted by the same reference numerals.

Next, the structures of the E-type transistor TR2 and the D-type transistor TR1 will be described with reference to FIGS. 7C and 9C. The E-type transistor TR2 and the D-type transistor TR1 are formed on a p-type semiconductor substrate 14 (for example, a silicon substrate) in which the concentration of a p-type impurity (for example, boron) is $10^{15}$ $cm^{-3}$ or less. A gate insulating film 18 is formed on the semiconductor substrate 14. The gate insulating film 18 is formed of, for example, a silicon oxide film or a silicon oxynitride film. A film thickness of the gate insulating film 18 is, for example, about 13 nm to 40 nm. By setting the film thickness of the gate insulating film 18 to be approximately 13 nm or more, even when a voltage of 10 V or more is applied between the gate insulating film 18 and the semiconductor substrate 14, tunnel leakage does not occur, and the deterioration in the reliability of the transistor is capable of being prevented.

In addition, the p-type impurity (for example, boron) is added to the semiconductor substrate 14 in a region in which the E-type transistor TR2 is formed, for example, so that the peak concentration is in a range of $1\times10^{14}$ $cm^{-3}$ or more and $5\times10^{17}$ $cm^{-3}$ or less to a depth of 1 μm from the surface (not shown). By adding such the p-type impurity, the threshold value of the transistor formed in the region is capable of being set to be higher than 0 V and to be approximately 3 V or less when the back bias is in the range of −1.5 V to −5 V. Therefore, the E-type transistor TR2, which is an enhancement type transistor, may be formed.

On the other hand, as shown in FIG. 9C, the n-type impurity (for example, phosphorus or arsenic) is further added to the semiconductor substrate 14 in the region in which the D-type transistor TR1 is formed, for example, by using ion implantation, so that the peak concentration is in a range of $1\times10^{15}$ $cm^{-3}$ or more and $5\times10^{16}$ $cm^{-3}$ or less from a depth of approximately 0.1 μm from the surface to a depth of approximately 0.5 μm, and the n-type impurity region 600 is formed. By forming the n-type impurity region 600, the threshold value of the transistor formed on the region is capable of being set to be lower than 0 V and higher than −4 V when the back bias is in the range of −1.5 V to −5 V. A D-type transistor TR1 that is a depletion type transistor may be formed.

Other elements are common to the E-type transistor TR2 and the D-type transistor TR1, and thus will be described with reference to FIG. 7C. The first conductive layer 17 is formed on the gate insulating film 18. The first conductive layer 17 is, for example, a polysilicon film having a conductivity in which an n-type impurity (for example, phosphorus or arsenic) or a p-type impurity (for example, boron) is added at a concentration of approximately $1\times10^{18}$ $cm^{-3}$ to $1\times10^{21}$ $cm^{-3}$. The thickness is, for example, about 10 nm to 500 nm. The first conductive layer 17 is formed in the element formation region partitioned by the element separation region 13. A structure in which the element formation regions including element separation region 13 and adjacent to each other are electrically separated from each other is formed, for example, as follows. First, a p-type well 11 and a stopper region 4 for preventing punch-through are formed on the p-type semiconductor substrate 14 using a photolithography technique, an ion implantation technique, and the like. The p-type impurity (for example, boron) is injected into the p-type well 11 and the stopper region 4 by a predetermined concentration to a predetermined depth. Next, the gate insulating film 18 of the peripheral transistor including the gate insulating film (not shown) of the memory cell, the E-type transistor TR2, and the D-type transistor TR1 is formed on the entire surface of the semiconductor substrate 14 by using a thermal oxidation technique or the like. Subsequently, a film serving as a material of the first conductive layer 17 is deposited by using a CVD method or the like. The stacked films are patterned so that the surface of the semiconductor substrate 14 in the formation region of the element separation region 13 is exposed by using a photolithography technique. Further, the opening portion of the semiconductor substrate 14 is etched to form a trench (deep groove) to a depth of, for example, 0.1 μm to 0.3 μm using, for example, an anisotropic etching technique. Finally, a structure in which an insulating film such as a silicon oxide film is embedded in the trench by using a CVD technique, a CMP technique, or the like to form the element separation region 13 and electrically separate the adjacent element formation regions is completed. By using such a formation method, the first conductive layer 17 can be formed into a flat surface without a step.

The control gate 1 is formed on the first conductive layer 17. The control gate 1 is, for example, a conductive polysilicon film to which the n-type impurity (for example, phosphorus or arsenic) or the p-type impurity (for example, boron) are added at a concentration of approximately $1\times10^{17}$ $cm^{-3}$ to $1\times10^{21}$ $cm^{-3}$. The control gate 1 may be a stacked structure film of a tungsten silicide (WSi) film and polysilicon. Alternatively, a stacked structure film of a metal silicide film such as a nickel silicide (NiSi) film, a molybdenum silicide (MoSi) film, a titanium silicide (TiSi) film, or a cobalt silicide (CoSi) film and polysilicon may be used. A metal silicide film such as a NiSi film, a MoSi film, a TiSi film, or a CoSi film may be used. Alternatively, a stacked structure film of a tungsten (W) film and a tungsten nitride (WN) film or a stacked structure film of a W film and a titanium nitride (TiN) film may be used. A thickness of the control gate 1 is, for example, approximately 10 nm to 500 nm.

A silicon oxide film 400 is formed on the control gate 1 and the diffusion layer 8. The silicon oxide film 400 is formed with a thickness in a range of, for example, 3 nm to 15 nm. A silicon nitride film 401 is further formed on the silicon oxide film 400. The silicon nitride film 401 is formed with a thickness in a range of, for example, 10 nm to 100 nm. A diffusion layer 8 having an n-type conductive type is formed in a predetermined region of the semiconductor substrate 14 from the surface to a predetermined depth. The n-type impurity (for example, phosphorus, arsenic, or antimony) is added to the diffusion layer 8 so that the surface concentration is, for example, approximately $1\times10^{17}$ $cm^{-3}$ to $1\times10^{20}$ $cm^{-3}$. A bonding depth of the diffusion layer 8 is, for example, approximately 10 nm to 300 nm. The diffusion layer 8 is formed in a self-aligned manner with respect to a stacked gate structure including the first conductive layer 17 and the control gate 1, and functions as a lightly doped drain (LDD) region that is a source electrode or a drain electrode. In addition, a diffusion layer 9 having an n-type conductive type is formed in a region adjacent to the diffusion layer 8 of the semiconductor substrate 14 from the surface to a predetermined depth. The diffusion layer 9 is formed with a higher impurity concentration than that of the diffusion layer 8, and for example, the n-type impurity (for example, phosphorus, arsenic, or antimony) is added so that the surface concentration is approximately $1\times10^{18}$ $cm^{-3}$ to $1\times10^{22}$ $cm^{-3}$. A bonding depth of the diffusion layer 9 is, for example, approximately 40 nm to 500 nm. That is, the diffusion layer 9 has a deeper bonding depth and a lower resistance than the diffusion layer 8. The diffusion layer 9 functions as a contact region of the source electrode or the drain electrode. That is, the diffusion layer 9 is a portion required to reduce the contact resistance with respect to the source electrode or the drain electrode, and is different from the diffusion layer 8 (LDD region) in that the diffusion layer 9 has an impurity peak concentration of $1\times10^{20}$ $cm^{-3}$ or more and $1\times10^{22}$ $cm^{-3}$ or less, which is different from the impurity peak concentration of $1\times10^{17}$ $cm^{-3}$ or more and $1\times10^{19}$ $cm^{-3}$ or less of the diffusion layer 8.

The interlayer insulating film 27 (for example, a silicon oxide film) is stacked on the entire surface of the silicon nitride film 401. In addition, a contact plug 10 is formed on the diffusion layer 9. The contact plug 10 is formed above the upper surface of the silicon nitride film 401 stacked on the control gate 1. The contact plug 10 is formed of, for example, W (tungsten). The contact plug 10 is formed in a hole drilled in the interlayer insulating film 27 by penetrating the silicon oxide film 400 and the silicon nitride film 401, and electrically connects the control gate 1 (gate electrode) or the diffusion layer 9 (source electrode or drain electrode) to a predetermined wiring formed in the upper wiring layer (for example, the first wiring layer). A barrier metal (not shown) made of, for example, titanium (Ti) or TiN is formed on the lower surface of the contact plug 10.

The wirings 15 and 16 are formed in the first wiring layer. A barrier metal (not shown) made of, for example, Ti (titanium) or TiN is formed on the upper surface of the contact plug 10. The wiring 16 is electrically connected to the diffusion layer 9 via the contact plug 10 (see FIGS. 7A and 9A). The wiring 15 is electrically connected to the control gate 1 via the contact plug 10 (see FIGS. 7B and 9B). A second wiring layer is formed above the first wiring layer with an interlayer insulating film 27 interposed therebetween. For example, the wiring 100 is formed in the second wiring layer.

As shown in FIGS. 6 and 8, in the comparative example, the wiring 15 is mainly formed above the control gate 1 when viewed in the Z direction, and there is no region in which the wiring 15 and the diffusion layer 8 are superimposed. In addition, a region in which the wiring 100 and the diffusion layer 8 are superimposed is widely present in a region in which the wirings 15 and 16 are not formed (see FIGS. 7D and 9D).

Figure 10A:
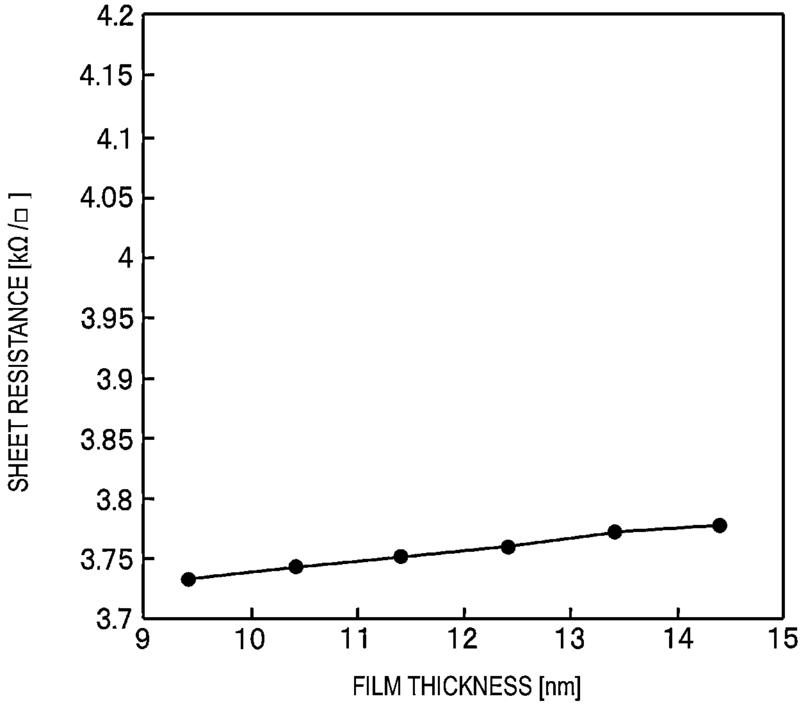
FIG. 10A is a diagram showing a resistance value variation of a diffusion layer in the comparative example.
Figure 10B:
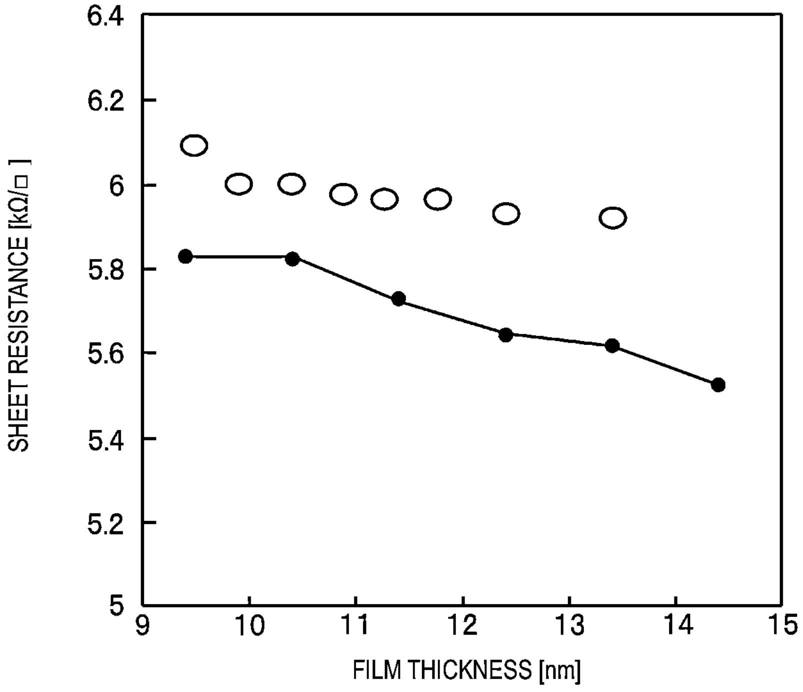
FIG. 10B is a diagram showing the resistance value variation of the diffusion layer in the comparative example.

FIGS. 10A and 10B are diagrams showing a resistance value variation of the diffusion layer 8 in the comparative example. Specifically, regarding the diffusion layer 8 of the E-type transistor TR2 as shown in FIG. 7D, FIGS. 10A and 10B show a resistance value variation when the thickness of the silicon oxide film 400 formed on the diffusion layer 8 is changed. FIG. 10A shows a simulation result of a resistance value variation when the fixed charges are not present in the silicon oxide film 400 and the silicon nitride film 401.

As shown in FIG. 10A, as the film thickness of the silicon oxide film 400 increases, the resistance of the diffusion layer 8 increases. The diffusion layer 8 used in the simulation is formed by ion-implanting an impurity into the semiconductor substrate 14 on which the silicon oxide film 400 is deposited under the following conditions. That is, the p-type impurity (for example, boron) is injected to have an impurity concentration in a range of $2\times10^{11}$ $cm^{-3}$ to $1\times10^{12}$ $cm^{-3}$ at an acceleration energy between 30 keV and 80 keV, and then the n-type impurity (for example, phosphorus) is injected to have an impurity concentration in a range of $5\times10^{11}$ $cm^{-3}$ to $3\times10^{12}$ $cm^{-3}$ at an acceleration energy between 10 keV and 50 keV, so that the diffusion layer 8 is formed. As shown in FIG. 10A, the film thickness of the silicon oxide film 400 tends to increase, and the resistance value of the diffusion layer 8 also tends to increase. It is considered that such a tendency is caused by an increase in the amount of the n-type impurity (for example, phosphorus) that does not reach the semiconductor substrate 14 and remains in the silicon oxide film 400 as the film thickness of the silicon oxide film 400 increases when the diffusion layer 8 is formed by ion implantation.

On the other hand, FIG. 10B shows a resistance value variation when electrons of $1.15\times10^{12}$ $cm^{-2}$ are present at the interface between the silicon oxide film 400 and the silicon nitride film 401. In FIG. 10B, a black circle indicates a simulation result, and a white circle indicates a measurement result, respectively. As shown in FIG. 10B, as the film thickness of the silicon oxide film 400 increases, the measured value of the resistance of the diffusion layer 8 decreases. Since the value of the simulation also tends to decrease in the same manner, it may be seen that the trend of the variation in the measured values matches the simulation result. Further, when comparing FIG. 10A and FIG. 10B, the resistance value of the diffusion layer 8 is larger as a whole within the range of the film thickness of the silicon oxide film 400 shown in FIGS. 10A and 10B when the silicon nitride film 401 is present (FIG. 10B) than when the silicon nitride film 401 is not present (FIG. 10A). It is considered that the phenomenon in which the diffusion layer 8 is depleted is caused by the electrons (the electrons trapped at the interface position between the silicon oxide film 400 and the silicon nitride film 401) accumulated at a location separated from the film thickness of the silicon oxide film 400.

In view of the above, it may be seen that, when manufacturing the NAND memory non-volatile memory including the high voltage switch, in the process of forming the plurality of wiring layers, the electrons are accumulated to the silicon nitride film 401 having a large interface level or electron trapping level between the silicon oxide film 400 and the silicon nitride film 401, and the resistance value of the diffusion layer 8 is increased. Generally, the fact that the voltage is applied to the semiconductor substrate 14 on which various films are formed during the processing of the wiring layer using the etching technique or during the formation of the wiring layer using the PVD technique (when the metal serving as the material is deposited) causes the generation of electrons and the like from the upper portion side of the wiring layer and the movement of the electrons and the like in the silicon oxide film toward the semiconductor substrate 14 is known as an antenna effect. In the comparative example, the region of the wiring 100 facing the diffusion layer 8 is widely present in the region where the wirings 15 and 16 are not formed. Therefore, there is a problem in that the resistance of the diffusion layer 8 is unexpectedly varied because the amount and the location where the charge generated in the processing of the wiring layer are accumulated are changed by the arrangement of the wiring 100.

When the resistance of the diffusion layer 8 increases, the current driving capability of the transistor decreases. On the other hand, when the resistance of the diffusion layer 8 is reduced, there is also a problem in that the bonding breakdown voltage deteriorates because the voltage drop amount in the diffusion layer 8 is reduced and a high voltage is applied to the vicinity of the gate when a high voltage is applied to the drain electrode to bring the transistor into a blocked state.

Next, an operation and a structure of the high voltage switch according to the present embodiment will be described with reference to the drawings. In the following description, the same reference numerals are given to the same parts. In addition, portions described in the comparative example that are the same as the present embodiment are omitted.

Figure 11:
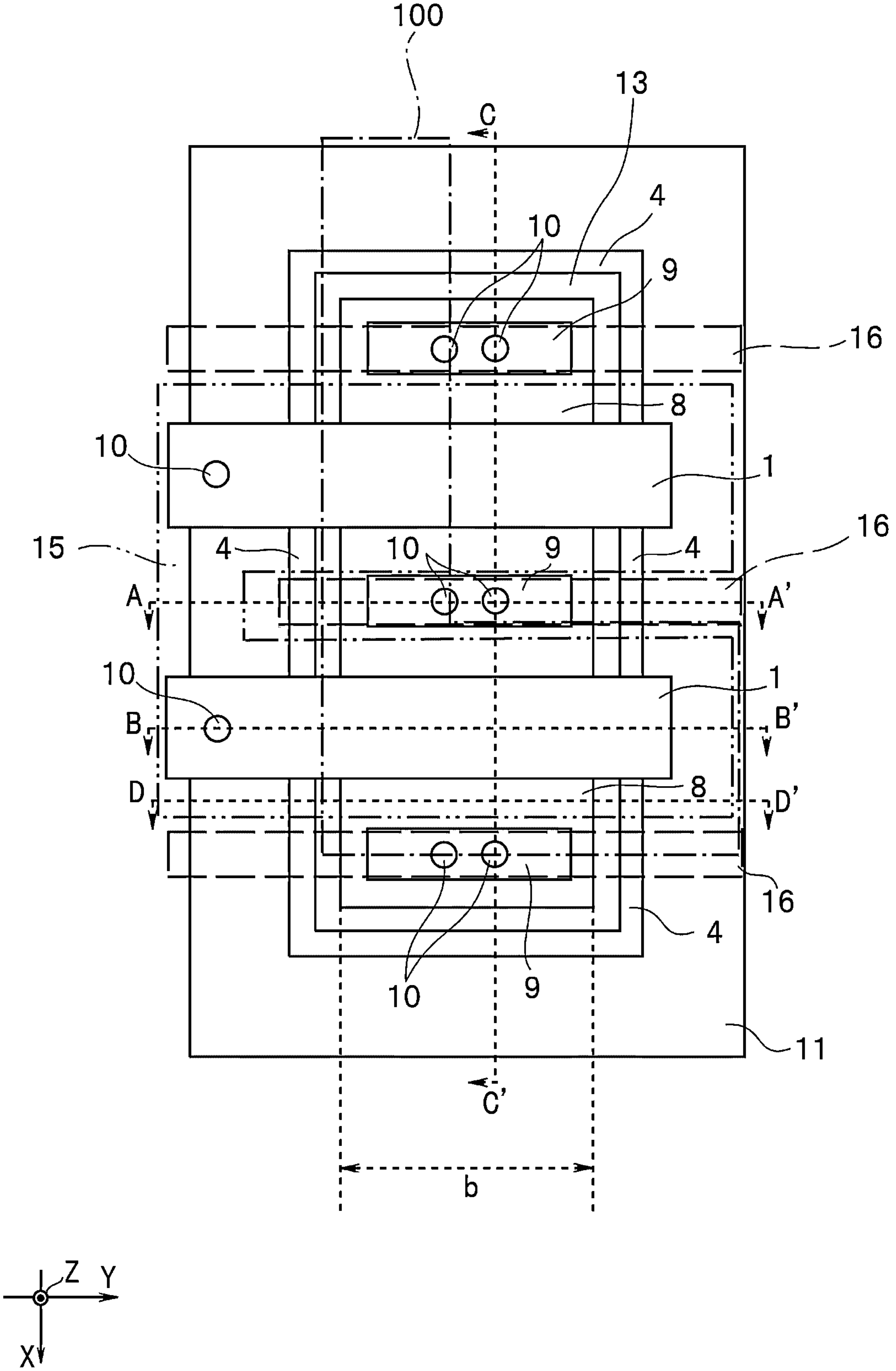
FIG. 11 is a plan view illustrating an example of a structure of the E-type transistor TR2 according to the first embodiment.
Figure 13:
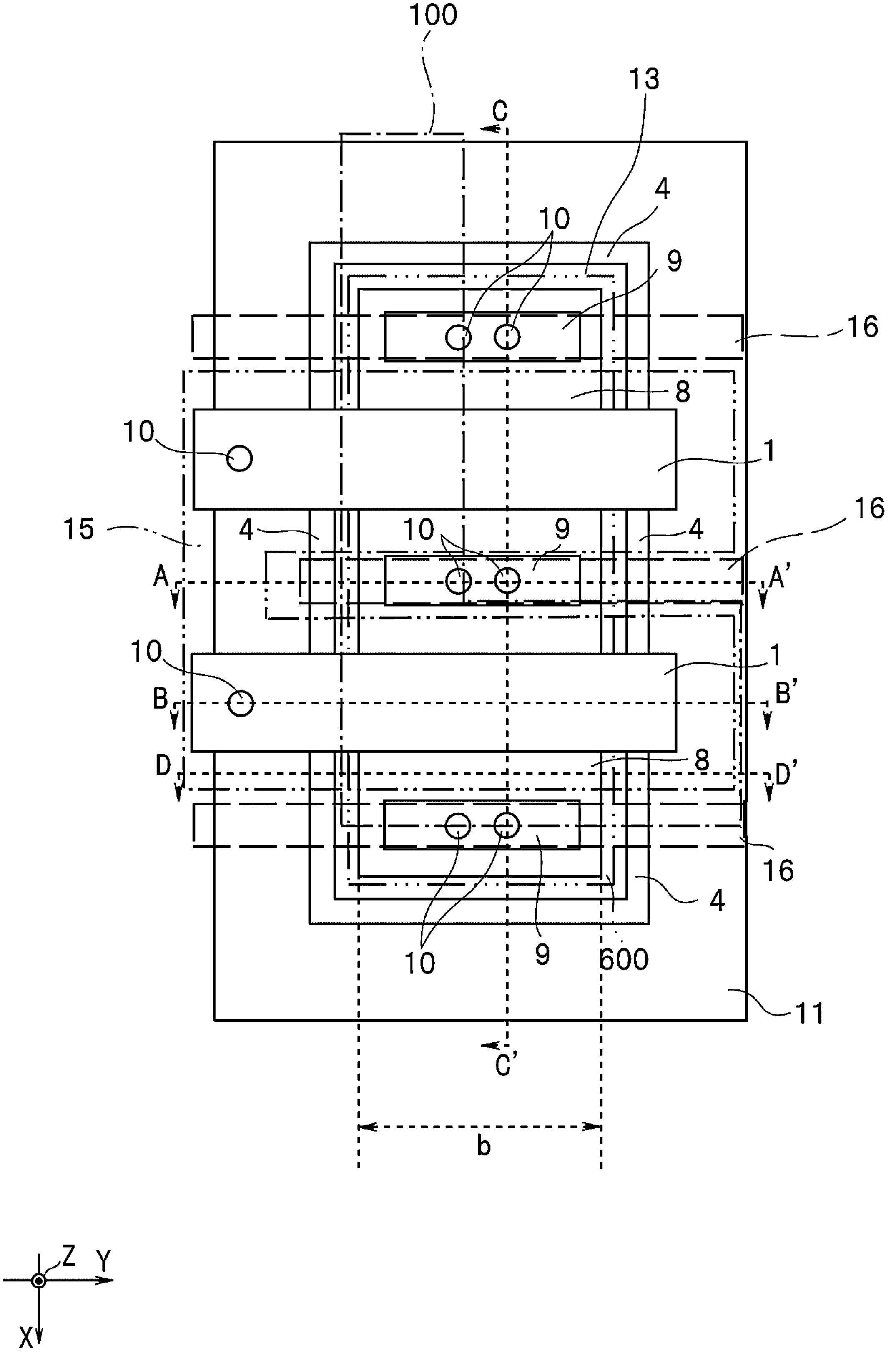
FIG. 13 is a plan view describing an example of a structure of the D-type transistor TR1 according to the first embodiment.

First, a structure of the D-type transistor TR1 and the E-type transistor TR2 in the high voltage switch of the present embodiment will be described. FIG. 11 is a plan view describing an example of a structure of the E-type transistor TR2 according to a first embodiment. FIG. 13 is a plan view describing an example of a structure of the D-type transistor TR1 according to the first embodiment.

Figure 12A:
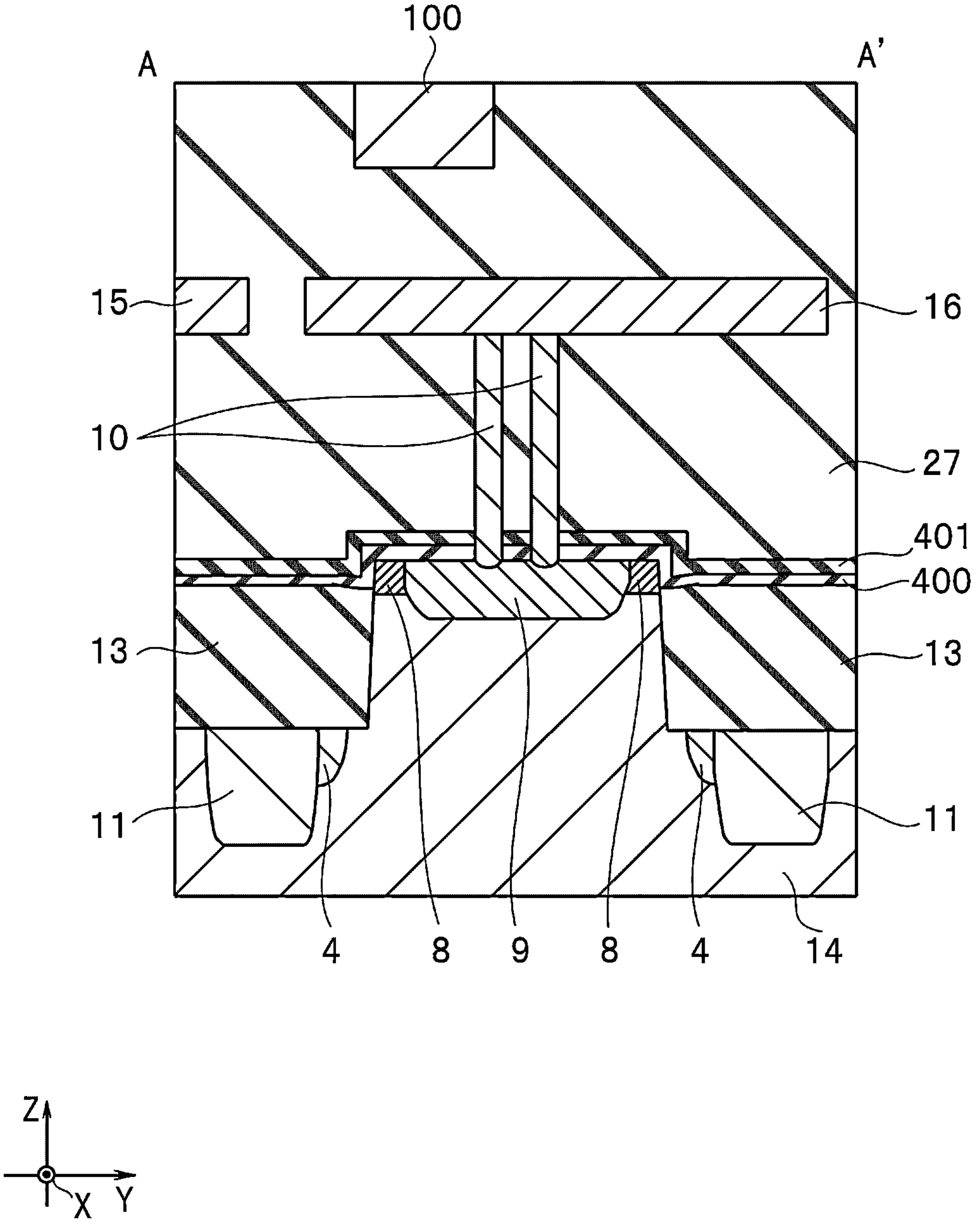
FIG. 12A shows a cross-sectional view taken along line A-A' shown in FIG. 11.
Figure 12B:
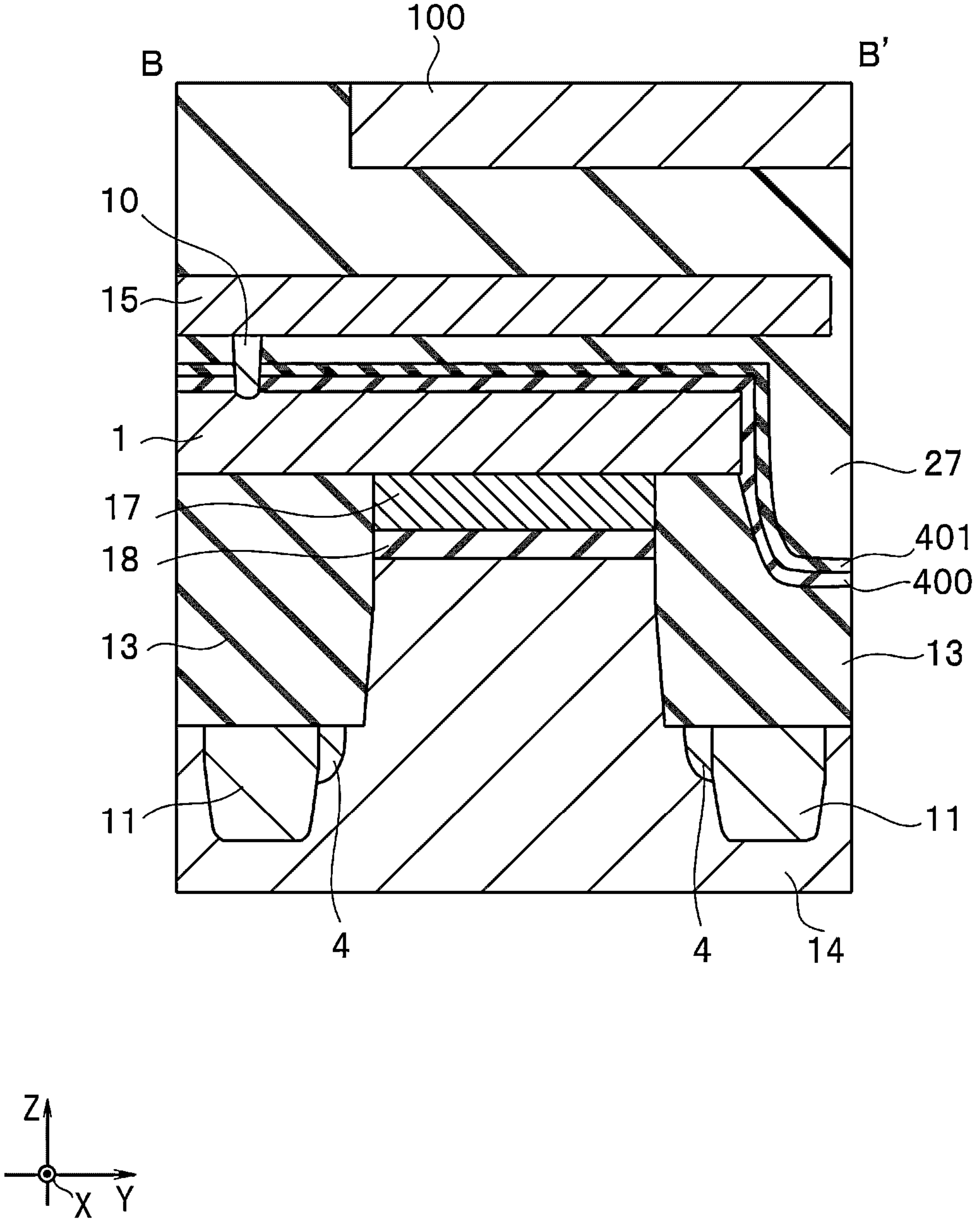
FIG. 12B shows a cross-sectional view taken along line B-B' shown in FIG. 11.
Figure 12C:
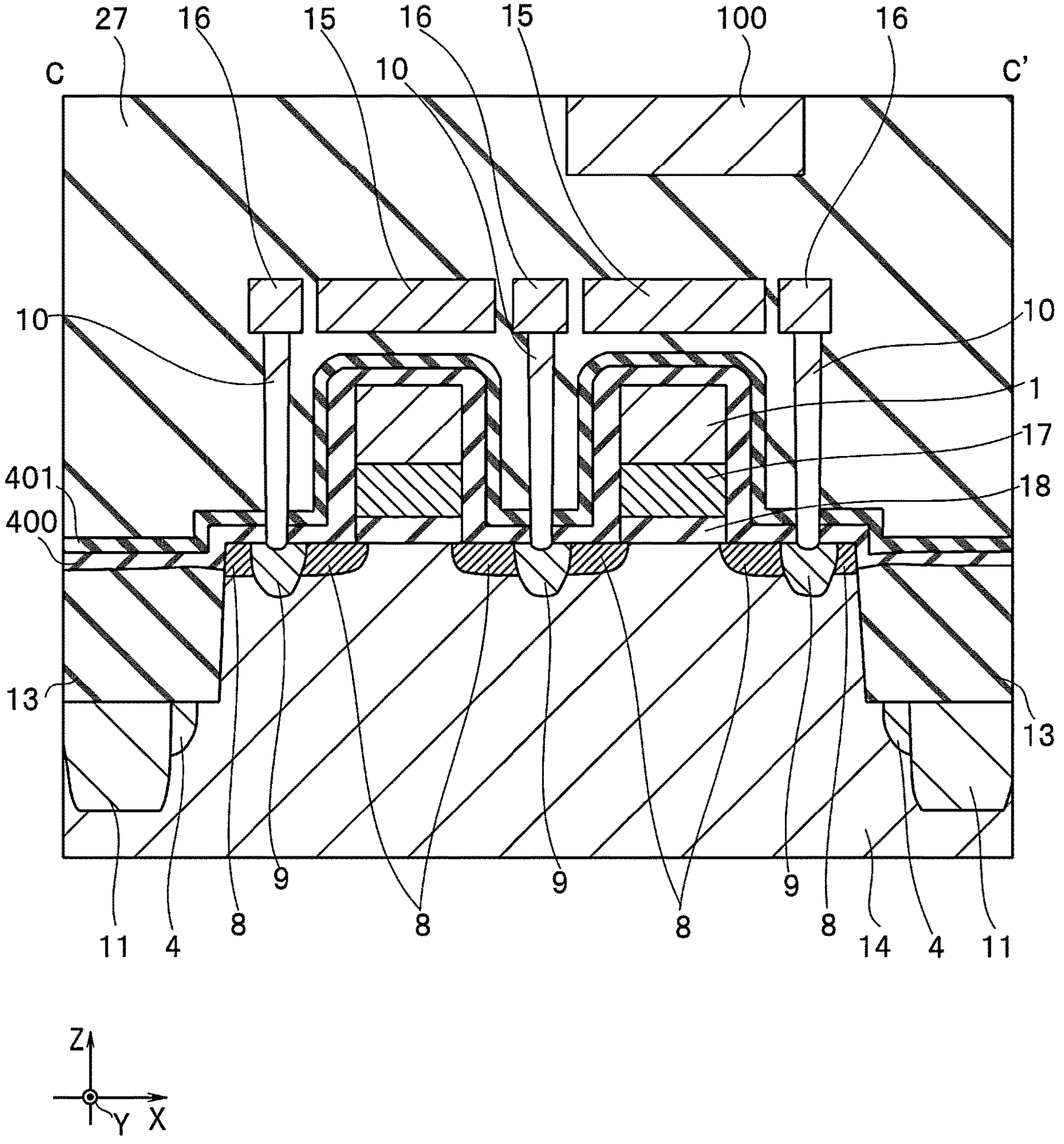
FIG. 12C shows a cross-sectional view taken along line C-C' shown in FIG. 11.
Figure 12D:
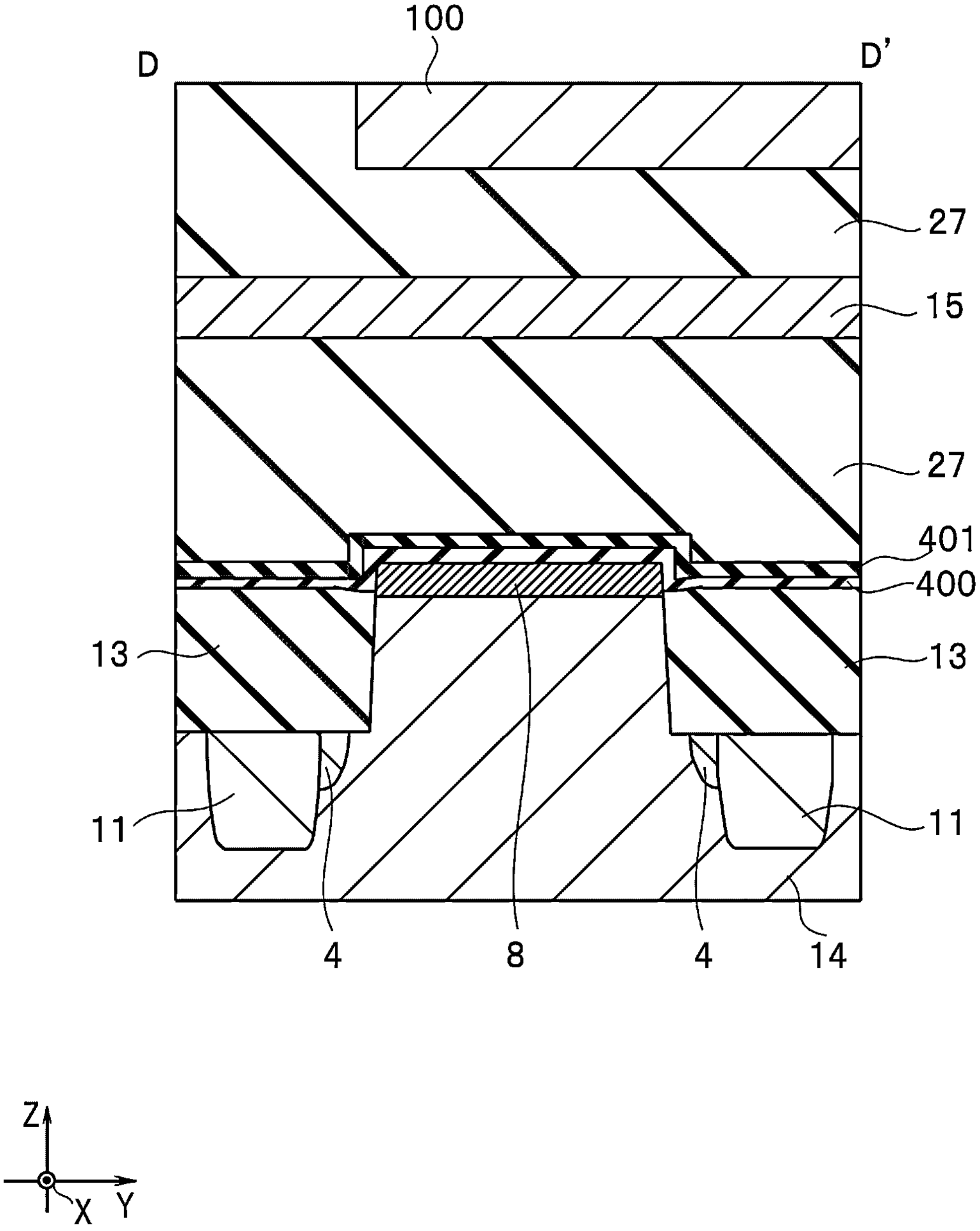
FIG. 12D shows a cross-sectional view taken along line D-D' shown in FIG. 11.
Figure 14A:
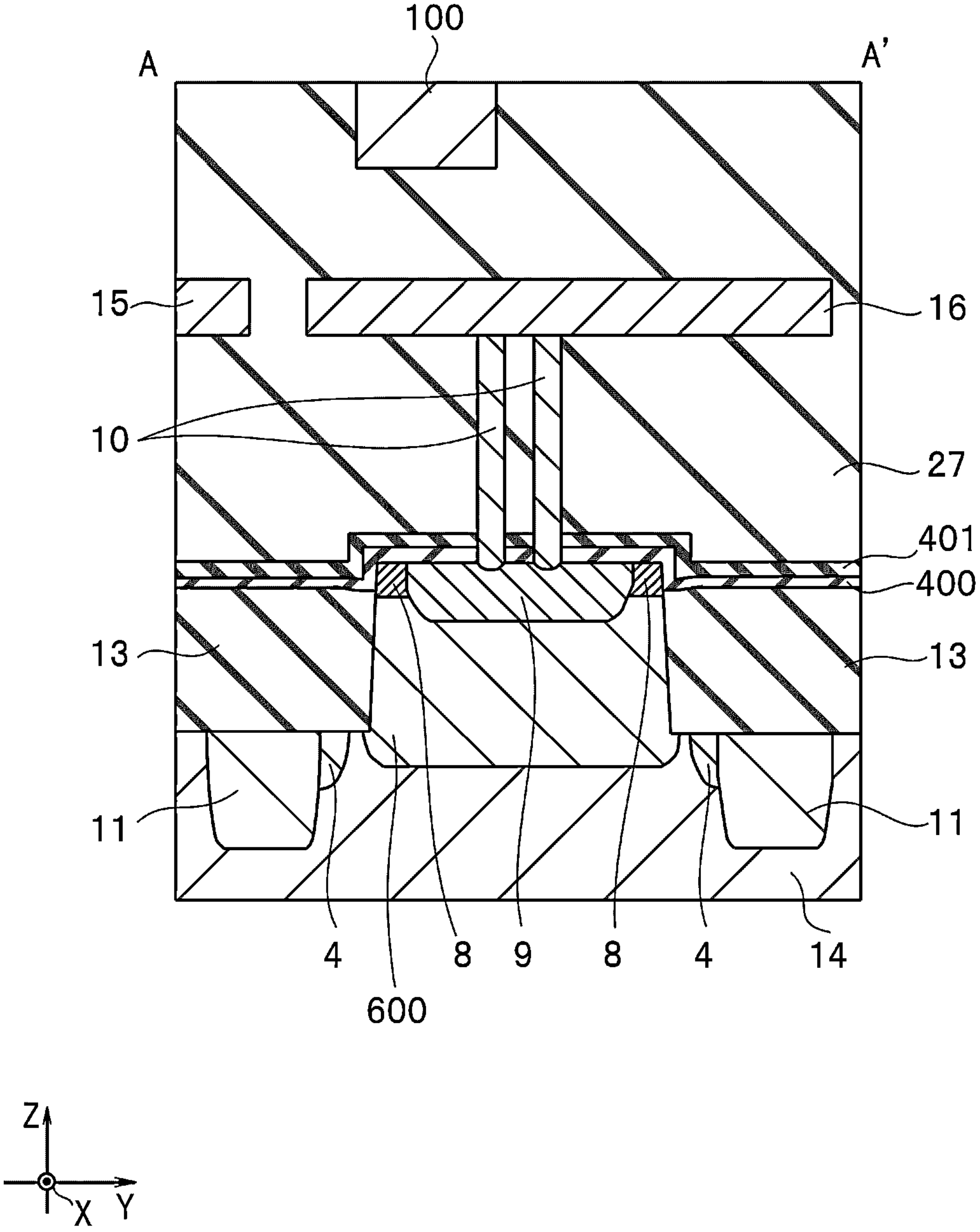
FIG. 14A shows a cross-sectional view taken along line A-A' shown in FIG. 13.
Figure 14B:
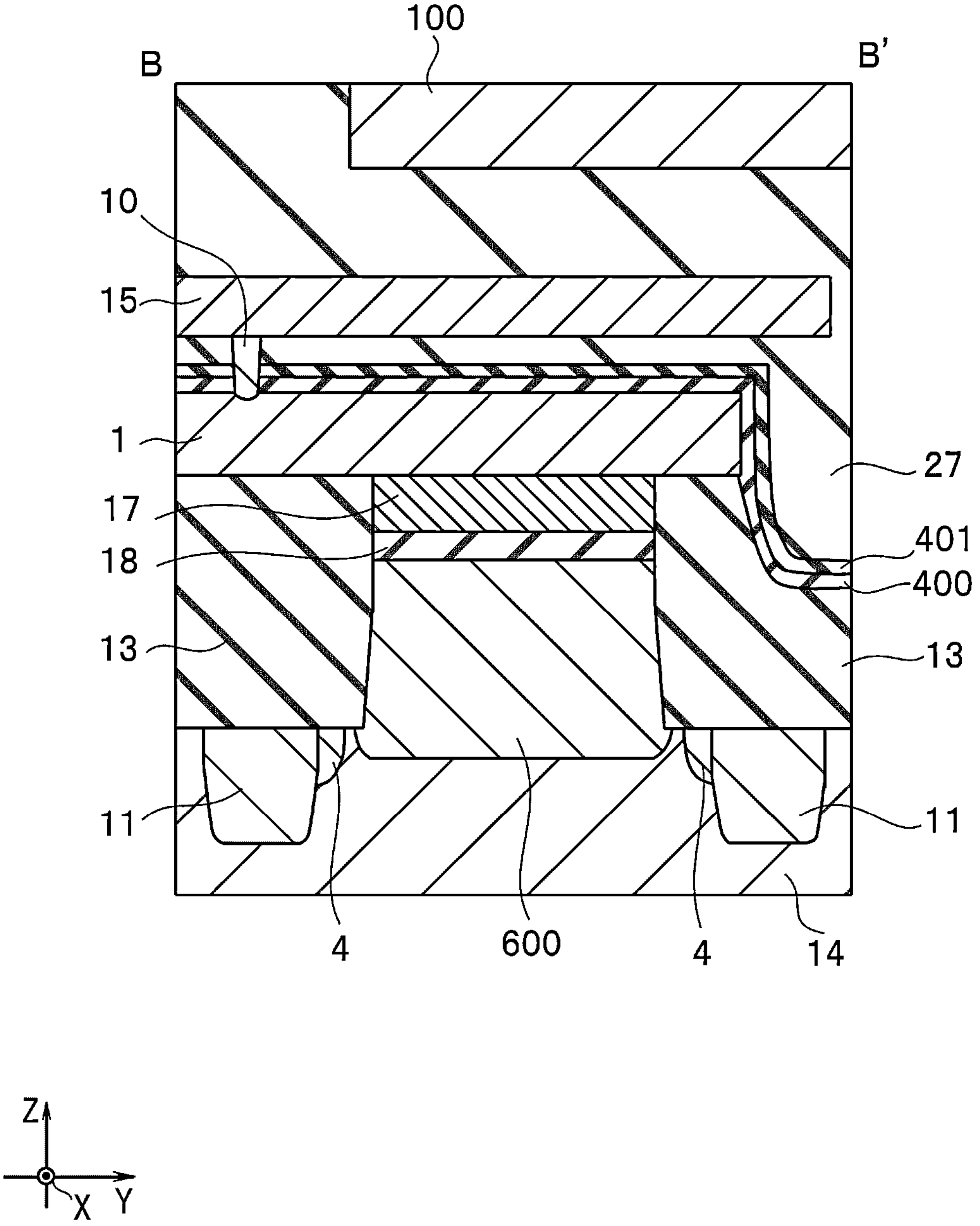
FIG. 14B shows a cross-sectional view taken along line B-B' shown in FIG. 13.
Figure 14C:
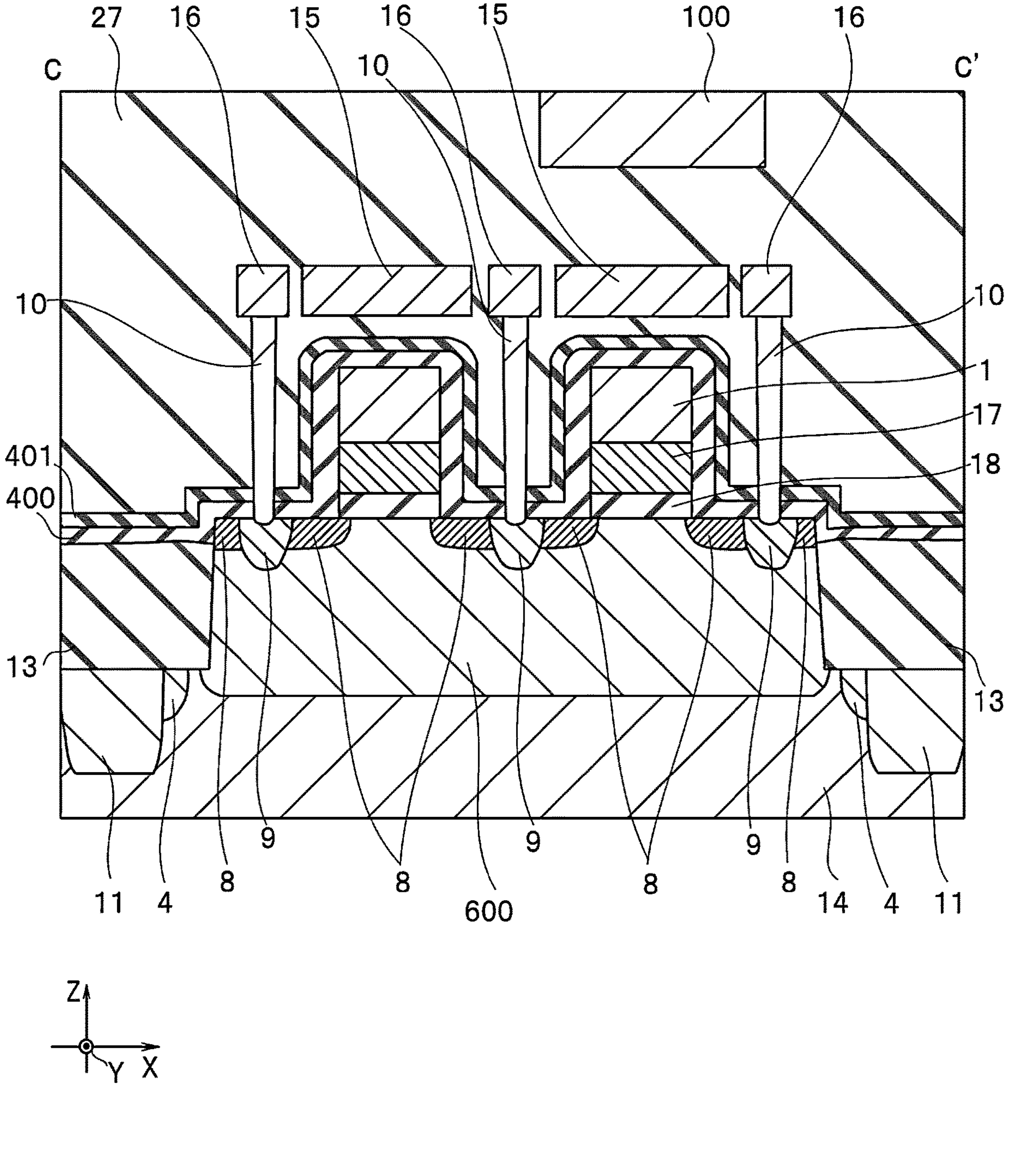
FIG. 14C shows a cross-sectional view taken along line C-C' shown in FIG. 13.
Figure 14D:
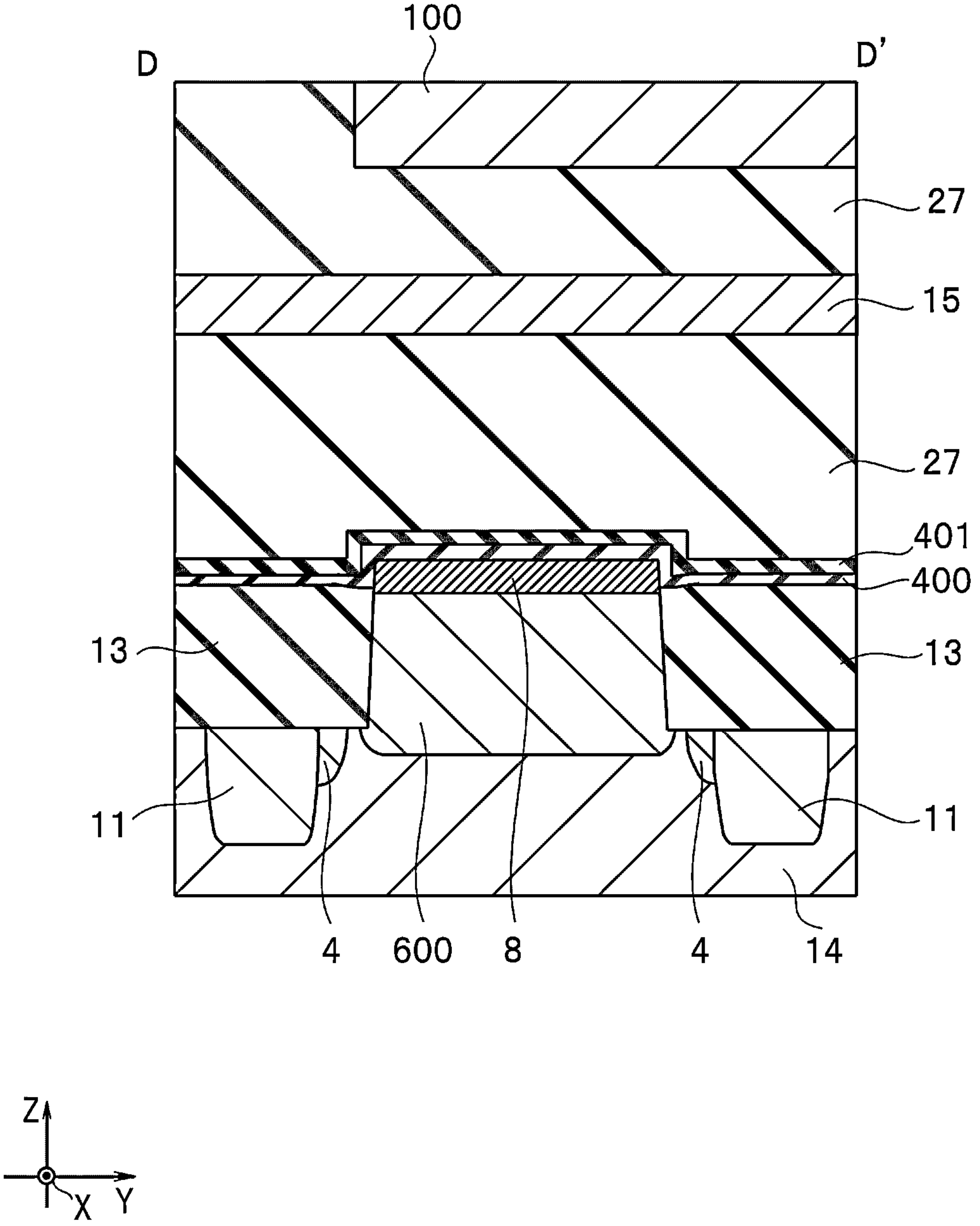
FIG. 14D shows a cross-sectional view taken along line D-D' shown in FIG. 13.

FIG. 12A shows a cross-sectional view taken along line A-A' shown in FIG. 11. FIG. 12B shows a cross-sectional view taken along line B-B' shown in FIG. 11. FIG. 12C shows a cross-sectional view taken along line C-C' shown in FIG. 11. FIG. 12D shows a cross-sectional view taken along line D-D' shown in FIG. 11. FIG. 14A shows a cross-sectional view taken along line A-A' shown in FIG. 13. FIG. 14B shows a cross-sectional view taken along line B-B' shown in FIG. 13. FIG. 14C shows a cross-sectional view taken along line C-C' shown in FIG. 13. FIG. 14D shows a cross-sectional view taken along line D-D' shown in FIG. 13.

The diffusion layer 9 (region functioning as the source electrode) of the D-type transistor TR1 shown in FIG. 13 and the diffusion layer 9 (region functioning as the drain electrode) of the E-type transistor TR2 shown in FIG. 11 are formed separately and are electrically connected to each other via an upper wiring (not shown).

FIGS. 11 and 13 show a planar structure on a lower side of the contact plug 10 and a first wiring layer and a second wiring layer among a plurality of wiring layers formed on an upper side of the contact plug 10, and the other wiring layers are omitted. A wiring 15 indicated by a double-dotted line and a wiring 16 indicated by a broken line are disposed in the first wiring layer. A wiring 100 indicated by a one-dotted line is disposed in the second wiring layer. The first wiring layer is formed between the second wiring layer and the semiconductor substrate 14.

In the high voltage switch of the first embodiment, the structures of the D-type transistor TR1 and the E-type transistor TR2 are the same as those in the comparative example. A characteristic structure of the first embodiment, which is different from the comparative example, is a shape and a disposition of the wiring 15 (first wiring). As shown in FIGS. 11 and 13, the length of the wiring 15 in the X direction is longer than the length of the control gate 1 in the X direction within the range of the active region width b of the transistor. Specifically, as shown in FIGS. 12C and 14C, the length of the wiring 15 in the X direction is longer than the length of the control gate 1 in the X direction. In addition, an end portion of the wiring 15 on one side (left side of the paper surface) in the X direction is disposed on the left side with respect to an end portion of the control gate 1 on one side in the X direction, and an end portion of the wiring 15 on the other side (right side of the paper surface) in the X direction is disposed on the right side with respect to an end portion of the control gate 1 on the other side in the X direction.

That is, the end portion of the wiring 15 on one side in the X direction is located above the diffusion layer 8 disposed on one side of the control gate 1 in the X direction, and the end portion of the wiring 15 on the other side in the X direction is located above the diffusion layer 8 disposed on the other side of the control gate 1 in the X direction. The pair of diffusion layers 8 disposed on both sides of the control gate 1 in the X direction correspond to a first source diffusion layer and a first drain diffusion layer. By shaping and disposing the wiring 15 as described above, a region in which the wiring 15 is formed between the diffusion layer 8 and the wiring 100 as shown in FIGS. 12D and 14D can be provided. It is preferable that the distance between the end portion of the wiring 15 on one side in the X direction and the end portion of the control gate 1 on one side in the X direction, and the distance between the end portion of the wiring 15 on the other side in the X direction and the end portion of the control gate 1 on the other side in the X direction are each at least 0.1 μm or more.

In this way, the wiring 15 electrically connected to the control gate 1 is continuously extended from the upper portion of the control gate 1 onto the diffusion layer 8 connected to the source electrode or the drain electrode of the transistor. That is, the width of the first wiring in a direction parallel to the surface of the semiconductor substrate and the direction corresponding to a distance between the source diffusion layer and the drain diffusion layer is wider than a width of the gate electrode. Therefore, the region formed on the diffusion layer 8 of the wiring 100 and not formed in the wirings 15 and 16 (see FIGS. 11 and 13) are very narrow as compared with the comparative example (see FIGS. 7 and 9). Therefore, in the structure of the present embodiment, a region is provided in which the wiring 15 electrically connected to the control gate 1 is disposed between the wiring 100 and the diffusion layer 8 in a region in which the wiring 100 and the diffusion layer 8 face each other. Therefore, the charge, which is generated when the shape of the wiring 100 is processed or when the wiring layer is formed (when the metal serving as the material is deposited) and which moves toward the semiconductor substrate 14 via the interlayer insulating film 27, is captured by the wiring 15, and the amount of the charges, which reach the silicon nitride film 401 formed above the diffusion layer 8, may be greatly reduced. Therefore, even when the disposition or the shape of the wiring 100 is changed, the variation in the resistance of the diffusion layer 8 may be reduced. That is, as compared with the comparative example, it is possible to prevent the decrease in the current driving capability of the transistor due to the increase in the resistance of the diffusion layer 8, and it is possible to prevent the deterioration in the bonding breakdown voltage of the transistor due to the decrease in the resistance of the diffusion layer 8.

In addition, in the present embodiment, since the wiring 15 electrically connected to the control gate 1 is continuously extended from the upper portion of the control gate 1 to the upper portion of the diffusion layer 8, the resistance value variation of the diffusion layer 8 in the vicinity of the end of the control gate 1 may be reduced as compared with a case where the wiring 15 is not formed on the upper portion of the diffusion layer 8 as in the comparative example. In addition, the diffusion layer 8 in the vicinity of the end of the control gate 1 is the region that is easily affected by the depletion due to the change in the voltage applied to the control gate 1, and the threshold value and the current driving capability of the transistor are easily varied. On the other hand, in the present embodiment, since the wiring 15 electrically connected to the control gate 1 is continuously extended from the upper portion of the control gate 1 to the upper portion of the diffusion layer 8, the variation in the threshold value and the current driving capability of the transistor may also be reduced.

It should be noted that, in the above description, it has been described that, according to the structure of the high voltage switch of the present embodiment, the resistance value of the diffusion layer 8 may be prevented from varying due to the charge generated when the wiring 100 is formed in the second wiring layer. However, it is needless to say that the resistance value variation of the diffusion layer 8 due to the charge generated when the wiring layer above the second wiring layer is formed may also be prevented.

Figure 15:
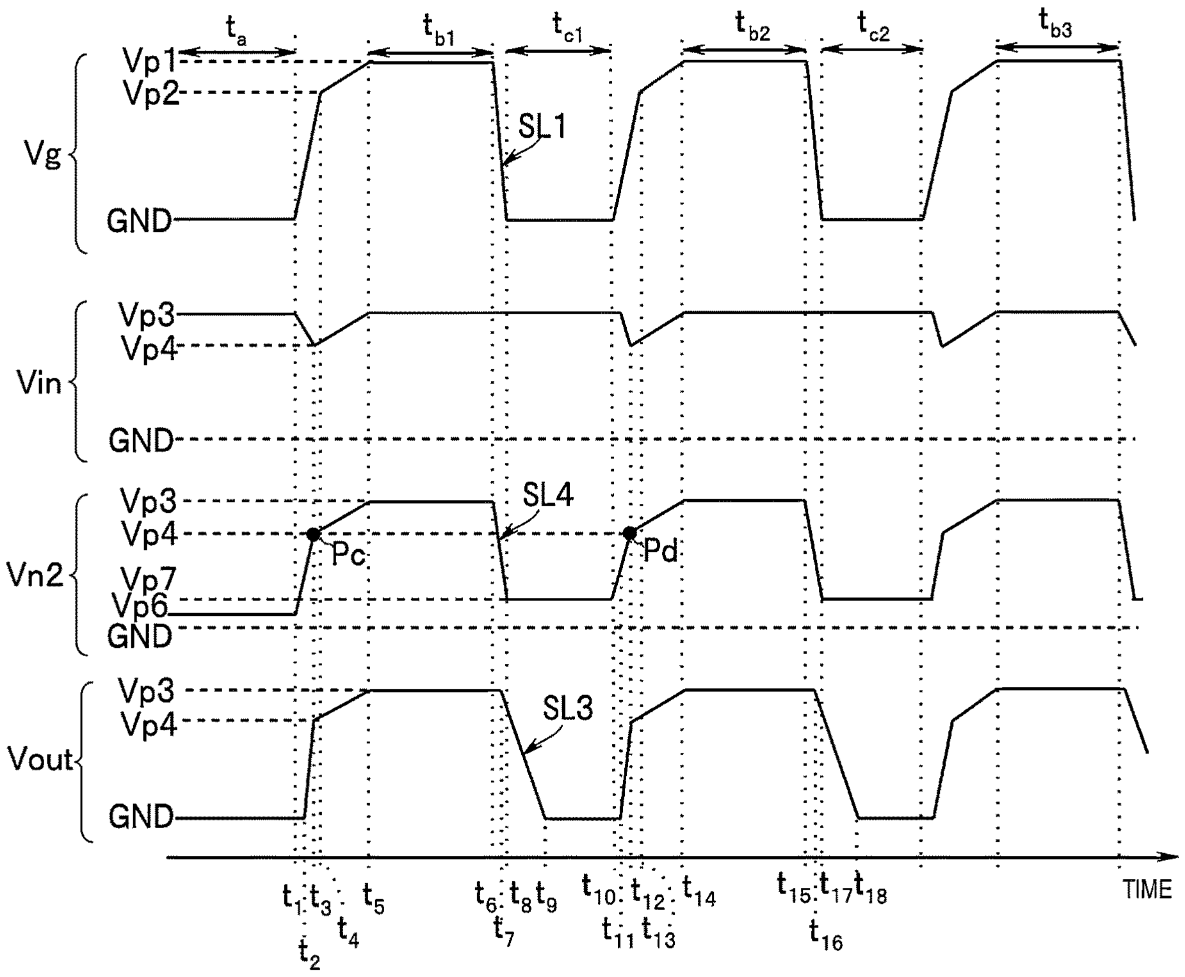
FIG. 15 is a diagram schematically showing an example of a voltage waveform when a switch operates according to the first embodiment.

Next, an operation of the high voltage switch of the present embodiment will be described. FIG. 15 is a diagram schematically showing an example of a voltage waveform when a switch operates according to the first embodiment. As shown in FIG. 4, the circuit of the high voltage switch of the present embodiment is the same as the circuit of the high voltage switch shown in the comparative example, but the structure of the high voltage switch is different from the structure of the high voltage switch of the comparative example. Therefore, the voltage waveform of the high voltage switch of the present embodiment shown in FIG. 15 is different from the voltage waveform of the high voltage switch of the comparative example shown in FIG. 5.

FIG. 15 shows waveforms of a gate voltage Vg, an input voltage Vin, a node N2 voltage Vn2, and an output voltage Vout in order on a paper surface. In addition, each of the waveforms has a vertical axis of voltage and a horizontal axis of time. FIG. 15 is a voltage waveform in the same sequence as the switch operation when acquiring the voltage waveform of the comparative example shown in FIG. 5. That is, FIG. 15 shows a voltage waveform in a sequence in which a voltage Vp3 applied to the input terminal Tin is transferred to the output terminal Tout three times and is discharged twice between each transfer. In FIG. 15 as well, the voltage Vp3 is set to a voltage of 15 V or more and 30 V or less, as in the comparative example shown in FIG. 5. For example, the voltage Vp1 applied to the terminal Tg is a voltage of 17 V or more and 35 V or less.

Since the node N2 does not have a terminal to which a voltage is applied from the outside, the current from the other terminal or the voltage is determined by the capacitive coupling, but the voltage in the initial state in the period $t_a$ and the voltage in the periods $t_{c1}$ and $t_{c2}$ are different from each other due to the charges accumulated before that. The details of the operation will be described below.

First, a GND voltage of 0 V is applied as the gate voltage Vg during an initial state period (period $t_a$). During this period, the output voltage Vout is also the GND voltage. Further, a voltage of 15 V or more and 30 V or less, which is a voltage Vp3, is applied to the input voltage Vin. In addition, the threshold value voltage Vth1 of the D-type transistor TR1 is, for example, a value equal to or lower than 0 V and equal to or higher than −4 V, and is a depletion type MOSFET. On the other hand, the threshold value voltage Vth2 of the E-type transistor TR2 is, for example, a value higher than 0 V and equal to or less than 3 V, and is an enhancement type MOSFET. Therefore, from the relationship between the gate voltage Vg, the input voltage Vin, the node N2 voltage Vn2, and the output voltage Vout, the D-type transistor TR1 and the E-type transistor TR2 are in a blocked state in the initial state period. The node N2 is at a voltage of −Vth1 (=voltage Vp6) in the initial state. The voltage Vp6 is sufficiently lower than the voltage Vp3, lowers the drain voltage of the E-type transistor TR2, and prevents the reliability of the E-type transistor TR2 from deteriorating due to the application of the drain voltage.

Then, the gate voltage Vg is raised from a timing of time $t_1$ to bring the D-type transistor TR1 into a conductive state. Although FIG. 15 shows a case where the ramp voltage is applied from time $t_1$ to time $t_4$, as the gate voltage Vg rises, the node N2 voltage Vn2 rises to a voltage of Vg-Vth1. Then, when the gate voltage Vg is higher than the threshold value voltage Vth2 at a timing of time $t_2$, the E-type transistor TR2 enters a conductive state, and the output voltage Vout rises above the GND voltage. During a period from time $t_2$ to time $t_4$, a current flows between the drain electrode and the source electrode of the E-type transistor TR2, and the output voltage Vout is charged.

The high voltage switch of the present embodiment has a structure different from the high voltage switch of the comparative example. Specifically, when viewed from the Z direction, the wiring 15 electrically connected to the control gate 1 has a region that superimposes with at least a part of the diffusion layer 8 formed on both sides of the control gate 1 in the X direction. Since the node N2 includes the diffusion layer 8, the node N2 voltage Vn2 rises due to the capacitive coupling between the wiring 15 and the diffusion layer 8 as the gate voltage Vg rises. Therefore, in the comparative example shown in FIG. 5, the node N2 voltage Vn2 is raised from the voltage Vp6 to the voltage Vp4 between time $t_1$ and time $t_4$, but in the present embodiment shown in FIG. 15, the node N2 voltage Vn2 is raised from the voltage Vp6 to the voltage Vp4 between time $t_1$ and time $t_3$. That is, the node N2 voltage Vn2 may be raised in a shorter time than in the comparative example. At this time, since the supply capacity of each voltage generation circuit of the voltage source circuit group 120 is finite, the voltage (input voltage Vin) on the input terminal Tin side decreases from the voltage Vp3 to the voltage Vp4 in order to charge the wiring capacitance on the output terminal Tout side. Here, the voltage Vp4 is a voltage lower than the voltage Vp3, for example, in a range of 0.2 V to 3 V.

At this time, since the gate voltage is raised in a state in which the drain voltage is applied, hot carriers are generated in the E-type transistor TR2, and the threshold value voltage Vth2 is varied in the rising direction. Here, in the same voltage stress, the shorter the transition time of the drain voltage and the gate voltage, the smaller the hot carrier degradation. As described above, in the present embodiment, the transition time is between the time $t_2$ and the time $t_3$, and in the comparative example, the transition time is between the time $t_2$ and the time $t_4$. That is, since the transition time of the embodiment is shorter than that of the comparative example, the hot carrier degradation at the time of the initial pulse voltage rising may be reduced.

Then, in a period from time $t_4$ to time $t_5$, the D-type transistor TR1 and the E-type transistor TR2 are in a conductive state in a voltage range from the voltage Vp4 to the voltage Vp3, so that the input voltage Vin is transferred to the output voltage Vout. At this time, the voltage difference between the input voltage Vin and the node N2 voltage Vn2, and the voltage difference between the node N2 voltage Vn2 and the output voltage Vout are smaller than the voltage difference from the time $t_1$ to the time $t_3$, and the generation of the hot carrier is reduced.

Subsequently, a timing for blocking the D-type transistor TR1 and the E-type transistor TR2 is shown. At a timing from time $t_6$ to time $t_8$, the gate voltage Vg decreases from the voltage Vp1 to the GND voltage. The node N2 voltage Vn2 also decreases from time $t_6$ to time $t_8$ due to the capacitive coupling between the gate electrode connected to the terminal Tg and the node N2. Here, in the high voltage switch of the present embodiment, the wiring 15 electrically connected to the control gate 1 covers at least a part of the diffusion layer 8. Since the node N2 includes the diffusion layer 8, the node N2 voltage Vn2 decreases due to the capacitive coupling between the wiring 15 and the diffusion layer 8 as the gate voltage Vg decreases. Therefore, in the comparative example shown in FIG. 5, the node N2 voltage Vn2 is decreased from the voltage Vp3 to the voltage Vp5 between time $t_6$ and time $t_8$, but in the present embodiment shown in FIG. 15, the node N2 voltage Vn2 decreases from the voltage Vp3 to the voltage Vp7 (<voltage Vp5) between time $t_6$ and time $t_8$. When the degree of decrease in the voltage at this time with respect to time is set as a slope SL4, the slope SL4 is larger than the slope SL2 of the comparative example shown in FIG. 5.

The node N2 has a capacitance between the gate electrode and the substrate electrode (semiconductor substrate 14) on which the D-type transistor TR1 and the E-type transistor TR2 are formed, and thus the slope SL4 has a gentler voltage inclination than the slope SL1. That is, since a decrease ratio of the gate voltage Vg is larger than a decrease ratio of the node N2 voltage Vn2 per unit time, the gate voltage Vg is on the negative side with respect to the node N2 voltage Vn2. Therefore, the D-type transistor TR1 and the E-type transistor TR2 transition from the voltage transfer state to the blocked state at a higher speed because the current driving capability is reduced compared to the voltage transfer state in the period $t_{b1}$. At a timing from time $t_6$ to time $t_7$, it is changed that the gate voltage Vg<the node N2 voltage Vn2−the threshold value voltage Vth1 in the D-type transistor TR1, and the D-type transistor TR1 is changed to the blocked state from the conductive state. At this time, since the output voltage Vout is maintained at the voltage Vp3, it changed that the gate voltage Vg<the node N2 voltage Vn2+the threshold value voltage Vth2 and the gate voltage Vg<output voltage Vout, and the slope SL1−the slope SL4 is satisfied, the E-type transistor TR2 is also changed to blocked state.

Subsequently, at a timing from time $t_7$ to time $t_8$ after the D-type transistor TR1 and the E-type transistor TR2 are in the blocked state, the gate voltage Vg decreases. Therefore, the node N2 voltage Vn2 decreases to the voltage Vp7 due to the capacitive coupling between the gate electrode connected to the terminal Tg and the node N2. Here, in a period from time $t_7$ and time $t_9$, the switch S1 is in a conductive state, and the output voltage Vout is discharged to GND. At least in a range from time $t_7$ to time $t_8$, the slope SL3, which is an inclination of the voltage drop of the discharge, has a gentler voltage inclination than the slope SL4. The reason why the slope SL3 has the gentler voltage inclination than the slope SL4 is that the wiring capacitance connected to the output terminal Tout is larger than the capacitance of the gate wiring and the capacitance of the node N2, and the discharge takes time. Therefore, in a period from time $t_7$ to time $t_9$, both the D-type transistor TR1 and the E-type transistor TR2 are maintained in the blocked state, so that the charge accumulated in the node N2 is maintained, and the node N2 voltage Vn2 is maintained when the voltage is dropped to the voltage Vp7. The voltage Vp7 is a voltage, for example, lower than the voltage Vp5 by 1 V or more, lower than the voltage Vp3 by 5 V or more, and equal to or higher than the voltage Vp6 (=−Vth1).

In the present embodiment, the voltage Vp7 is close to the voltage Vp6, so that the difference between the node N2 voltage Vn2 in the period $t_a$, which is the initial state period, and the node N2 voltage Vn2 in the periods $t_{c1}$ and $t_{c2}$ after the second or subsequent pulses are applied is smaller than those differences in the comparative example. Therefore, the problem observed in the comparative example, that is, the problem that the hot carrier is likely to be generated when the gate voltage Vg rises and the reliability deteriorates due to the rise of the node N2 voltage Vn2 at the periods $t_{c1}$ and $t_{c2}$ than the initial state period, and the problem that the reliability deteriorates due to the voltage being applied to the drain electrode of the E-type transistor TR2 at the periods $t_{c1}$ and $t_{c2}$ may be reduced.

In the present embodiment, when the node N2 voltage Vn2 at the first pulse timing (=time $t_3$) and the second pulse timing (=time $t_{12}$) at which the gate voltage Vg is equal to each other is compared, both are substantially equal to each other (refer to points Pc and Pd indicated by black circles in FIG. 15). That is, as compared with the comparative example shown in FIG. 5, the rising amount in the node N2 voltage Vn2 voltage at the second pulse timing may be reduced compared to the first pulse timing. At this time, since the gate voltage Vg and the output voltage Vout are the same, the amount of hot carriers generated from the time $t_{10}$ to the time $t_{13}$, which is the second pulse timing, may be reduced as compared with the comparative example, so that the deterioration in reliability may be reduced.

In addition, from time $t_6$ to time $t_8$, as described above, the D-type transistor TR1 and the E-type transistor TR2 transition from the voltage transfer state to the blocked state at a higher speed because the current driving capability is reduced compared to the voltage transfer state in the period $t_{b1}$. In the same voltage stress, the shorter the transition time of the drain voltage and the gate voltage, the smaller the hot carrier degradation. Therefore, the high voltage switch of the present embodiment may prevent the reliability of the D-type transistor TR1 and the E-type transistor TR2 from deteriorating due to the generation of hot carriers during the voltage drop from time $t_6$ to time $t_8$ as compared with the comparative example. In the period $t_{c1}$, the verify operation is performed by changing the switch S1 from the conductive state to the blocked state.

The operation from the time $t_{12}$ to the time $t_{18}$ is the same as the operation from the time $t_3$ to the time to, and thus the description thereof is omitted. However, by repeating the transfer operation and the block operation of the voltage Vp3, there is a possibility that the hot carrier may be generated from the second time to the third time as compared with the first time of the rising in the initial state. However, since the amount of hot carriers generated may be reduced as compared with the comparative example, the deterioration in the reliability of the D-type transistor TR1 and the E-type transistor TR2 may be reduced.

In the high voltage switch as shown in the comparative example, in order to improve the deterioration of the reliability due to the hot carrier, for example, a measure such as increasing the gate length of the E-type transistor TR2 is considered. However, since the current driving capability per unit channel width is reduced as the gate length is increased, it is necessary to increase the channel width in order to ensure the current driving capability of the entire circuit, and there is a problem that the circuit area is increased. On the other hand, according to the high voltage switch of the present embodiment, the reliability deterioration due to the generation of the hot carrier may be reduced without increasing the gate length of the E-type transistor TR2, and it is not necessary to increase the channel width in order to ensure the current driving amount. Therefore, the reliability may be improved without increasing the circuit area.

In addition, in the embodiment, the resistance of the diffusion layer 8 may be reduced as compared with the comparative example by the capacitive coupling between the wiring 15 and the diffusion layer 8 in each of the periods $t_{b1}$, $t_{b2}$, and $t_{b3}$ in which the input voltage Vin is transferred to the output voltage Vout. Therefore, it is possible to achieve a higher current driving capability. On the other hand, during the periods $t_{c1}$ and $t_{c2}$ in which the input voltage Vin is not transferred to the output voltage Vout, the node N2 voltage Vn2 may be reduced as compared with the comparative example by the capacitive coupling between the wiring 15 and the diffusion layer 8. Thereby, the leakage current between the source electrode and the drain electrode of the E-type transistor TR2 may be reduced to approximately the same as the period $t_a$, which is the initial state period. Therefore, the influence of the variation in the leakage current between the initial pulse (first pulse) and the repeated pulse (second or subsequent pulses) in the circuit connected to the output terminal Tout may be reduced.

Further, in the structure of the high voltage switch in the present embodiment, a region is provided in which the wiring 15 electrically connected to the control gate 1 is disposed between the wiring 100 and the diffusion layer 8 in a region where the wiring 100 and the diffusion layer 8 face each other (for example, refer to FIG. 12D). When the voltage of the wiring facing the diffusion layer 8 is lowered without the conductor, the voltage that is inversely proportional to the distance between the wiring and the diffusion layer 8 affects the diffusion layer 8 from the wiring. As shown in FIG. 12D, in the present embodiment, the structure that the silicon oxide film 400, the silicon nitride film 401, the interlayer insulating film 27, and the wiring 15 are stacked in this order on the diffusion layer 8 is provided. This structure is a so-called metal-oxide-nitride-oxide-silicon (MONOS) structure when the wiring 15 is regarded as a gate electrode and the diffusion layer 8 is regarded as a semiconductor in which the electron concentration varies. Therefore, by providing the wiring 15 between the diffusion layer 8 and the wiring 100, the influence of the voltage fluctuation of the wiring 100 is reduced, and the decrease in the electron density of the diffusion layer 8, the depletion, and the resistance variation caused thereby may be reduced. As the wiring 100, a case is assumed that the wiring 100 is not electrically connected to the high voltage switch shown in FIG. 4 and is applied with a voltage different from the voltage used in the high voltage switch (for example, a case where the wiring 100 is a so-called through wiring that transfers a voltage from a voltage source to a voltage use site). Even when the voltage of the wiring 100 varies according to the signal passing through the wiring 100, the influence of the variation on the diffusion layer 8 may be reduced by the wiring 15. In addition, even when the voltage of the wiring 100 is reduced to, for example, the GND voltage (0 V), the resistance variation of the diffusion layer 8 may be reduced, and the driving force of the transistor may be maintained.

Further, by connecting the wiring 15 to the control gate 1, the reliability and characteristics of the transistor used for the high voltage switch may be improved without requiring additional power supplies, wirings, and the like.

Modification Example of First Embodiment

Next, a modification example of the first embodiment described above will be described. In the semiconductor device of the present modification example, the structures of the D-type transistors TR1 and the E-type transistors TR2 of the high voltage switch are different from those of the first embodiment described above. Since the circuit configuration and the switch operation of the high voltage switch are the same as those of the first embodiment described above, the description thereof will be omitted. Hereinafter, points different from the first embodiment will be described.

Figure 16:
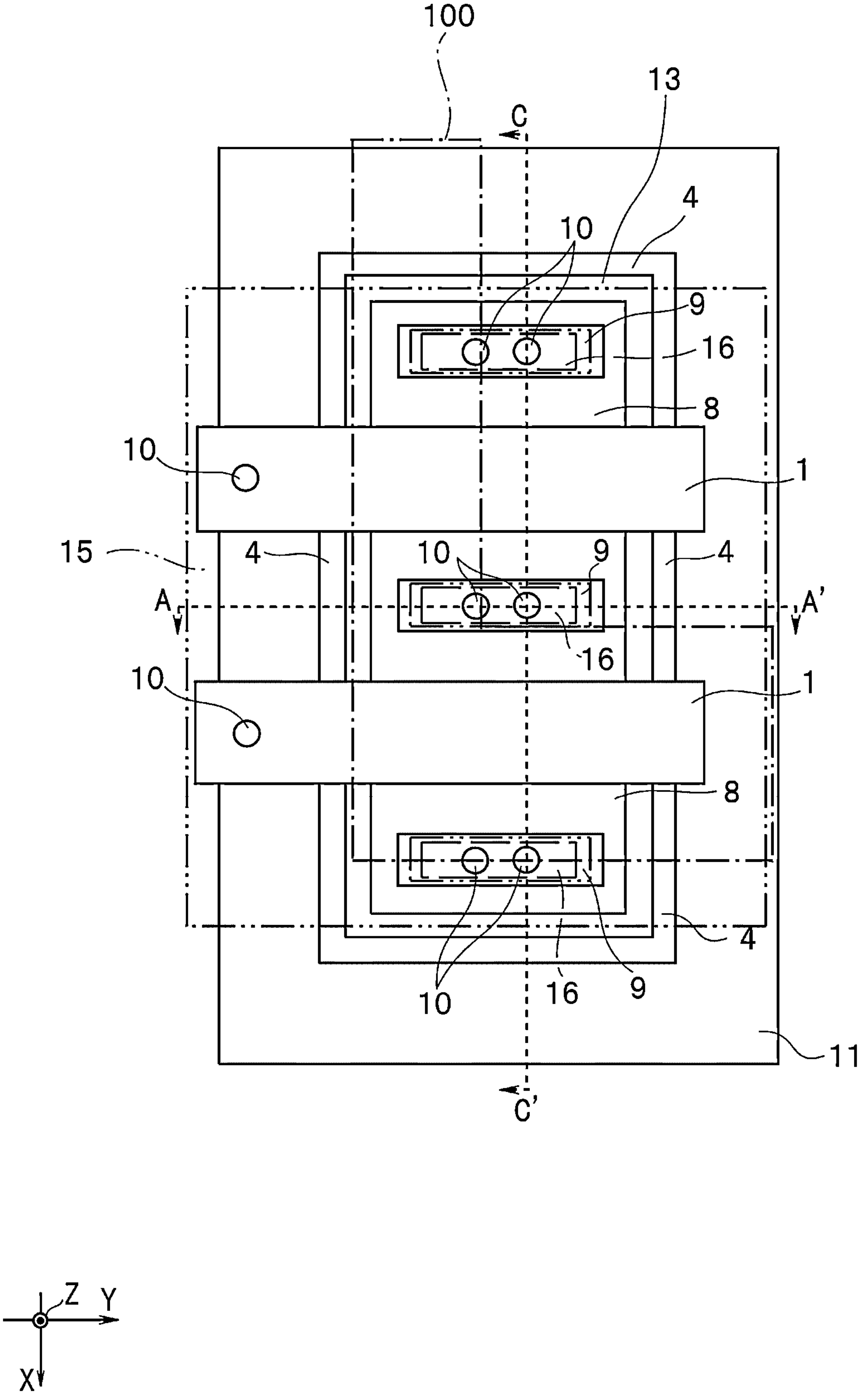
FIG. 16 is a plan view describing an example of a structure of the E-type transistor TR2 in a modification example of the first embodiment.
Figure 18:
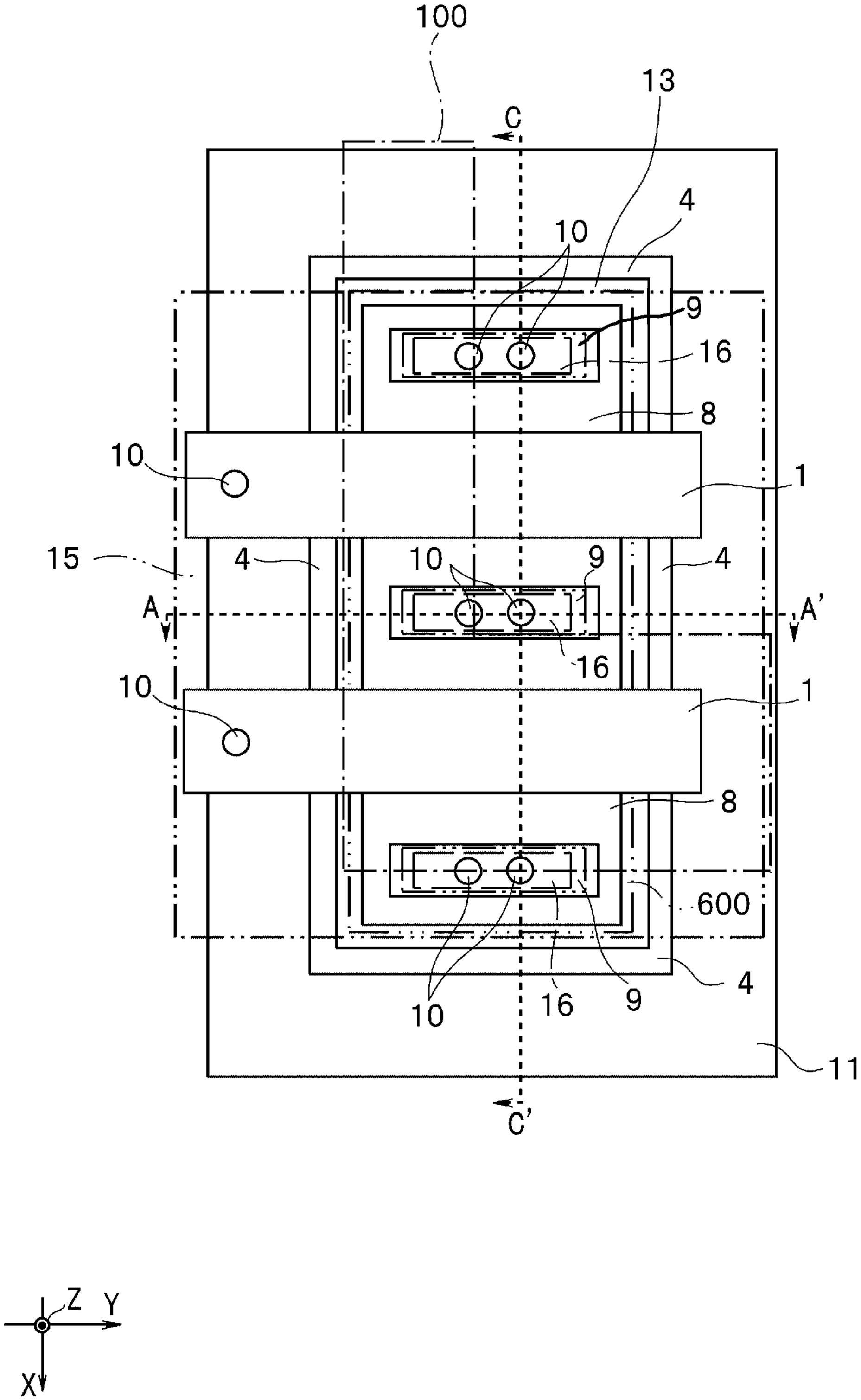
FIG. 18 is a plan view describing an example of a structure of a D-type transistor TR1 according to the modification example of the first embodiment.

FIG. 16 is a plan view describing an example of a structure of the E-type transistor TR2 in a modification example of the first embodiment. FIG. 18 is a plan view describing an example of a structure of the D-type transistor TR1 according to the modification example of the first embodiment.

Figure 17A:
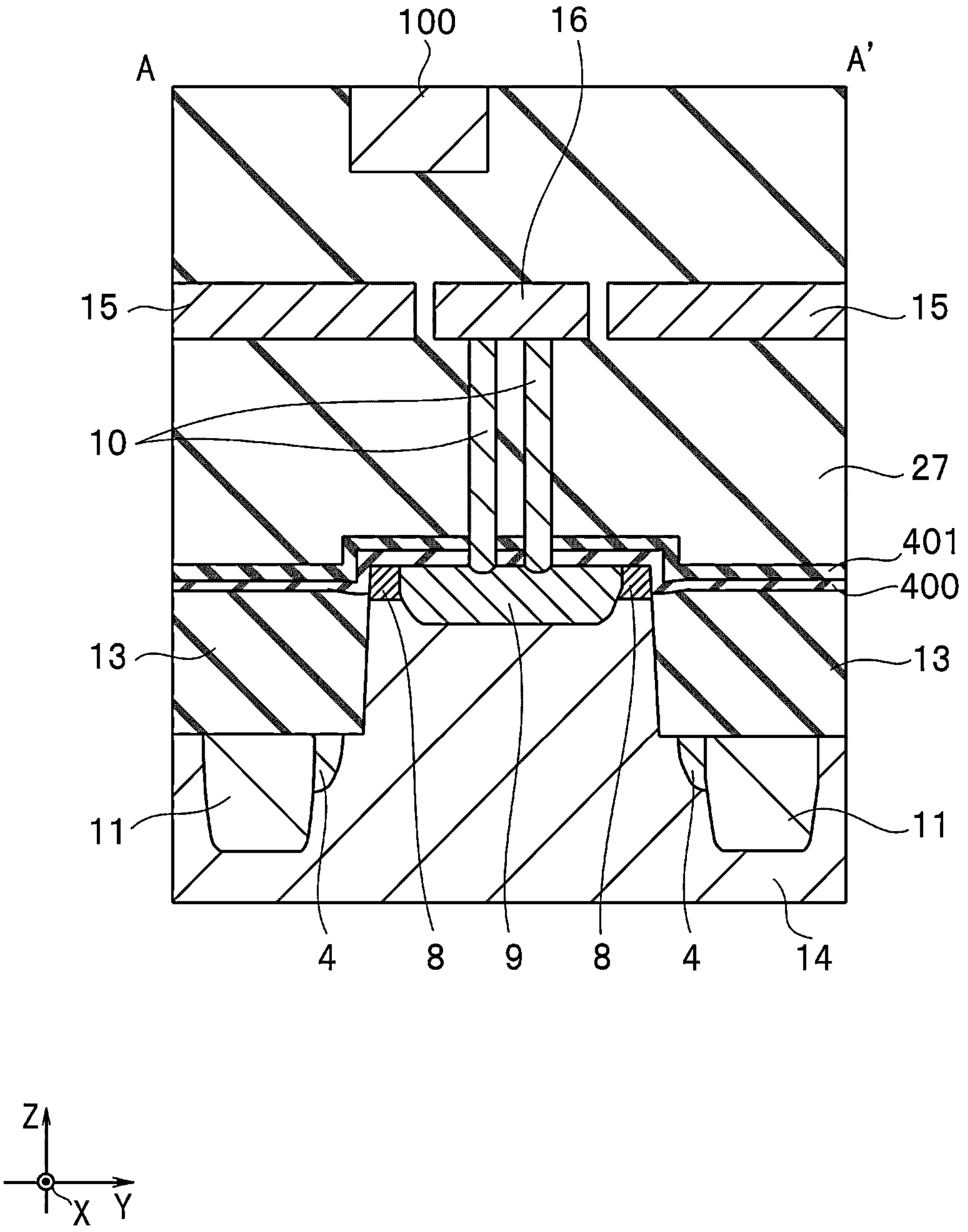
FIG. 17A shows a cross-sectional view taken along line A-A' shown in FIG. 16.
Figure 17B:
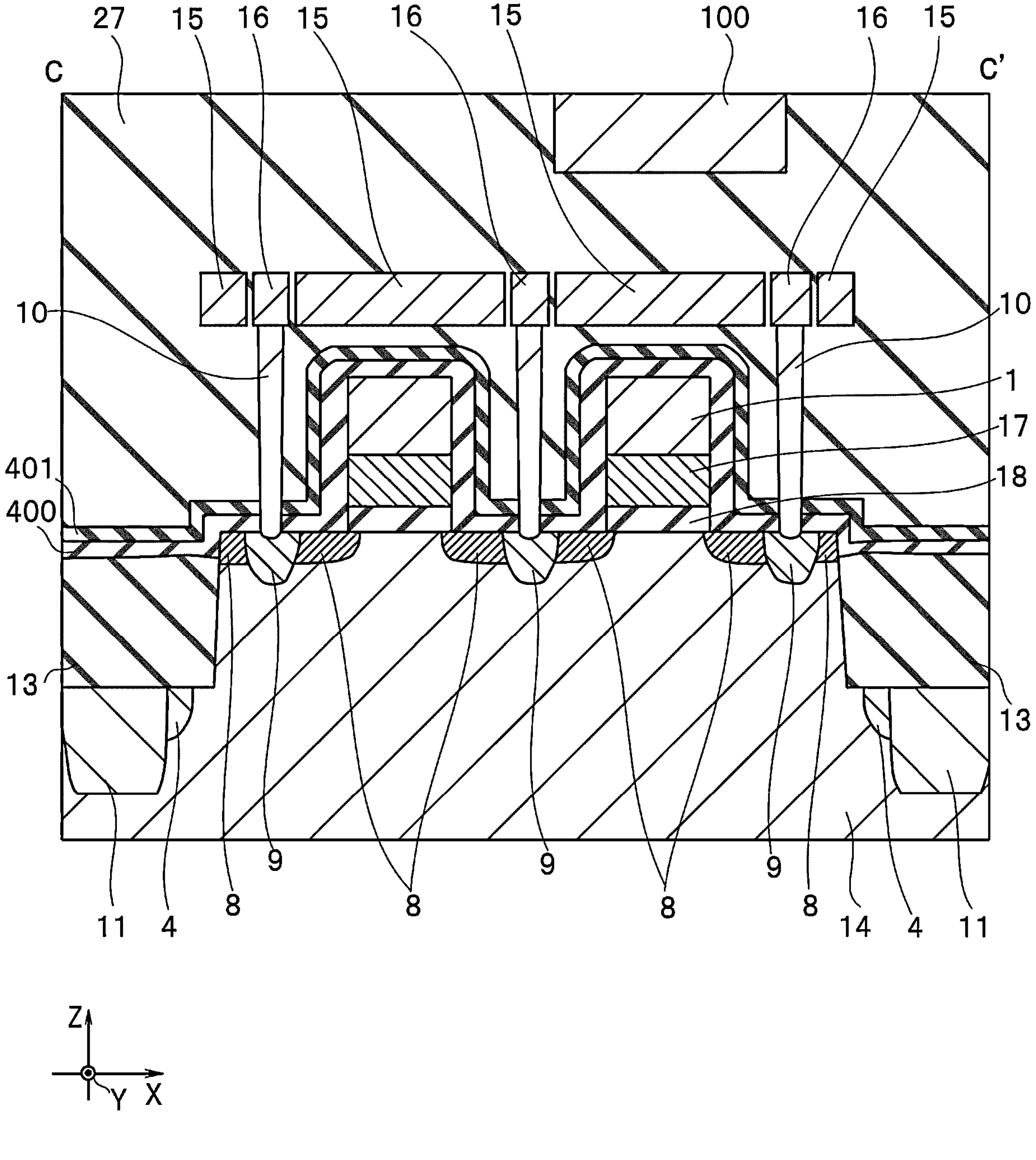
FIG. 17B shows a cross-sectional view taken along line C-C' shown in FIG. 16.
Figure 19A:
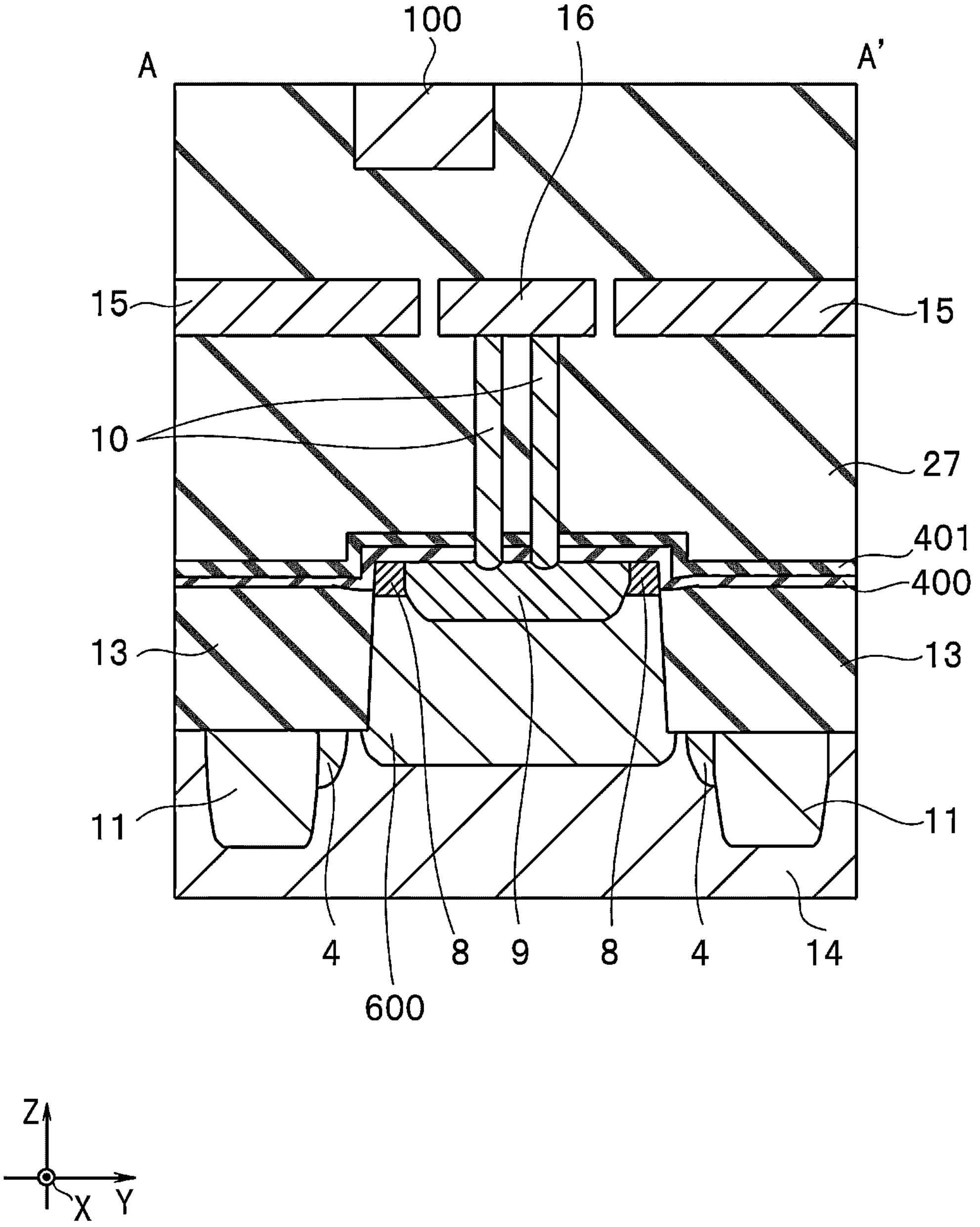
FIG. 19A shows a cross-sectional view taken along line A-A' shown in FIG. 18.
Figure 19B:
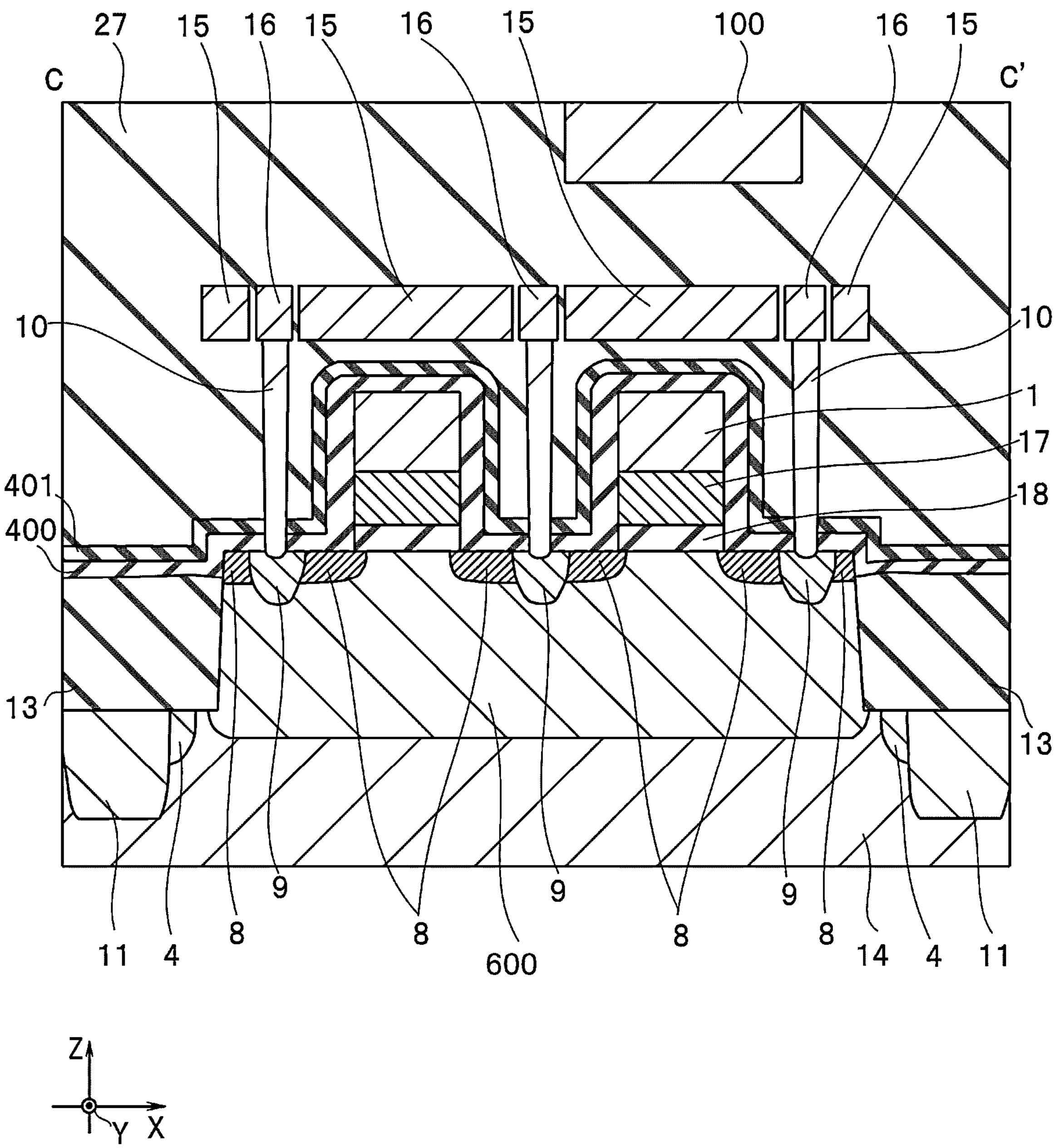
FIG. 19B shows a cross-sectional view taken along line C-C' shown in FIG. 18.

FIG. 17A shows a cross-sectional view taken along line A-A' shown in FIG. 16. FIG. 17B shows a cross-sectional view taken along line C-C' shown in FIG. 16. FIG. 19A shows a cross-sectional view taken along line A-A' shown in FIG. 18. FIG. 19B shows a cross-sectional view taken along line C-C' shown in FIG. 18.

FIGS. 16 and 18 show a planar structure on a lower side of the contact plug 10 and a first wiring layer and a second wiring layer among a plurality of wiring layers formed on an upper side of the contact plug 10, and the other wiring layers are omitted. A wiring 15 indicated by a double-dotted line and a wiring 16 indicated by a broken line are disposed in the first wiring layer. A wiring 100 indicated by a one-dotted line is disposed in the second wiring layer. The first wiring layer is formed between the second wiring layer and the semiconductor substrate 14.

A characteristic structure of the present modification example is a shape and a disposition of the wiring 15 connected to the control gate 1. As shown in FIGS. 17B and 19B, the length of the wiring 15 in the X direction is longer than the length of the control gate 1 in the X direction. In addition, an end portion of the wiring 15 on one side (left side of the paper surface) in the X direction is disposed on the left side with respect to an end portion of the control gate 1 on one side in the X direction, and an end portion of the wiring 15 on the other side (right side of the paper surface) in the X direction is disposed on the right side with respect to an end portion of the control gate 1 on the other side in the X direction. That is, the end portion of the wiring 15 on one side in the X direction is located above the diffusion layer 9 disposed on one side of the control gate 1 in the X direction, and the end portion of the wiring 15 on the other side in the X direction is located above the diffusion layer 9 disposed on the other side of the control gate 1 in the X direction. The pair of diffusion layers 9 disposed on both sides of the control gate 1 in the X direction correspond to a second source diffusion layer and a second drain diffusion layer. It is preferable that the distance between the end portion of the wiring 15 on one side in the X direction and the end portion of the control gate 1 on one side in the X direction, and the distance between the end portion of the wiring 15 on the other side in the X direction and the end portion of the control gate 1 on the other side in the X direction are each at least 0.1 μm or more.

Further, as shown in FIGS. 17A and 19A, the end portion of the wiring 15 is located above the diffusion layer 9 in the Y direction. That is, according to the present modification example, the wiring 15 completely covers the region above the diffusion layer 8. In other words, in the present modification example, the wiring 15 is always formed between the diffusion layer 8 and the wiring 100. The concentration of the n-type impurity in the diffusion layer 9 is higher than that in the diffusion layer 8, and the diffusion layer 9 is less likely to be depleted. When the wiring 100 is used, for example, as a through-signal wiring, the depletion of the diffusion layer 8 may be prevented even when the voltage of the wiring 100 located above the diffusion layer 8 varies. Therefore, it is possible to further reduce the deterioration in reliability, such as variations in the threshold value and the current driving capability of the transistor.

In the structure of the present embodiment, the wiring 15 electrically connected to the control gate 1 is disposed between the wiring 100 and the diffusion layer 8 in the entire region in which the wiring 100 and the diffusion layer 8 face each other. Therefore, the charge, which is generated when the shape of the wiring 100 is processed or when the wiring layer is formed (when the metal serving as the material is deposited) and which moves toward the semiconductor substrate 14 via the interlayer insulating film 27, is captured by the wiring 15, and the amount of the charges, which reach the silicon nitride film 401 formed above the diffusion layer 8, may be greatly reduced. Therefore, even when the disposition or the shape of the wiring 100 is changed, the variation in the resistance of the diffusion layer 8 may be reduced. That is, the decrease in the current driving capability of the transistor due to the rise in the resistance of the diffusion layer 8 may be further reduced as compared with the first embodiment. In addition, the deterioration of the bonding breakdown voltage of the transistor due to the decrease in the resistance of the diffusion layer 8 may be further reduced.

Figure 20:
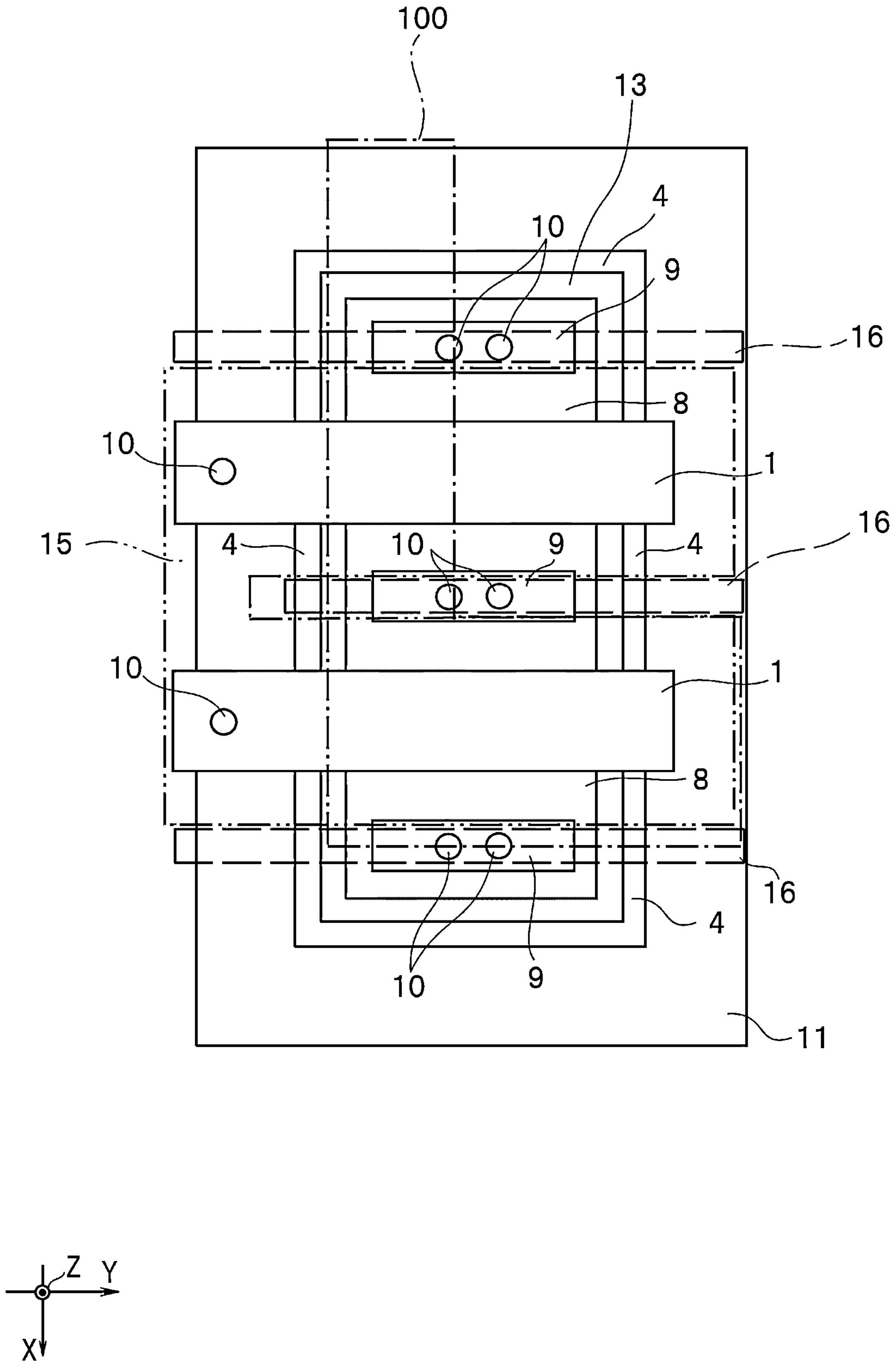
FIG. 20 is a plan view describing an example of a structure of the E-type transistor TR2 according to another modification example of the first embodiment.
Figure 21:
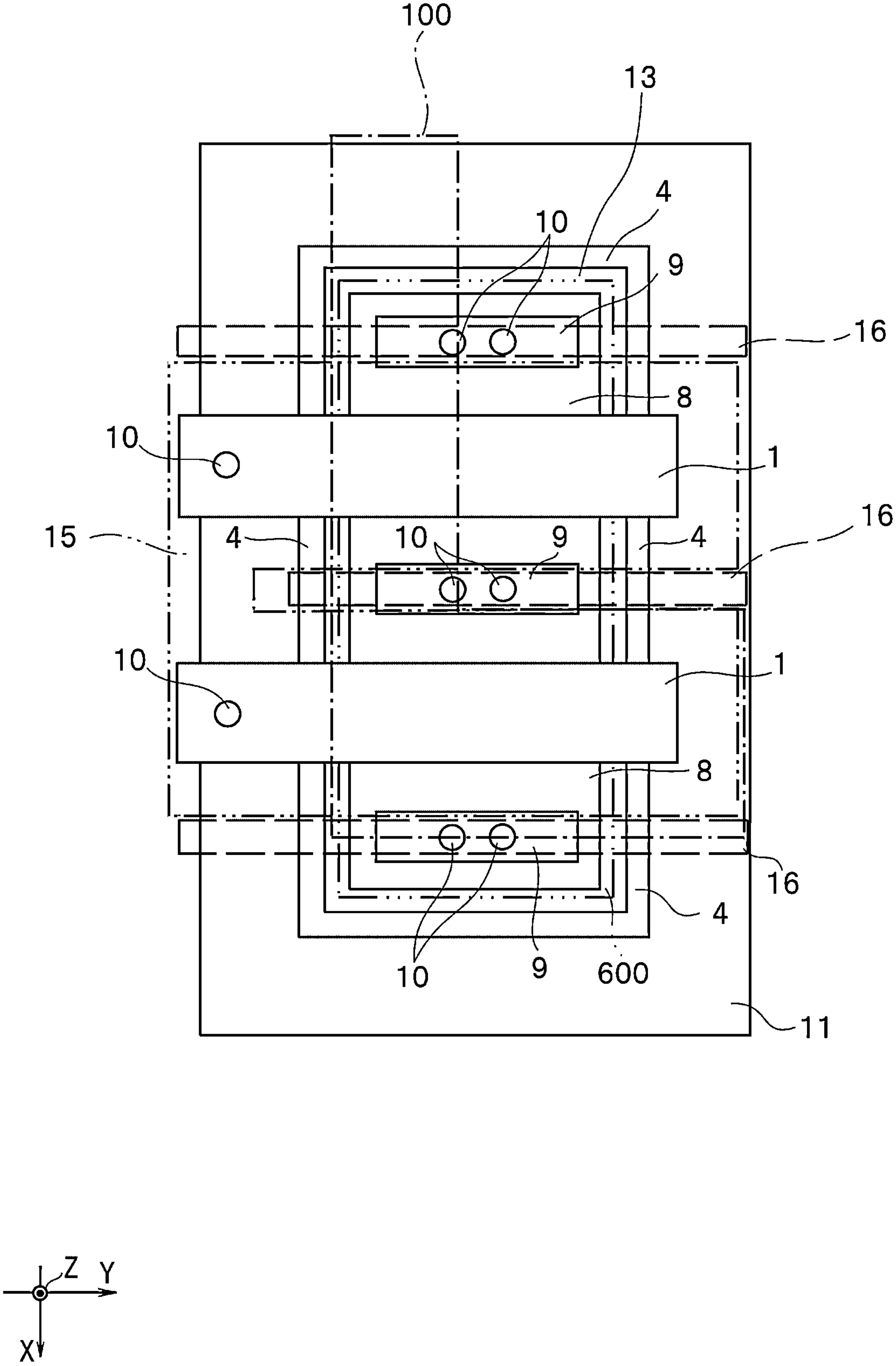
FIG. 21 is a plan view describing an example of a structure of the D-type transistor TR1 according to another modification example of the first embodiment.

In the above-described modification example, the wiring 15 covers the upper side of the entire region of the diffusion layer 8. However, for example, as shown in FIGS. 20 and 21, the wiring 15 may cover the portion region of the diffusion layer 8 located between the control gate 1 and the diffusion layer 9 at least in the X direction. FIG. 20 is a plan view describing an example of a structure of the E-type transistor TR2 according to another modification example of the first embodiment. FIG. 21 is a plan view describing an example of a structure of the D-type transistor TR1 according to another modification example of the first embodiment. In this case, since the influence of the upper layer wiring such as the wiring 100 on the region above which the drain current and the source current of the transistor mainly flow may be reduced by the wiring 15, the reliability and characteristics of the transistor may be improved more than in the first embodiment.

Second Embodiment

Next, a second embodiment will be described. In the semiconductor device of the present embodiment, the structure of the E-type transistor TR2 of the high voltage switch is different from the first embodiment described above. Since the circuit configuration and the switch operation of the high voltage switch and the structure of the D-type transistor TR1 are the same as those in the first embodiment described above, the description thereof will be omitted. Hereinafter, points different from the first embodiment will be described.

Figure 22:
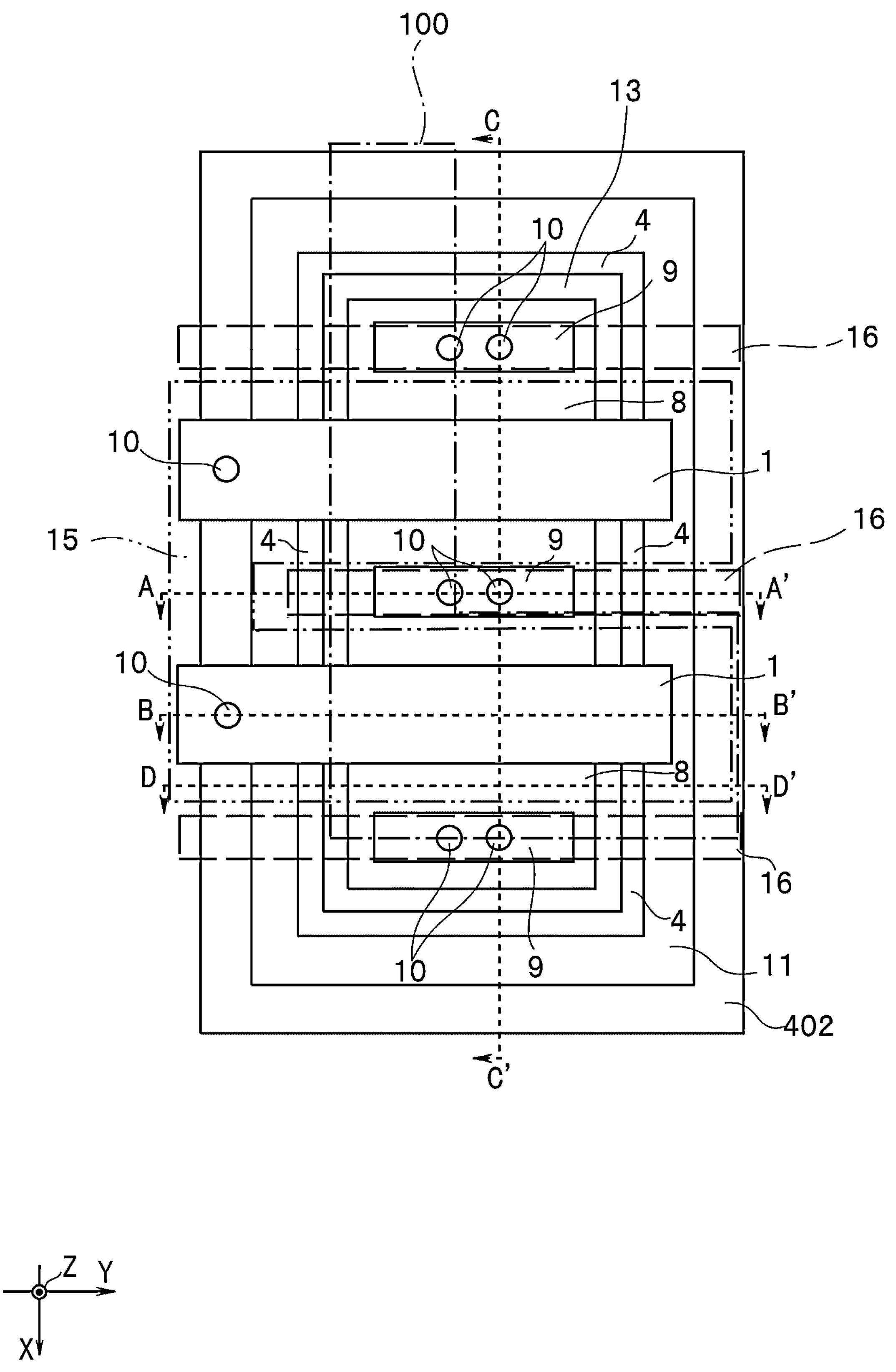
FIG. 22 is a plan view describing an example of a structure of the E-type transistor TR2 according to a second embodiment.
Figure 23A:
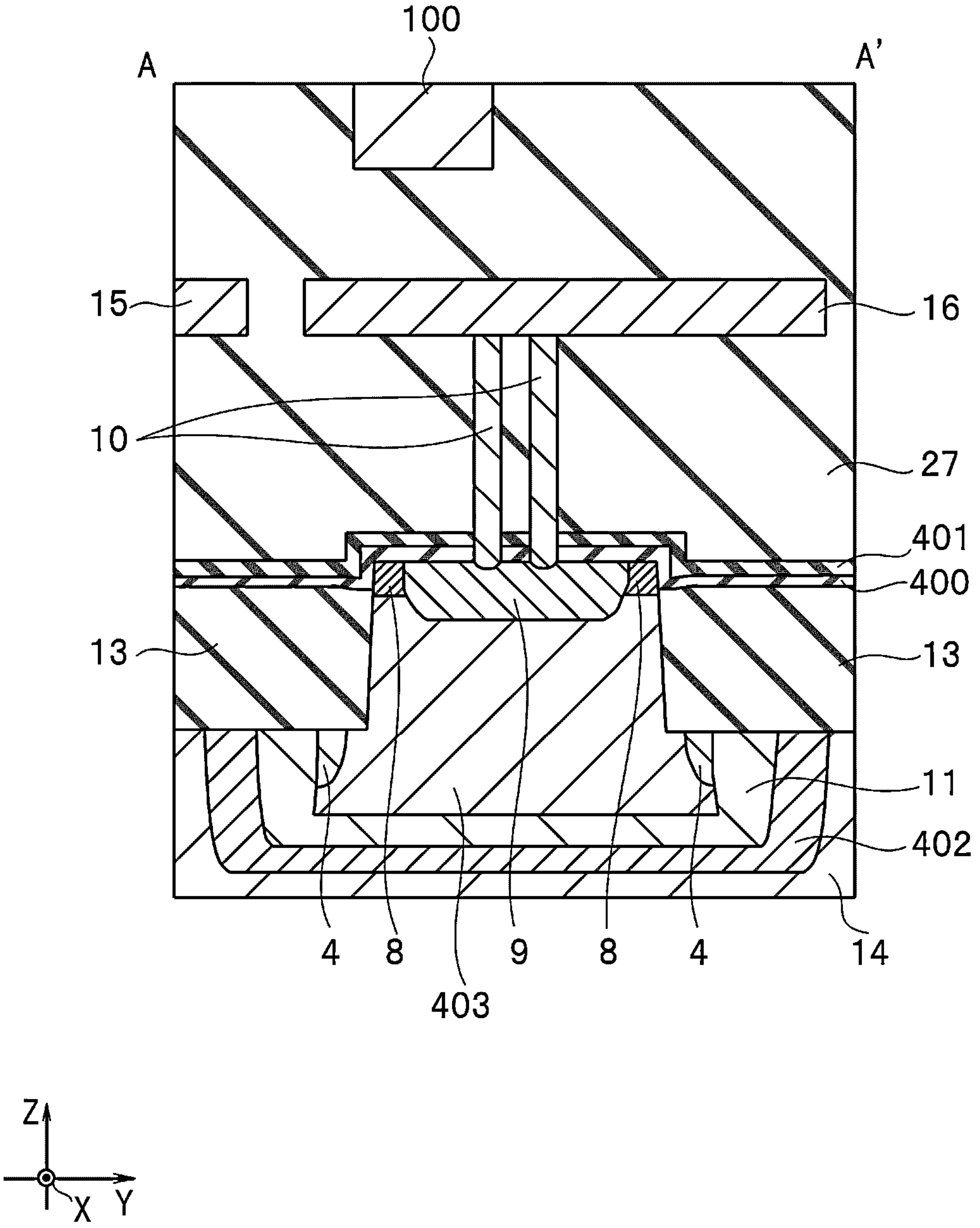
FIG. 23A shows a cross-sectional view taken along line A-A' shown in FIG. 22.
Figure 23B:
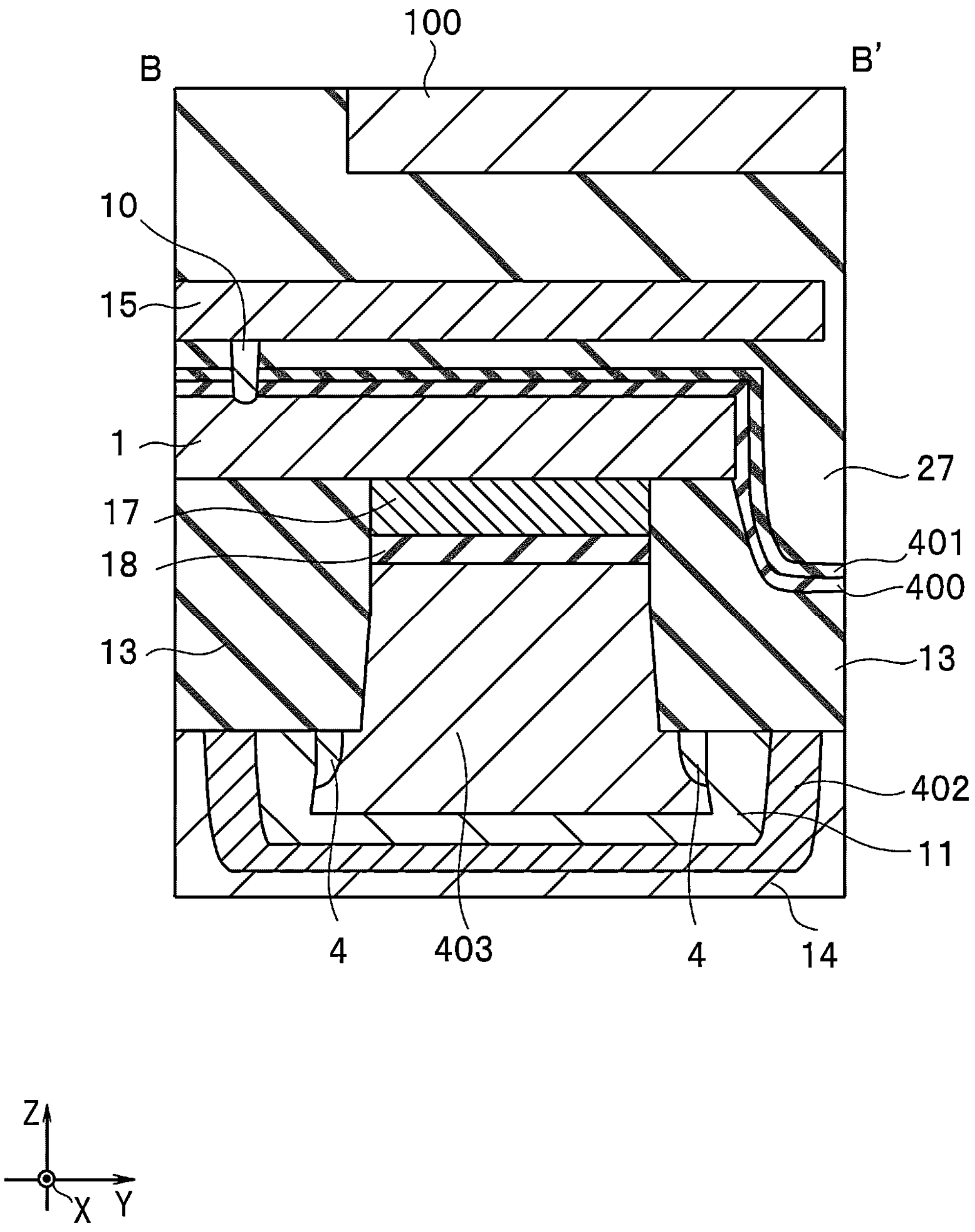
FIG. 23B shows a cross-sectional view taken along line B-B' shown in FIG. 22.
Figure 23C:
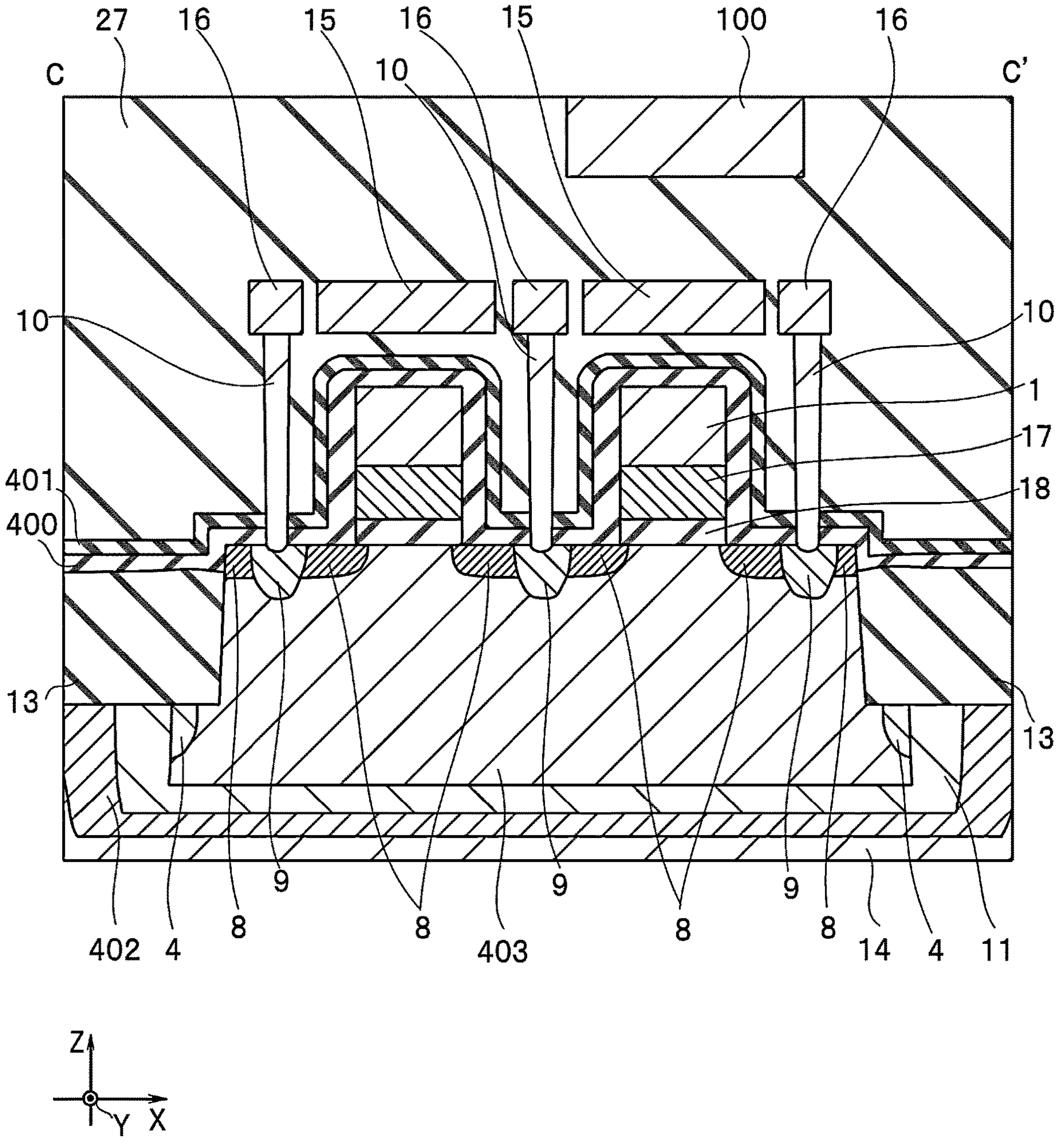
FIG. 23C shows a cross-sectional view taken along line C-C' shown in FIG. 22.
Figure 23D:
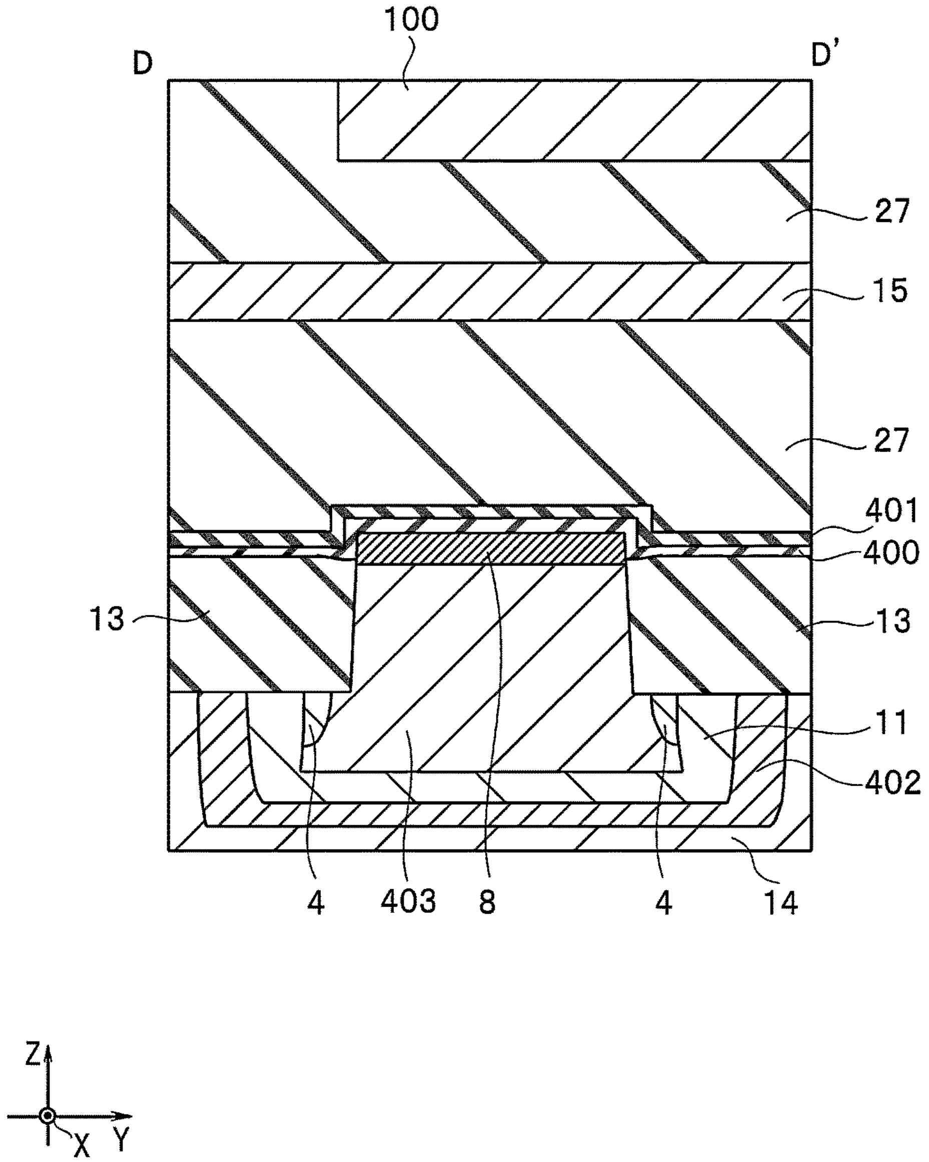
FIG. 23D shows a cross-sectional view taken along line D-D' shown in FIG. 22.

FIG. 22 is a plan view describing an example of a structure of the E-type transistor TR2 according to a second embodiment. FIG. 23A shows a cross-sectional view taken along line A-A' shown in FIG. 22. FIG. 23B shows a cross-sectional view taken along line B-B' shown in FIG. 22. FIG. 23C shows a cross-sectional view taken along line C-C' shown in FIG. 22. FIG. 23D shows a cross-sectional view taken along line D-D' shown in FIG. 22.

FIG. 22 shows a planar structure on a lower side of the contact plug 10 and a first wiring layer and a second wiring layer among a plurality of wiring layers formed on an upper side of the contact plug 10, and the other wiring layers are omitted. A wiring 15 indicated by a double-dotted line and a wiring 16 indicated by a broken line are disposed in the first wiring layer. A wiring 100 indicated by a one-dotted line is disposed in the second wiring layer. The first wiring layer is formed between the second wiring layer and the semiconductor substrate 14. The shape and disposition of the wiring 15 are the same as those in the first embodiment shown in FIG. 11.

A characteristic structure of the present embodiment is a region (well region) to which an impurity is added, the region being formed in the depth direction from the surface of the semiconductor substrate 14. Since the structure above the surface of the semiconductor substrate 14 is the same as the structure of the first embodiment shown in FIG. 12C, for example, the description thereof will be omitted. The E-type transistor TR2 of the present embodiment is formed with an n-type well 402 having an n-type conductive type in a semiconductor substrate 14 having a p-type conductive type, a p-type well 11 covered with the side surface and the bottom surface of the n-type well 402, and a p-type region 403 covered with the side surface and the bottom surface of the p-type well 11. The impurity concentration of the p-type region 403 is lower than the impurity concentration of the p-type well 11.

Thereby, the periphery of the p-type well 11 and the p-type region 403 is surrounded by the n-type well 402, and the p-type well 11 and the p-type region 403 are electrically separated from the semiconductor substrate 14. By electrically separating the p-type well 11 and the p-type region 403 from the p-type semiconductor substrate 14, the voltage of the p-type well 11 and the p-type region 403 is capable of being changed to a negative voltage according to the operation, independently of the semiconductor substrate 14. Such a structure is a so-called double well structure. Since the double well structure may reduce the area of the p-type well 11 as compared with the area of the semiconductor substrate 14 as a conductor, for example, when voltages of the p-type well 11 and the p-type region 403 are applied, the load of the voltage rising circuit is reduced as compared with the case where a voltage of the semiconductor substrate 14 is applied, and there is an effect of reducing power consumption.

The E-type transistor TR2 is formed in the p-type region 403. The E-type transistor TR2 is formed in an element formation region partitioned by the element separation region 13 formed on the surface region of the semiconductor substrate 14. The element separation region 13 is a so-called shallow trench isolation (STI) formed by embedding an insulating film such as a silicon oxide film in a trench having a depth of, for example, 0.1 μm to 0.5 μm.

Further, the n-type well 402 forming the double well structure is formed at a predetermined depth from the surface of the semiconductor substrate 14 to a position deeper than the p-type well 11. In order to make the potential of the n-type well 402 constant and to prevent the current leakage due to the crystal defect generated by the ion implantation, the n-type well 402 is added with the n-type impurity such that the peak concentration of the impurity is higher than, for example, $1\times10^{16}$ $cm^{-3}$ and lower than $1\times10^{18}$ $cm^{-3}$. In this way, the n-type well 402 is formed in the semiconductor substrate 14, for example, at a depth where the pn junction boundary with the p-type well 11 is 2 μm or more (typically, a depth of approximately 2 μm to 4 μm).

The E-type transistor TR2 is used as, for example, a high voltage switch (switch transistor) that transfers a high voltage to and blocks from a word line WL connected to the control gate electrode of the memory cell, as described above. The switch transistor is a transistor for selecting a plurality of memory blocks. In the selected plurality of memory cell transistors, in order to uniformly control the threshold value, the switch transistors need to make the well potential uniform. Therefore, a well portion having a low resistance is required for the switch transistor. In addition, the switch transistor needs to transfer a voltage of 15 V or more to the word line WL. Therefore, when the E-type transistor TR2 having an n-type conductive type is used as the switch transistor, it is necessary to reduce the substrate bias effect. In order to satisfy these two requirements, it is desirable to form a p-type region 403 having a low concentration of p-type impurity in a region above the p-type well 11, for example, within a depth of 1 μm from the surface of the semiconductor substrate 14. At this time, it is desirable that the p-type impurity concentration of the p-type region 403 is lower than $1\times10^{16}$ $cm^{-3}$. In addition, the bottom surface portion of the p-type well 11 is formed by using an ion implantation method or the like so that the p-type impurity has a peak of a density higher than $1\times10^{16}$ $cm^{-3}$ in a range of a depth of 1.5 μm to 2 μm from the surface of the semiconductor substrate 14.

As described above, in the present embodiment, by applying a positive voltage (for example, a voltage between 0.5 V and 5 V) to the n-type well 402 of the semiconductor substrate 14 with respect to the GND voltage (0 V) as a reference, the voltage of the p-type well 11 and the p-type region 403 may be set to a negative voltage (for example, a voltage between −0.5 V and −5 V). Therefore, in the high voltage switch shown in FIG. 4, even when the output voltage Vout is a negative voltage, the voltage of the p-type well 11 and the p-type region 403 may be maintained at a negative voltage than the output voltage Vout, so that it is possible to prevent the diffusion layer 8 and the p-type well 11 from being reverse-biased and causing an increase in the leakage current. Therefore, it is possible to prevent a circuit from malfunctioning due to a leakage current. The output terminal Tout is electrically connected to the gate electrode of the memory cell, for example, via a switching element, and thus a structure in which a negative voltage is applied to the gate electrode of the memory cell may be implemented.

Third Embodiment

Figure 24:
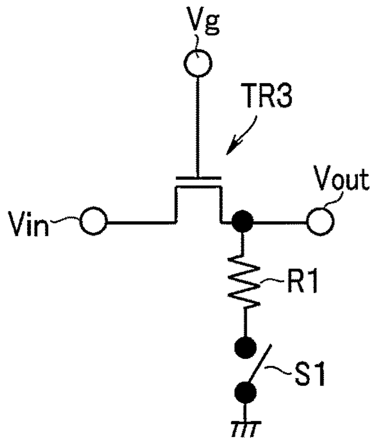
FIG. 24 is a circuit diagram showing an example of a high voltage switch according to a third embodiment.

Next, a third embodiment will be described. In the semiconductor device of the present embodiment, the circuit configuration of the high voltage switch is different from the circuit configurations of the first and second embodiments shown in FIG. 4. FIG. 24 is a circuit diagram showing an example of a high voltage switch according to a third embodiment. As shown in FIG. 24, in the high voltage switch in the present embodiment, the E-type transistor TR3 is inserted between the input terminal Tin and the output terminal Tout. A discharge circuit is provided between the E-type transistor TR3 and the output terminal Tout. That is, the high voltage switch of the present embodiment is a structure in which the D-type transistor TR1 is taken out from the high voltage switch shown in FIG. 4 and the node N2 is used as the input terminal Tin. The structure (planar structure and cross-sectional structure) of the E-type transistor TR3 may be the structure of the E-type transistor TR2 described in the first embodiment, the modification example, and the second embodiment.

Figure 25:
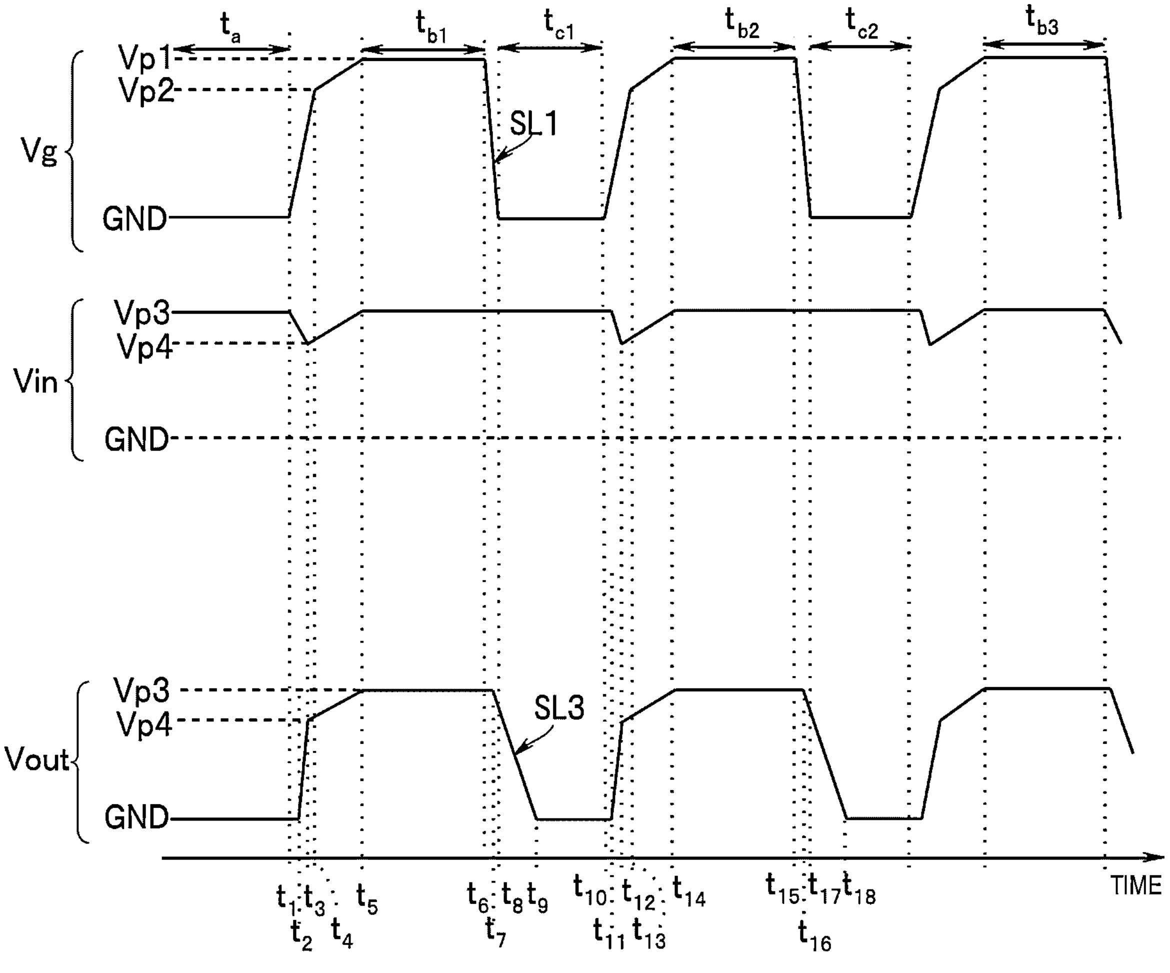
FIG. 25 is a diagram schematically showing an example of a voltage waveform when a switch operates according to the third embodiment.

FIG. 25 is a diagram schematically showing an example of a voltage waveform when a switch operates according to the third embodiment. As shown in FIG. 25, when the switch is operated in the present embodiment, the voltage waveforms of the gate voltage Vg, the input voltage Vin, and the output voltage Vout are the same as each of the voltage waveforms when the switch is operated in the first embodiment shown in FIG. 15. Here, in each of the periods $t_{b1}$, $t_{b2}$, and $t_{b3}$ during which the input voltage Vin is transferred to the output voltage Vout, the resistance of the diffusion layer 8 may be reduced as compared with the comparative example by the capacitive coupling between the wiring 15 and the diffusion layer 8. Therefore, it is possible to achieve a higher current driving capability.

The present disclosure is not limited to the above-described embodiment. For example, the method of forming the element separation region 13 or the interlayer insulating film 27 is not limited to the above-described method, and another method of converting silicon into a silicon oxide film or a silicon nitride film, for example, a method of implanting oxygen ions into deposited silicon or a method of oxidizing deposited silicon may be used. In addition, $TiO_2$, $Al_2O_3$, a tantalum oxide film, strontium titanate or barium titanate, lead zirconate titanate, or a stacked film of these may be used for the charge storage layer.

In the above-described embodiment, silicon having a p-type conductive type is used as the semiconductor substrate 14, but other single crystal semiconductor substrates containing silicon, such as a SiGe mixed crystal and a SiGeC mixed crystal, may be used. Further, the gate electrode may use a silicide such as a SiGe mixed crystal, a SiGeC mixed crystal, TiSi, NiSi, CoSi, TaSi, WSi, or MoSi, a polysilicide, or a metal such as Ti, Al, Cu, TiN, or W. Further, the gate electrode may be polycrystalline, or may be formed in a stacked structure. In addition, the gate electrode may use amorphous Si, amorphous SiGe, or amorphous SiGeC, and may have a stacked structure of these. In addition, although the floating gate type NAND memory cell is exemplified as the memory cell, a NOR type memory cell may be used, or an AND type memory cell or a virtual ground type memory cell may be used, and a word line switch structure having a double well and connected to a plurality of word lines may be used. Of course, a MONOS type memory cell that accumulates and stores charges in an insulating film instead of a floating gate electrode may be used.

In addition, in the above-described embodiment, the present disclosure has been described based on an example in which the present disclosure is applied to a semiconductor integrated circuit device, for example, a semiconductor memory, but a semiconductor integrated circuit device, for example, a processor, a system LSI, or the like, in which the above-described semiconductor memory is incorporated is also within the scope of the present disclosure.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a memory cell transistor;

a select transistor connected to the memory cell transistor in series; and a switch element configured to apply a voltage to and block a voltage from a gate electrode of the memory cell transistor so as to control a threshold value of the memory cell transistor, wherein the switch element includes a first n-type MOSFET having a gate insulating film with a thickness in a range of 13 nm to 50 nm, a first current terminal, and a second current terminal, the first n-type MOSFET includes:

a first source diffusion layer and a first drain diffusion layer having a first n-type impurity density and formed in a vicinity of the gate electrode; and a second source diffusion layer and a second drain diffusion layer having a second n-type impurity density higher than the first n-type impurity density, the second current terminal of the first n-type MOSFET is electrically connected to a voltage source configured to provide a voltage equal to or larger than 15 V, a first wiring layer is formed on an upper side of a semiconductor substrate in which the first n-type MOSFET is formed, a second wiring layer is formed above the first wiring layer, a first wiring connected to the gate electrode of the first n-type MOSFET is formed in the first wiring layer, and the first wiring is formed on an upper portion of the gate electrode in an active region range of the first n-type MOSFET and continuously extends on the first source diffusion layer or the first drain diffusion layer with a length equal to or longer than 0.1 μm.

2. The semiconductor device according to claim 1, wherein the first wiring extends on the second source diffusion layer or the second drain diffusion layer.

3. The semiconductor device according to claim 1, wherein the first n-type MOSFET is an enhancement type transistor having a positive threshold value.

4. The semiconductor device according to claim 3, wherein the first n-type MOSFET is formed in a p-type semiconductor substrate and is formed in a second p-type region surrounded by a first n-type well region, and the p-type semiconductor substrate and the second p-type region are electrically separated in the first n-type well region.

5. The semiconductor device according to claim 3, wherein the second current terminal of the first n-type MOSFET is connected to a first current terminal of a second n-type MOSFET, the second n-type MOSFET having a gate insulating film with a thickness in a range of 13 nm to 50 nm, the second n-type MOSFET being a depletion type transistor having a negative threshold value, a second current terminal of the second n-type MOSFET is electrically connected to the voltage source, and the gate electrode of the first n-type MOSFET is electrically connected to the gate electrode of the second n-type MOSFET.

6. A semiconductor device comprising:

a band-shaped gate electrode formed on a surface of a semiconductor substrate;

a pair of diffusion layers interposing the gate electrode;

a first switch transistor configured to transfer or block an input voltage applied to one of the pair of diffusion layers, as an output voltage, to the other of the pair of diffusion layers in response to a gate voltage applied to the gate electrode; and a first wiring formed above the gate electrode, wherein the first switch transistor is a first n-type MOSFET having a gate insulating film with a thickness in a range of 13 nm to 50 nm, and a first current terminal, the pair of diffusion layers of the first n-type MOSFET have:

a first source diffusion layer and a first drain diffusion layer having a first n-type impurity density and formed in a vicinity of the gate electrode, and a second source diffusion layer and a second drain diffusion layer having a second n-type impurity density higher than the first n-type impurity density, one of the pair of diffusion layers includes the first source diffusion layer and the second source diffusion layer, the other of the pair of diffusion layers includes the first drain diffusion layer and the second drain diffusion layer, a width of the first wiring in a direction parallel to a surface of the semiconductor substrate and the direction corresponding to a distance between the pair of diffusion layers is wider than a width of the gate electrode, and the first wiring continuously covers up to an upper side of at least a partial region of at least one of the pair of diffusion layers.

7. The semiconductor device according to claim 6, wherein a second wiring is formed above the first wiring, at least a partial region of the second wiring is formed above at least one of the pair of diffusion layers, and at least the partial region of the first wiring is interposed between at least one of the pair of diffusion layers and the second wiring in an up-down direction.

8. The semiconductor device according to claim 6, wherein the first wiring is electrically connected to the gate electrode via a contact plug.

9. The semiconductor device according to claim 6, wherein the first switch transistor is an enhancement-type n-type transistor, and the semiconductor device further comprises a second switch transistor that is a depletion-type n-type transistor, one of the pair of diffusion layers of the first switch transistor is electrically connected to the other of the pair of diffusion layers of the second switch transistor, and the gate electrode of the second switch transistor is electrically connected to the gate electrode of the first switch transistor.

10. The semiconductor device according to claim 9, wherein the second switch transistor is a second n-type MOSFET having a gate insulating film with a thickness in a range of 13 nm to 50 nm, and a first current terminal, the first wiring is also formed above the gate electrode of the second switch transistor, the width of the first wiring in the direction parallel to the surface of the semiconductor substrate and the direction corresponding to the distance between the pair of diffusion layers of the second switch transistor is wider than the width of the gate electrode, and the first wiring continuously covers up to the upper side of at least the partial region of at least one of the pair of diffusion layers of the second switch transistor.

11. The semiconductor device according to claim 6, wherein the first switch transistor is formed in a p-type well surrounded by an n-type well region formed in the semiconductor substrate, and the semiconductor substrate and the p-type well are electrically separable from each other through the n-type well region.

12. The semiconductor device according to claim 6, wherein the first wiring covers up to the upper side of at least the partial region of at least one of the second source diffusion layer of the first switch transistor or the second drain diffusion layer of the first switch transistor.

13. The semiconductor device according to claim 12, wherein the first wiring covers an entire region above the pair of diffusion layers.

* * * * *